(12) United States Patent
Lee et al.

(10) Patent No.: US 12,051,716 B2
(45) Date of Patent: Jul. 30, 2024

(54) DISPLAY DEVICE AND MANUFACTURING METHOD THEREFOR

(71) Applicant: SAMSUNG DISPLAY CO., LTD., Yongin-si (KR)

(72) Inventors: Yo Han Lee, Yongin-si (KR); Sin Chul Kang, Yongin-si (KR); Jae Woong Kang, Yongin-si (KR); Su Mi Moon, Yongin-si (KR); Won Sik Oh, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 399 days.

(21) Appl. No.: 17/420,873

(22) PCT Filed: Jul. 5, 2019

(86) PCT No.: PCT/KR2019/008326
§ 371 (c)(1),
(2) Date: Jul. 6, 2021

(87) PCT Pub. No.: WO2020/145461
PCT Pub. Date: Jul. 16, 2020

(65) Prior Publication Data
US 2022/0069003 A1    Mar. 3, 2022

(30) Foreign Application Priority Data

Jan. 7, 2019    (KR) .......................... 10-2019-0001802

(51) Int. Cl.
*H01L 27/15*    (2006.01)
*G09G 3/00*    (2006.01)
(Continued)

(52) U.S. Cl.
CPC ........... *H01L 27/156* (2013.01); *G09G 3/006* (2013.01); *H01L 33/005* (2013.01);
(Continued)

(58) Field of Classification Search
CPC ... H01L 27/156; H01L 33/005; H01L 33/387; H01L 33/62
See application file for complete search history.

(56) References Cited

U.S. PATENT DOCUMENTS

| 8,216,440 | B2 | 7/2012 | Shibata et al. |
| 9,570,425 | B2 | 2/2017 | Do |

(Continued)

FOREIGN PATENT DOCUMENTS

| CN | 108242217 | 7/2018 |
| CN | 108269520 | 7/2018 |

(Continued)

OTHER PUBLICATIONS

International Search Report, with English translation, corresponding to International Application No. PCT/KR2019/008326 dated Oct. 18, 2019.

(Continued)

*Primary Examiner* — Christine A Enad
(74) *Attorney, Agent, or Firm* — KILE PARK REED & HOUTTEMAN PLLC

(57) ABSTRACT

A display device includes a pixel disposed in a display area. The pixel includes first and second sub-areas; first and second electrodes of a first stage disposed in the first sub-area; first light emitting elements disposed between the first and second electrodes; first and second contact electrodes of the first stage to electrically connect the first light emitting elements between the first and second electrodes; first and second electrodes of a second stage disposed in the second sub-area; second light emitting elements disposed between the first and second electrodes of the second stage; first and second contact electrodes of the second stage to electrically connect the second light emitting elements between the first and second electrodes of the second stage; and a connection electrode to electrically connect the second (Continued)

contact electrode of the first stage with the first contact electrode of the second stage.

22 Claims, 30 Drawing Sheets

(51) Int. Cl.
 *H01L 33/00* (2010.01)
 *H01L 33/38* (2010.01)
 *H01L 33/62* (2010.01)
(52) U.S. Cl.
 CPC ............ *H01L 33/387* (2013.01); *H01L 33/62* (2013.01); *H01L 2933/0016* (2013.01); *H01L 2933/0066* (2013.01)

(56) References Cited

U.S. PATENT DOCUMENTS

| | | | |
|---|---|---|---|
| 10,461,123 | B2 | 10/2019 | Kim et al. |
| 10,651,264 | B2 | 5/2020 | An et al. |
| 10,720,606 | B2 | 7/2020 | Song et al. |
| 2009/0243501 | A1 | 10/2009 | Dunn et al. |
| 2018/0006105 | A1 | 1/2018 | Kim et al. |
| 2018/0175009 | A1* | 6/2018 | Kim ..................... H01L 27/124 |
| 2018/0287010 | A1 | 10/2018 | Sung |
| 2019/0326348 | A1 | 10/2019 | Im et al. |

FOREIGN PATENT DOCUMENTS

| | | |
|---|---|---|
| EP | 3 343 633 | 7/2018 |
| JP | 2008-260073 | 10/2008 |
| JP | 2013-4792 | 1/2013 |
| JP | 2014-123583 | 7/2014 |
| JP | 2015-11784 | 1/2015 |
| KR | 10-2013-0087894 | 8/2013 |
| KR | 10-1436123 | 11/2014 |
| KR | 10-1713818 | 3/2017 |
| KR | 10-2018-0072909 | 7/2018 |
| KR | 10-2019-0121894 | 10/2019 |
| KR | 10-2019-0124359 | 11/2019 |
| KR | 10-2020-0001649 | 1/2020 |
| KR | 10-2020-0001656 | 1/2020 |
| TW | 201249250 | 12/2012 |

OTHER PUBLICATIONS

Written Opinion, with English translation, corresponding to International Application No. PCT/KR2019/008326, dated Oct. 18, 2019.

Chinese Office Action for Chinese Patent Application No. 201980088670.4, dated Feb. 28, 2024.

Korean Notice of Allowance for Korean Patent Application No. 10-2019-0001802, dated May 7, 2024.

* cited by examiner

US 12,051,716 B2

DISPLAY DEVICE AND MANUFACTURING METHOD THEREFOR

CROSS-REFERENCE TO RELATED APPLICATION(S)

This application is a national entry of International Application No. PCT/KR2019/008326, filed on Jul. 5, 2019, which claims under 35 U.S.C. § 119(a) and 365(b) priority to and benefits of Korean Patent Application No. 10-2019-0001802, filed on Jan. 7, 2019 in the Korean Intellectual Property Office, the entire contents of which are incorporated herein by reference.

1. TECHNICAL FIELD

Embodiments relate to a display device and a method of fabricating the same.

2. DESCRIPTION OF THE RELATED ART

Recently, techniques have been developed for manufacturing a subminiature light emitting element using a material having a reliable inorganic crystal structure, and for manufacturing a light emitting device using the light emitting element. For example, techniques have been developed for fabricating a plurality of subminiature light emitting elements having a small size corresponding to a range from the nanometer scale to the micrometer scale, and for forming light sources of various light emitting devices, for example, pixels of display devices using the subminiature light emitting elements.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments are directed to a display device including a light emitting element and a method of fabricating the display device.

A display device in accordance with an embodiment may include a pixel disposed in a display area. The pixel may comprise a first sub-area and a second sub-area disposed in a first direction; at least one first electrode and at least one second electrode of a first stage that are spaced apart from each other in the first sub-area; first light emitting elements disposed in parallel between the at least one first electrode and the at least one second electrode of the first stage; at least one first contact electrode and at least one second contact electrode of the first stage respectively disposed on the at least one first electrode and the at least one second electrode of the first stage, the at least one first contact electrode and the at least one second contact electrode of the first stage electrically connecting the first light emitting elements between the at least one first electrode and the at least one second electrode of the first stage; at least one first electrode and at least one second electrode of a second stage spaced apart from each other in the second sub-area; second light emitting elements disposed in parallel between the at least one first electrode and the at least one second electrode of the second stage; at least one first contact electrode and at least one second contact electrode of the second stage respectively disposed on the at least one first electrode and the at least one second electrode of the second stage, the at least one first contact electrode and the at least one second contact electrode of the second stage electrically connecting the second light emitting elements between the at least one first electrode and the at least one second electrode of the second stage; and a connection electrode that electrically connects the at least one second contact electrode of the first stage to the at least one first contact electrode of the second stage.

In an embodiment, the at least one first contact electrode and the at least one second contact electrode of the first stage may be successively or alternately disposed in the first sub-area, and the at least one first contact electrode and the at least one second contact electrode of the second stage may be successively or alternately disposed in the second sub-area in a second direction intersecting with the first direction. The connection electrode may extend in a boundary area between the first sub-area and the second sub-area in a third direction intersecting with the first direction and the second direction and the connection electrode may electrically connect the at least one second contact electrode of the first stage to the at least one first contact electrode of the second stage.

In an embodiment, the display device may further include a K-th sub-area disposed subsequent to the first sub-area and the second sub-area in the first direction; at least one first electrode and at least one second electrode of a K-th stage spaced apart from each other in the K-th sub-area; K-th light emitting elements disposed in parallel between the at least one first electrode and the at least one second electrode of the K-th stage; at least one first contact electrode and at least one second contact electrode of the K-th stage respectively disposed on the at least one first electrode and the at least one second electrode of the K-th stage, to the at least one first contact electrode and the at least one second contact electrode electrically connect the K-th light emitting elements between the at least one first electrode and the at least one second electrode of the K-th stage; and another connection electrode that electrically connects the at least one first contact electrode of the K-th stage to at least one second contact electrode of a preceding stage.

In an embodiment, the display device may further include a first line electrically connected to the at least one first electrode of the first stage, and supplied with a first power voltage or a first driving signal; and a second line electrically connected to the at least one second electrode of the K-th stage or a last stage, and supplied with a second power voltage or a second driving signal.

In an embodiment, the at least one second electrode of the first stage, at least one first electrode and at least one second electrode of an intermediate stage including the second stage, and the at least one first electrode of the K-th stage or the last stage each may have an individual shape.

In an embodiment, the display device may further include a first line electrically connected to the at least one first electrode of the first stage, and supplied with a first power voltage or a first driving signal; and a second line electrically connected to the second electrode of the second stage, and supplied with a second power voltage or a second driving signal.

In an embodiment, the at least one second electrode of the first stage and the at least one first electrode of the second stage each may have an individual shape.

In an embodiment, the at least one second contact electrode of the first stage, the connection electrode, and the at least one first contact electrode of the second stage may be integrally connected to each other.

In an embodiment, the pixel may further include at least one reverse light emitting element electrically connected between the at least one first electrode and the at least one second electrode of the first stage or the second stage in a direction opposite to the first light emitting elements and the second light emitting elements.

In an embodiment, a number of the first light emitting elements and the second light emitting elements may be greater than a number of the at least one reverse light emitting element.

In an embodiment, the at least one first electrode and the at least one second electrode of the first stage may include a plurality of first electrodes and a plurality of second electrodes of the first stage disposed in the first sub-area; the at least one first contact electrode and the at least one second contact electrode of the first stage may include a plurality of first contact electrodes and a plurality of second contact electrodes of the first stage disposed in the first sub-area and respectively overlapping the plurality of first electrodes and the plurality of second electrodes of the first stage; the at least one first electrode and the at least one second electrode of the second stage may include a plurality of first electrodes and a plurality of second electrodes of the second stage disposed in the second sub-area; and the at least one first contact electrode and the at least one second contact electrode of the second stage may include a plurality of first contact electrodes and a plurality of second contact electrodes of the second stage disposed in the second sub-area and respectively overlapping the plurality of first electrodes and the plurality of second electrodes of the second stage.

In an embodiment, the pixel may further include at least one defective light emitting element having short-circuited ends between a pair of a first electrode and a second electrode of the plurality of first electrodes and the plurality of second electrodes of the first stage and the second stage. A first contact electrode or a second contact electrode directly connected to the defective light emitting element may be separated from first and contact electrodes and second contact electrodes other than the first contact electrode or the second contact electrode directly connected to the at least one defective light emitting element.

In an embodiment, the display device may further include a first line electrically connected to at least one of the plurality of first electrodes of the first stage, and supplied with a first power voltage or a first driving signal; a second line electrically connected to at least one of the plurality of second electrodes of the second stage or a last stage, and supplied with a second power voltage or a second driving signal; and at least one defective light emitting element electrically connected to a first electrode or second electrode of the plurality of first electrodes of the first stage and the plurality of second electrodes of the second stage or the last stage, the at least one defective light emitting element having short-circuited opposite ends. The first electrode or the second electrode may be separated from the first line or the second line.

In an embodiment, the pixel may include first partition walls respectively disposed below the at least one first electrode of the first stage and the at least one first electrode of the second stage, and each having an individual pattern; and second partition walls respectively disposed below the at least one second electrode of the first stage and the at least one second electrode of the second stage, and each having an individual pattern.

A method of fabricating a display device in accordance with an embodiment may include forming a first alignment electrode and a second alignment electrode spaced apart from each other and extending in a first direction in an emission area of each pixel; forming a first line and a second line respectively electrically connected to the first alignment electrode and the second alignment electrode; disposing light emitting elements between the first alignment electrode and the second alignment electrode in the emission area; forming first contact electrodes disposed on different areas of the first alignment electrode in the first direction to electrically connect first ends of the light emitting elements to the first alignment electrode; forming second contact electrodes disposed on different areas of the second alignment electrode in the first direction to electrically connect second ends of the light emitting elements to the second alignment electrode; dividing the first alignment electrode into first electrodes disposed in the first direction; and dividing the second alignment electrode into second electrodes disposed in the first direction. The forming of the first contact electrodes and the second contact electrodes comprises electrically connecting a second contact electrode disposed in a first stage of the emission area to a first contact electrode disposed in a second stage of the emission area.

In an embodiment, the forming of the first contact electrodes and the second contact electrodes may include forming a connection electrode integrally connected to the second contact electrode disposed in the first stage of the emission area to the first contact electrode disposed in the second stage of the emission area.

In an embodiment, the forming of the first contact electrodes and the second contact electrodes may include forming the second contact electrodes disposed in the first stage of the emission area, and the first contact electrodes disposed in the second stage of the emission area; and forming the first contact electrodes disposed in the first stage of the emission area, and the second contact electrodes disposed in the second stage of the emission area.

In an embodiment, the forming of the first alignment electrode and the second alignment electrode may include forming a plurality of first alignment electrodes and a plurality of second alignment electrodes alternately disposed in a second direction in the emission area. The forming of the first contact electrodes and the second contact electrodes may include forming a plurality of connection electrodes to electrically connect the second contact electrodes disposed in a stage of the emission area to the first contact electrodes disposed in a subsequent stage of the emission area.

In an embodiment, the method may further include checking whether a short-circuit defect occurs in the light emitting elements; and opening, in case that it is determined that at least one of the light emitting elements is a defective light emitting element, a connection electrode electrically connected to the first contact electrode or a second contact electrode electrically connected to the defective light emitting element.

In an embodiment, the method may further include checking whether a short-circuit defect occurs in the light emitting elements; and separating, in case that it is determined that at least one of the light emitting elements is a defective light emitting element, a first electrode or a second electrode electrically connected to the defective light emitting element from the first line or the second line.

In a display device including a pixel and a method of fabricating the display device in accordance with embodiments, light emitting elements supplied to an emission area of each pixel may be efficiently used to form each light source unit, and driving current that flows through a display panel may be reduced.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1A:
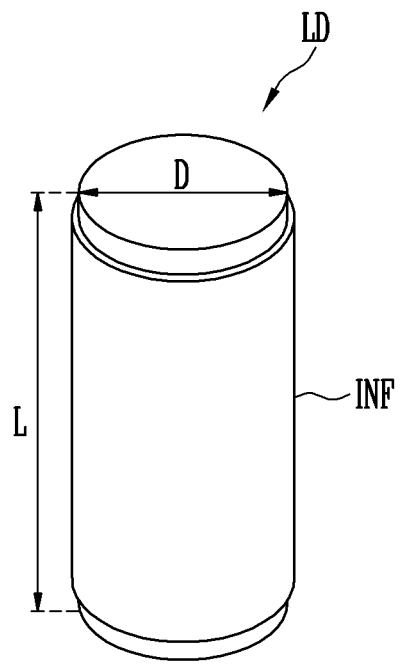
FIGS. 1A and 1B are respectively a perspective view and a sectional view illustrating a light emitting element in accordance with an embodiment.

Reference will now be made in detail to various embodiments, examples of which are illustrated in the accompanying drawings and described below, the embodiments of the disclosure can be variously modified in many different forms. However, the disclosure is not limited to the following embodiments and may be modified into various forms.

Some elements which are not directly related to the features in the drawings may be omitted to clearly explain the disclosure. Furthermore, the sizes, ratios, etc. of some elements in the drawings may be slightly exaggerated. It should be noted that the same reference numerals are used to designate the same or similar elements throughout the drawings, and repetitive explanation will be omitted.

It will be understood that, although the terms "first", "second", etc. may be used herein to describe various elements, these elements should not be limited by these terms. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first component or part is disposed on a second component or part, the first component or part may be not only directly on the second component or part but a third component or other components or part or parts may intervene between them. Furthermore, the terms "position", "direction", etc. used in the following description are defined in relative terms, and it should be noted that they may be changed into a reverse position or direction depending on a view angle or direction. Furthermore, a singular form may include a plural form unless otherwise defined.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of is intended to include the meaning of" at least one selected from the group of for the purpose of its meaning and interpretation. For example, "at least one of A and B" may be understood to mean "A, B, or A and B."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A, 1B, 2A, 2B, 3A, and 3B are perspective views and sectional views illustrating light emitting elements LD in accordance with embodiments. Although FIGS. 1A to 3B illustrate cylindrical rod-type light emitting elements LD, the type and/or shape of the light emitting elements LD in accordance with the disclosure is not limited thereto.

Figure 1B:
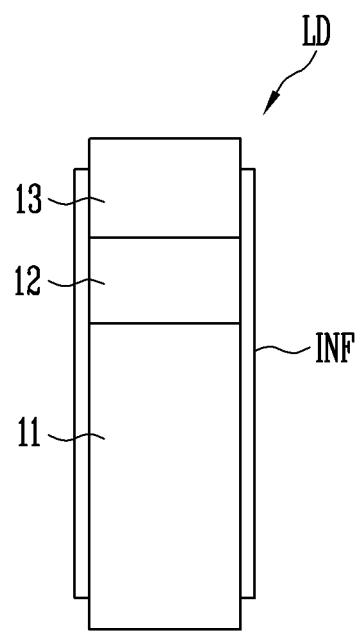

Referring to FIGS. 1A and 1B, a light emitting element LD in accordance with an embodiment may include a first conductivity type semiconductor layer 11 (also referred to as "first semiconductor layer"), a second conductivity type semiconductor layer 13 (also referred to as "second semiconductor layer"), and an active layer 12 interposed between the first and second conductivity type semiconductor layers 11 and 13. For example, the light emitting element LD may be formed of a stacked body formed by successively stacking the first conductivity type semiconductor layer 11, the active layer 12, and the second conductivity type semiconductor layer 13 in a longitudinal direction.

In an embodiment, the light emitting element LD may be provided in the form of a rod extending in one direction. If the direction in which the light emitting element LD extends is defined as a longitudinal direction, the light emitting element LD may have a first end and a second end with respect to the longitudinal direction.

In an embodiment, one of the first and second conductivity type semiconductor layers 11 and 13 may be disposed on the first end of the light emitting element LD. The other one of the first and second conductivity type semiconductor layers 11 and 13 may be disposed on the second end of the light emitting element LD.

In an embodiment, the light emitting element LD may be a rod-type light emitting diode manufactured in the form of a rod. In this specification, the term "rod-type" embraces a substantially rod-like shape and a substantially bar-like shape such as a substantially cylindrical shape and a substantially prismatic shape extending in a longitudinal direction (for example, to have an aspect ratio greater than 1), and the cross-sectional shape thereof is not limited to a particular shape. For example, the length L of the light emitting element LD may be greater than a diameter D thereof (or a width of the cross-section thereof).

In an embodiment, the light emitting element LD may have a small size ranging from the nanometer scale to the micrometer scale. For example, each light emitting element LD may have a diameter D and/or a length L ranging from the nanometer scale to the micrometer scale. However, in the disclosure, the size of the light emitting element LD is not limited thereto. For example, the size of the light emitting element LD may be changed in various ways depending on design conditions of various devices, for example, a display device, which employs, as a light source, a light emitting device using a light emitting element LD.

The first conductivity type semiconductor layer 11 may include, for example, at least one N-type semiconductor layer. For instance, the first conductivity type semiconductor layer 11 may include an N-type semiconductor layer which may include any one semiconductor material of InAlGaN, GaN, AlGaN, InGaN, AlN, and InN, and is doped with a first conductive dopant such as Si, Ge, or Sn. However, the material for forming the first conductivity type semiconductor layer 11 is not limited to this, and the first conductivity type semiconductor layer 11 may be formed of various other materials.

The active layer 12 may be disposed on the first conductivity type semiconductor layer 11 and have a single or multiple quantum well structure. In an embodiment, a cladding layer (not shown) doped with a conductive dopant may be formed over and/or under or below the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If a voltage equal to or greater than a threshold voltage is applied to each of the opposite ends of the light emitting element LD, the light emitting element LD may emit light by recombination of electron-hole pairs in the active layer 12. Since light emission of the light emitting element LD can be controlled based on the foregoing principle, the light emitting element LD may be used as a light source of various light emitting devices as well as a pixel of the display device.

The second conductivity type semiconductor layer 13 may be disposed on the active layer 12 and include a semiconductor layer of a type different from that of the first conductivity type semiconductor layer 11. For example, the second conductivity type semiconductor layer 13 may include at least one P-type semiconductor layer. For instance, the second conductivity type semiconductor layer 13 may include a P-type semiconductor layer which may include any one semiconductor material of InAlGaN, GaN, AlGaN, InGaN, AlN, and InN, and is doped with a second conductive dopant such as Mg. However, the material for forming the second conductivity type semiconductor layer 13 is not limited to this, and the second conductivity type semiconductor layer 13 may be formed of various other materials.

In an embodiment, the light emitting element LD may further include an insulating film INF provided on the surface of the light emitting element LD. The insulating film INF may be formed on the surface of the light emitting element LD to enclose an outer circumferential surface of at least the active layer 12, and may further enclose predetermined areas of the first and second conductivity type semiconductor layers 11 and 13. Here, the insulating film INF may allow the opposite ends of the light emitting element LD that have different polarities to be exposed to the outside. For example, the insulating film INF may expose one end of each of the first and second conductivity type semiconductor layers 11 and 13 that are disposed on the respective opposite ends of the light emitting element LD with respect to the longitudinal direction, for example, may expose two base sides of the cylinder (in FIGS. 1A and 1B, the top and bottom surfaces of the light emitting element LD) rather than covering or overlapping the two base sides.

In an embodiment, the insulating film INF may include at least one insulating material of silicon dioxide ($SiO_2$), silicon nitride ($Si_3N_4$), aluminium oxide ($Al_2O_3$), and titanium dioxide ($TiO_2$), but it is not limited thereto. In other words, the material that forms the insulating film INF is not limited to a particular material, and the insulating film INF may be formed of various insulating materials.

In an embodiment, the light emitting element LD may further include additional other components in addition to the first conductivity type semiconductor layer 11, the active layer 12, the second conductivity type semiconductor layer 13, and/or the insulating film INF. For example, the light emitting element LD may further include one or more fluorescent layers, one or more active layers, one or more semiconductor layers, and/or one or more electrode layers disposed on one end of the first conductivity type semiconductor layer 11, the active layer 12, and/or the second conductivity type semiconductor layer 13.

Figure 2A:
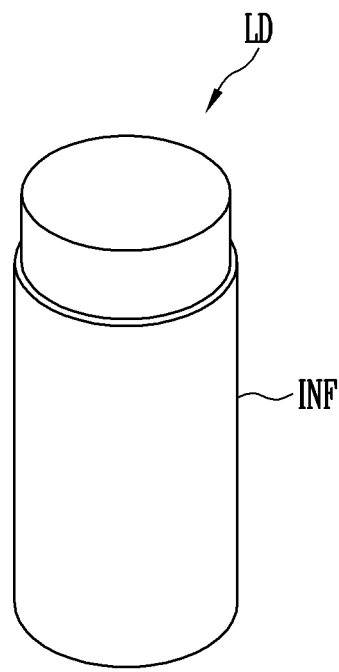
FIGS. 2A and 2B are respectively a perspective view and a sectional view illustrating a light emitting element in accordance with an embodiment.
Figure 2B:
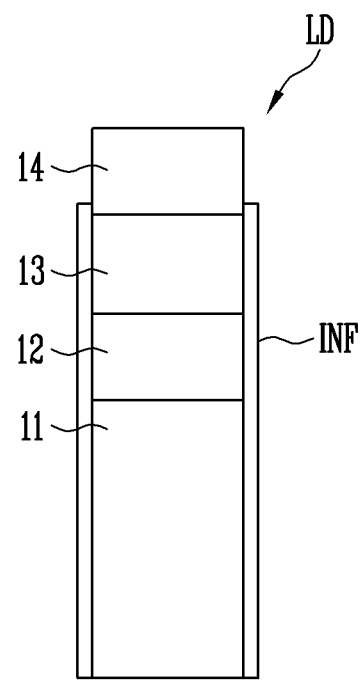
Figure 3A:
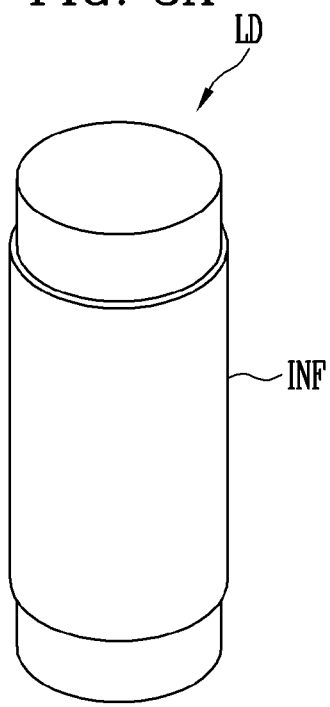
FIGS. 3A and 3B are respectively a perspective view and a sectional view illustrating a light emitting element in accordance with an embodiment.
Figure 3B:
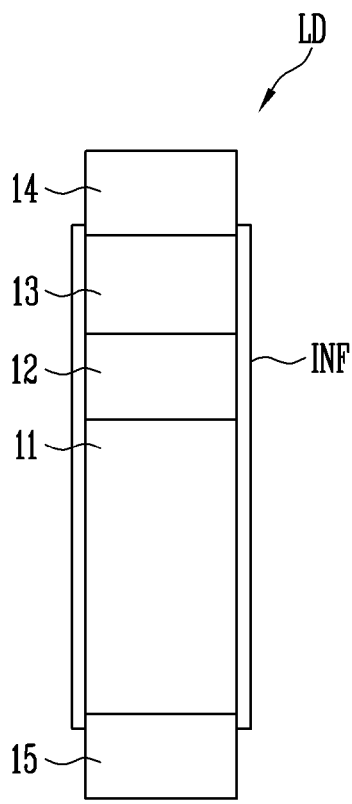

For example, as illustrated in FIGS. 2A and 2B, the light emitting element LD may further include at least one electrode layer 14 disposed on one end of the second conductivity type semiconductor layer 13. In an embodiment, as illustrated in FIGS. 3A and 3B, the light emitting element LD may further include at least one electrode layer 15 disposed on one end of the first conductivity type semiconductor layer 11.

Each of the electrode layers 14 and 15 may be an ohmic contact electrode, but it is not limited thereto. Each of the electrode layers 14 and 15 may include metal or metal oxide. For example, each of the electrode layers 14 and 15 may be formed of transparent electrode materials such as chromium (Cr), titanium (Ti), aluminium (Al), gold (Au), nickel (Ni), oxides or alloys thereof, indium tin oxide (ITO), indium zinc oxide (IZO), zinc oxide (ZnO), or indium tin zinc oxide (ITZO) alone or in combination. In an embodiment, the electrode layers 14 and 15 may be substantially transparent or translucent. Thereby, light generated from the light emitting element LD may be emitted to the outside after passing through the electrode layers 14 and 15.

In an embodiment, the insulating film INF may at least partially enclose the outer circumferential surfaces of the electrode layers 14 and 15, or may not enclose the outer circumferential surfaces thereof. In other words, the insulating film INF may be selectively formed on the surfaces of the electrode layers 14 and 15. Furthermore, the insulating film INF may be formed to expose the opposite ends of the light emitting element LD that have different polarities, for example, may expose at least an area of each of the electrode layers 14 and 15. As another example, in an embodiment, the insulating film INF may not be provided.

If the insulating film INF is provided on the surface of the light emitting element LD, for example, on the surface of the active layer 12, the active layer 12 may be prevented from short-circuiting with at least one electrode which is not shown (for example, at least one contact electrode of contact electrodes electrically connected to the opposite ends of the light emitting element LD), for example, within the spirit and the scope of the disclosure. Consequently, the electrical stability of the light emitting element LD may be secured. In the description of each embodiment, the term "connecting (or coupling)" may comprehensively refer to physical and/or electrical connecting (or coupling). Furthermore, this may comprehensively refer to directly and/or indirectly connecting (or coupling).

Furthermore, thanks to the insulating film INF formed on the surface of the light emitting element LD, occurrence of a defect on the surface of the light emitting element LD may be minimized, whereby the lifetime and efficiency of the light emitting element LD may be improved. If the insulating film INF is formed on each light emitting element LD, even in case that a plurality of light emitting elements LD are disposed adjacent to each other, the light emitting elements LD may be prevented from undesirably short-circuiting.

In an embodiment, a surface treatment process may be performed to fabricate the light emitting element LD. For example, each light emitting element LD may be surface-treated so that, in case that a plurality of light emitting elements LD are mixed with a fluidic solution (or solvent) and then supplied to each emission area (for example, an emission area of each pixel), the light emitting elements LD can be evenly dispersed rather than unevenly aggregating in the solution.

In an unlimited embodiment pertaining to this, the insulating film INF itself may be formed of a hydrophobic film using hydrophobic material, or an additional hydrophobic film formed of the hydrophobic material may be formed or disposed on the insulating film INF. In an embodiment, the hydrophobic material may be a material containing fluorine to exhibit hydrophobicity. In an embodiment, the hydrophobic material may be applied to the light emitting elements LD in the form of a self-assembled monolayer (SAM). The hydrophobic material may include octadecyl trichlorosilane, fluoroalkyl trichlorosilane, perfluoroalkyl triethoxysilane, for example, within the spirit and the scope of the disclosure. Furthermore, the hydrophobic material may be a commercially available fluorine containing material such as Teflon™ or Cytop™, or a corresponding material.

A light emitting device including the light emitting element LD described above may be used not only in a display device but also in various devices which require a light source. For instance, at least one subminiature light emitting element LD, for example, a plurality of subminiature light emitting elements LD each having a size ranging from the nanometer scale to the micrometer scale, may be disposed in each pixel area of the display panel to form a light source (or a light source unit) of the corresponding pixel using the subminiature light emitting elements LD. Furthermore, the field of application of the light emitting element LD according to the disclosure is not limited to a display device. For example, the light emitting element LD may also be used in other types of devices such as a lighting device, which requires a light source.

Figure 4:
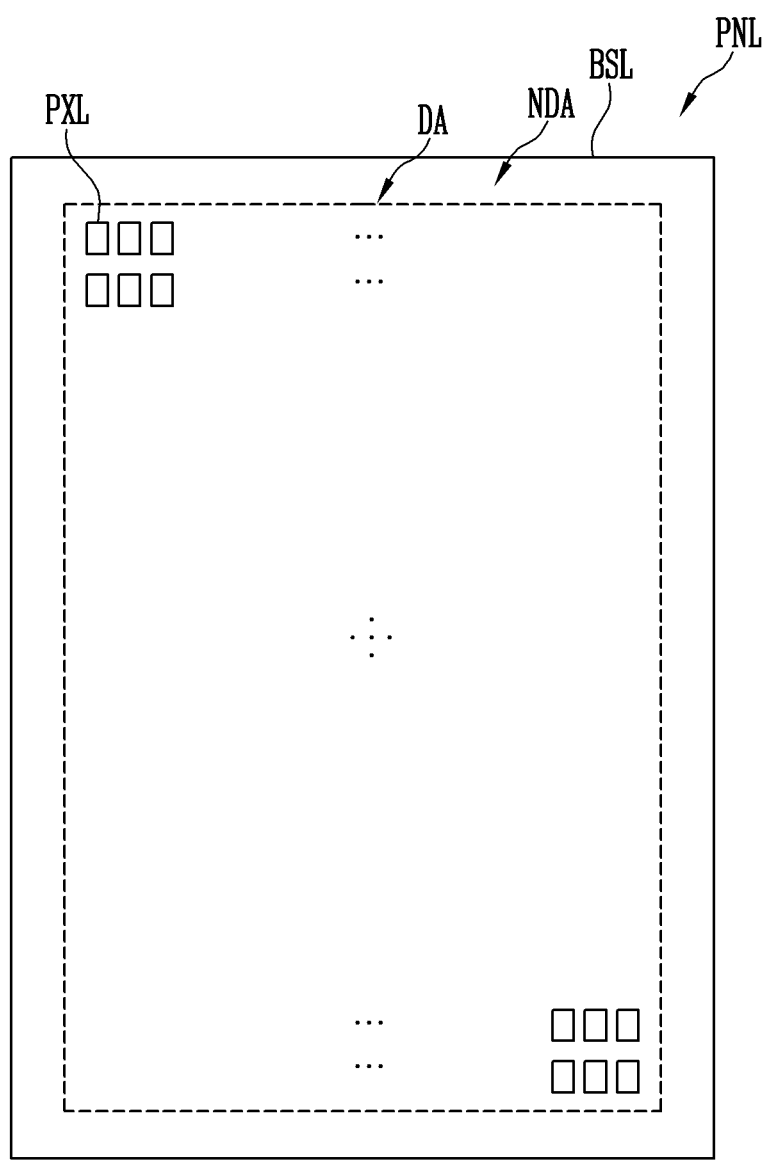
FIG. 4 is a plan view illustrating a display device in accordance with an embodiment.

FIG. 4 is a plan view illustrating a display device in accordance with an embodiment. In an embodiment, FIG. 4 illustrates a display device, for example, a display panel PNL provided in the display device, as an example of a device which may use, as a light source, the light emitting element LD described with reference to FIGS. 1A to 3B. For example, each of the pixels PXL of the display panel PNL may have at least one light emitting element LD.

For the sake of explanation, FIG. 4 simply illustrates the structure of the display panel PNL in accordance with an embodiment, focused on a display area DA. In an embodiment, although not illustrated, at least one driving circuit (for example, at least one of a scan driver and a data driver) and/or a plurality of lines may be further provided in the display panel PNL.

Referring to FIG. 4, the display panel PNL in accordance with an embodiment may include a base layer BSL, and a plurality of pixels PXL disposed on the base layer BSL. In detail, the display panel PNL and the base layer BSL for forming the display panel PNL may include a display area DA for displaying an image, and a non-display area NDA formed in a predetermined area other than the display area DA. The pixels PXL may be disposed in the display area DA on the base layer BSL.

In an embodiment, the display area DA may be disposed in a central area of the display panel PNL, and the non-display area NDA may be disposed in a perimeter area of the display panel PNL in such a way as to enclose the display area DA. The locations of the display area DA and the non-display area NDA are not limited to this, and the locations thereof may be changed. The display area DA may form a screen on which an image is displayed.

The base layer BSL may form a base of the display panel PNL. In an embodiment, the base layer BSL may be a rigid or flexible substrate or film, and the material or properties thereof are not particularly limited. For example, the base layer BSL may be a rigid substrate made of glass or reinforced glass, a flexible substrate (or a thin film) formed of plastic or metal, or at least one insulating layer, and the material and/or properties thereof are not particularly limited.

Furthermore, the base layer BSL may be transparent, but the disclosure is not limited thereto. For instance, the base layer BSL may be a transparent, translucent, opaque, or reflective base.

One area on the base layer BSL may be defined as the display area DA in which the pixels PXL are disposed, and the other area thereof may be defined as the non-display area NDA. For example, the base layer BSL may include the display area DA including a plurality of pixel areas in which the respective pixels PXL are formed, and the non-display area NDA disposed around the display area DA. Various lines and/or internal circuits which may be electrically connected to the pixels PXL of the display area DA may be disposed in the non-display area NDA.

In an embodiment, the pixels PXL may be disposed in each pixel area of the display area DA. In an embodiment, the pixels PXL may be arranged or disposed in the display area DA in a stripe or PenTile® arrangement manner, but the disclosure is not limited thereto. For example, the pixels PXL may be arranged or disposed in the display area DA in various arrangement manners.

Each pixel PXL may include at least one light source which is driven by a predetermined control signal (for example, a scan signal and a data signal) and/or a predetermined power supply (for example, a first power supply and a second power supply). For example, each of the pixels PXL may include a light emitting element LD in accordance with any one of the embodiments of FIGS. 1A to 3B, for example, at least one subminiature rod-type light emitting element LD having a small size corresponding to the nanometer scale or the micrometer scale. However, in embodiments, the type of the light emitting element LD which may be used as a light source of the pixel PXL is not limited thereto. For example, in an embodiment, each pixel PXL may include a light emitting element that has a core-shell structure and is fabricated by a growth method. In an embodiment, the light emitting element having the core-shell structure may be a subminiature core-shell light emitting element having a small size corresponding to the nanometer scale to the micrometer scale, but the size of the light emitting element having the core-shell structure is not limited.

In an embodiment, each pixel PXL may be formed of an active pixel. However, the types, structures, and/or driving schemes of the pixels PXL applicable to the display device according to the disclosure are not particularly limited. For example, each pixel PXL may have the same structure as that of a pixel for passive or active light emitting display devices which have various structures and/or may be operated in various driving schemes.

FIGS. 5A to 5E are equivalent circuit diagrams each illustrating a pixel PXL in accordance with an embodiment. For example, FIGS. 5A to 5E illustrate different embodiments of the pixel PXL which can be applied to an active display device. However, the types of pixels PXL and display devices to which embodiments may be applied are not limited thereto. In an embodiment, each pixel PXL illustrated in FIGS. 5A to 5E may be any one of the pixels PXL provided in the display panel PNL of FIG. 4. The pixels PXL may have substantially the same or similar structure.

Figure 5A:
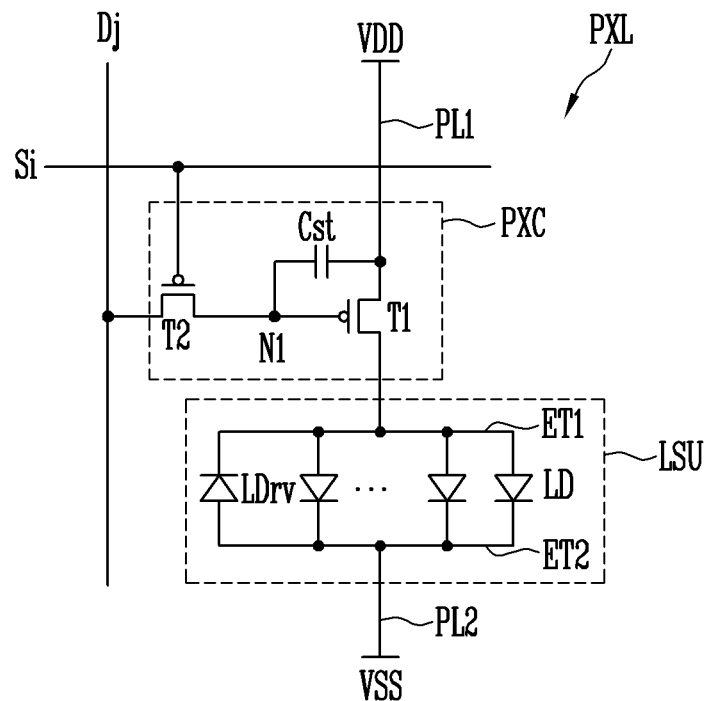
FIGS. 5A to 5E are equivalent circuit diagrams each illustrating a pixel in accordance with an embodiment.

Referring to FIG. 5A, the pixel PXL in accordance with an embodiment may include a light source unit LSU to generate light having a luminance corresponding to a data signal. The pixel PXL may further include a pixel circuit PXC to drive the light source unit LSU.

In an embodiment, the light source unit LSU may include a plurality of light emitting elements LD that are electrically connected to each other between the first power supply VDD and the second power supply VSS. For example, the light source unit LSU may include a first electrode ET1 electrically connected to the first power supply VDD, a second electrode ET2 electrically connected to the second power supply VSS, and a plurality of light emitting elements LD electrically connected in parallel to each other in the same direction between the first and second electrodes ET1 and ET2. In an embodiment, the first electrode ET1 may be an anode electrode, and the second electrode ET2 may be a cathode electrode.

In an embodiment, each of the light emitting elements LD may include a P-type end electrically connected to the first power supply VDD through the first electrode ET1, and an N-type end electrically connected to the second power supply VSS through the second electrode ET2. In an embodiment, the light emitting elements LD may be electrically connected in parallel between the first electrode ET1 and the second electrode ET2 in a forward direction. As such, each of the light emitting elements LD electrically connected in a forward direction between the first power supply VDD and the second power supply VSS may form a valid light source. A group of valid light sources may form the light source unit LSU of the pixel PXL.

In an embodiment, the first and second power supplies VDD and VSS may have different potentials to make it possible for the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or more during at least an emission period of the pixel PXL.

In an embodiment, the first ends (for example, the P-type ends) of the light emitting elements LD that form each light source unit LSU may be electrically connected in common to the pixel circuit PXC through an electrode of the light source unit LSU (for example, the first electrode ET1 (also referred to as "first pixel electrode") of each pixel PXL), and be electrically connected to the first power supply VDD through the pixel circuit PXC and the first power line PL1. The second ends (for example, the N-type ends) of the light emitting elements LD may be electrically connected in common to the second power supply VSS through another electrode of the light source unit LSU (for example, a second electrode ET2 (also referred to as "second pixel electrode") of each pixel PXL) and the second power line PL2.

The light emitting elements LD of the light source unit LSU may emit light having a luminance corresponding to driving current supplied thereto through the pixel circuit PXC. For example, during each frame period, the pixel circuit PXC may supply, to the light source unit LSU, driving current corresponding to a grayscale value of data of the corresponding frame. The driving current supplied to the light source unit LSU may be divided into parts that flow to the light emitting elements LD electrically connected in the forward direction. Hence, each of the light emitting elements LD may emit light having a luminance corresponding to current applied thereto, so that the light source unit LSU may emit light having a luminance corresponding to the driving current.

In an embodiment, the light source unit LSU may further include at least one invalid light source, as well as including the light emitting elements LD that form each valid light source. For example, at least one reverse light emitting element LDrv may be further electrically connected between the first and second electrodes ET1 and ET2 of the light source unit LSU.

Each reverse light emitting element LDrv, along with the light emitting elements LD that form the valid light sources, may be electrically connected in parallel to each other between the first and second electrodes ET1 and ET2, and may be electrically connected between the first and second electrodes ET1 and ET2 in a direction opposite to that of the light emitting elements LD. For example, the N-type end of the reverse light emitting element LDrv may be electrically connected to the first power supply VDD via the first electrode ET1. The P-type end of the reverse light emitting element LDrv may be electrically connected to the second power supply VSS via the second electrode ET2. Even in case that a predetermined driving voltage (for example, a normal directional driving voltage) is applied between the first and second electrodes ET1 and ET2, the reverse light emitting element LDrv remains deactivated. Hence, current substantially does not flow through the reverse light emitting element LDrv.

The pixel circuit PXC may be electrically connected to a scan line Si and a data line Dj of the corresponding pixel PXL. For example, if the pixel PXL is disposed on an i-th row (i is a natural number) and a j-th column (j is a natural number) of the display area DA, the pixel circuit PXC of the pixel PXL may be electrically connected to an i-th scan line Si and a j-th data line Dj of the display area DA. In an embodiment, the pixel circuit PXC may include first and second transistors T1 and T2, and a storage capacitor Cst.

The first transistor (also referred to as "driving transistor") T1 may be electrically connected between the first power supply VDD and the light source unit LSU. A gate electrode of the first transistor T1 may be electrically connected to a first node N1. The first transistor T1 may control driving current to be supplied to the light source unit LSU in response to the voltage of the first node N1.

The second transistor (also referred to as "switching transistor") T2 may be electrically connected between the data line Dj and the first node N1. A gate electrode of the second transistor T2 may be electrically connected to the scan line Si. In case that a scan signal having a gate-on voltage (for example, a low level voltage) is supplied from the scan line Si, the second transistor T2 is turned on to electrically connect the first node N1 to the data line Dj.

During each frame period, a data signal of a corresponding frame is supplied to the data line Dj. The data signal is transmitted to the first node N1 via the second transistor T2. Thereby, a voltage corresponding to the data signal is charged to the storage capacitor Cst.

One electrode of the storage capacitor Cst may be electrically connected to the first power supply VDD, and the other electrode thereof may be electrically connected to the first node N1. The storage capacitor Cst may charge a voltage corresponding to a data signal to be supplied to the first node N1 during each frame period.

Although in FIG. 5A the transistors, for example, the first and second transistors T1 and T2, included in the pixel circuit PXC have been illustrated as being formed of P-type transistors, the disclosure is not limited to this. In other words, at least one of the first and second transistors T1 and T2 may be changed to an N-type transistor.

Figure 5B:
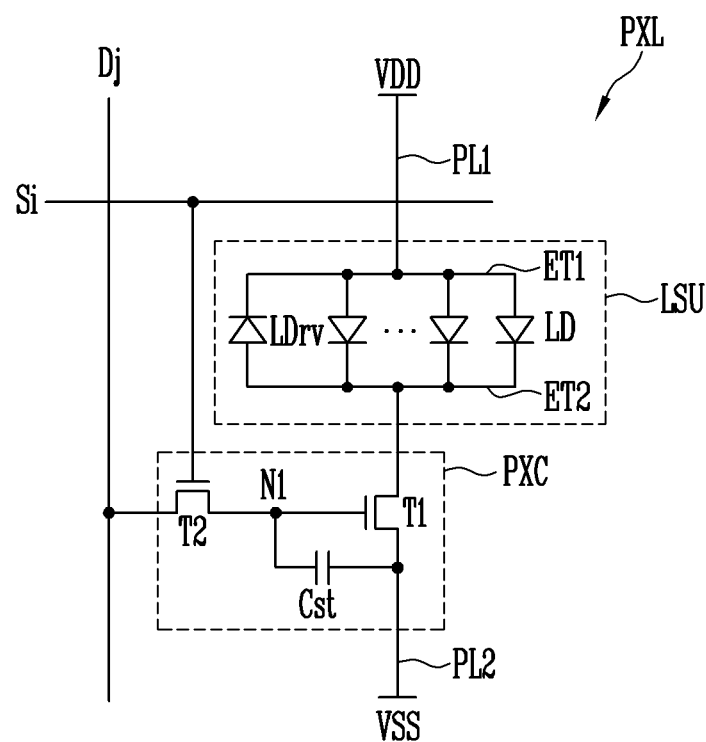

For example, as shown in FIG. 5B, both the first and second transistors T1 and T2 may be formed of N-type transistors. The gate-on voltage of the scan signal for writing the data signal supplied to the data line Dj in each frame period to the pixel PXL may be a high level voltage. Likewise, the voltage of the data signal for turning on the first transistor T1 may be a voltage having a level opposite to that of the embodiment of FIG. 5A. For example, in an embodiment of FIG. 5B, as a grayscale value that is to be expressed increases, a data signal having a higher voltage may be supplied.

The pixel PXL shown in FIG. 5B is substantially similar in configuration and operation to the pixel PXL of FIG. 5A, except that the connection positions of some or a number of circuit elements and the voltage levels of control signals (for example, a scan signal and a data signal) are changed depending on a change in type of the transistor. Therefore, detailed description of the pixel PXL of FIG. 5B will be omitted.

The structure of the pixel circuit PXC is not limited to the embodiments shown in FIGS. 5A and 5B. In other words, the pixel circuit PXC may be formed of a pixel circuit which may have various structures and/or be operated by various driving schemes. For example, the pixel circuit PXC may be configured in the same manner as that of an embodiment illustrated in FIG. 5C.

Figure 5C:
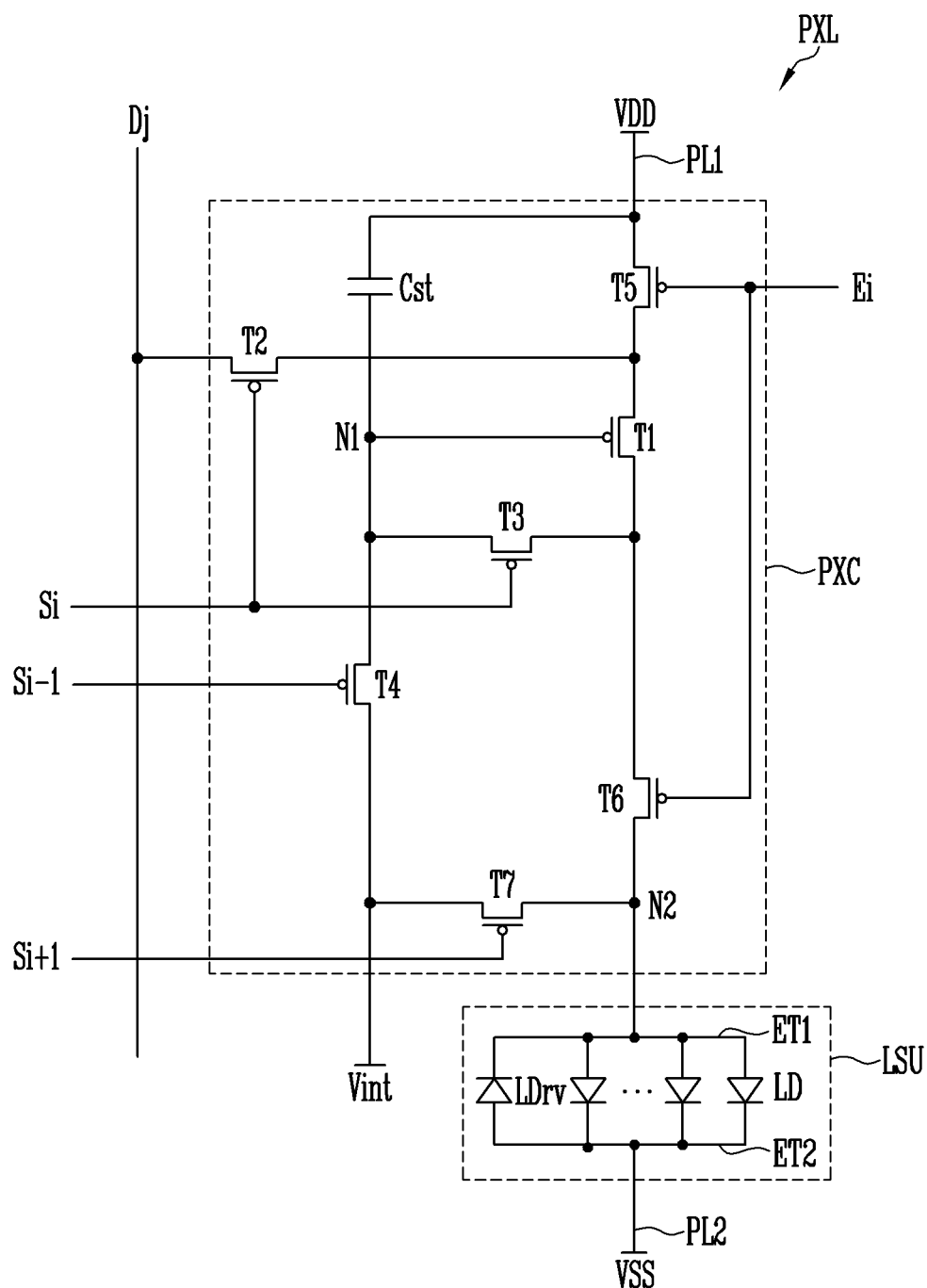

Referring to FIG. 5C, the pixel circuit PXC may be electrically connected not only to a scan line Si of a corresponding horizontal line but also to at least one another scan line (or a control line). For example, the pixel circuit PXC of the pixel PXL disposed on the i-th row of the display area DA may be further electrically connected to an i−1-th scan line Si−1 and/or an i+1-th scan line Si+1. In an embodiment, the pixel circuit PXC may be electrically connected not only to the first and second power supplies VDD and VSS but also to a third power supply. For instance, the pixel circuit PXC may also be electrically connected to an initialization power supply Vint. In an embodiment, the pixel circuit PXC may include first to seventh transistors T1 to T7 and a storage capacitor Cst.

The first transistor T1 may be electrically connected between the first power supply VDD and the light source unit LSU. For example, a first electrode (for example, a source electrode) of the first transistor T1 may be electrically connected to the first power supply VDD through the fifth transistor T5 and the first power line PL1, and a second electrode (for example, a drain electrode) of the first transistor T1 may be electrically connected via the sixth transistor T6 to a first electrode of the light source unit LSU (for example, the first contact electrode and/or the first pixel electrode of the corresponding pixel PXL). A gate electrode of the first transistor T1 may be electrically connected to a first node N1. The first transistor T1 may control driving current to be supplied to the light source unit LSU in response to the voltage of the first node N1.

The second transistor T2 may be electrically connected between the data line Dj and the first electrode of the first transistor T1. A gate electrode of the second transistor T2 may be electrically connected to the corresponding scan line Si. In case that a scan signal having a gate-on voltage is supplied from the scan line Si, the second transistor T2 may be turned on to electrically connect the data line Dj to the first electrode of the first transistor T1. Hence, if the second transistor T2 is turned on, a data signal supplied from the data line Dj may be transmitted to the first transistor T1.

The third transistor T3 may be electrically connected between the other electrode of the first transistor T1 and the first node N1. A gate electrode of the third transistor T3 may be electrically connected to the corresponding scan line Si. In case that a scan signal having a gate-on voltage is supplied from the scan line Si, the third transistor T3 may be turned on to electrically connect the first transistor T1 in the form of a diode.

The fourth transistor T4 may be electrically connected between the first node N1 and the initialization power supply Vint. A gate electrode of the fourth transistor T4 may be electrically connected to a preceding scan line, for example, an i−1-th scan line Si−1. In case that a scan signal of a gate-on voltage is supplied to the i−1-th scan line Si−1, the fourth transistor T4 may be turned on so that the voltage of the initialization power supply Vint may be transmitted to the first node N1. In an embodiment, in case that the first transistor T1 is a P-type transistor, the voltage of the initialization power supply Vint for initializing the gate voltage of the first transistor T1 may be less than or equal to the lowest voltage of the data signal.

The fifth transistor T5 may be electrically connected between the first power supply VDD and the first transistor T1. A gate electrode of the fifth transistor T5 may be electrically connected to a corresponding emission control line, for example, an i-th emission control line Ei. The fifth transistor T5 may be turned off in case that an emission control signal having a gate-off voltage (for example, a high level voltage) is supplied to the emission control line Ei, and may be turned on in other cases.

The sixth transistor T6 may be electrically connected between the first transistor T1 and the light source unit LSU. A gate electrode of the sixth transistor T6 may be electrically connected to a corresponding emission control line, for example, the i-th emission control line Ei. The sixth transistor T6 may be turned off in case that an emission control signal having a gate-off voltage is supplied to the emission control line Ei, and may be turned on in other cases.

The seventh transistor T7 may be electrically connected between a second node N2, to which the first electrode of the light source unit LSU (for example, the first pixel electrode of the corresponding pixel PXL) is electrically connected, and the initialization power supply Vint. A gate electrode of the seventh transistor T7 may be electrically connected to any one of scan lines of a subsequent stage (a subsequent horizontal pixel row), for example, to the i+1-th scan line Si+1. In case that a scan signal of a gate-on voltage is supplied to the i+1-th scan line Si+1, the seventh transistor T7 may be turned on so that the voltage of the initialization power supply Vint may be supplied to the first electrode of the light source unit LSU. During each initialization period in which the voltage of the initialization power supply Vint is transmitted to the light source unit LSU, the voltage of the first electrode of the light source unit LSU may be initialized. The control signal for controlling the operation of the seventh transistor T7 may be changed in various ways. For example, in an embodiment, the gate electrode of the seventh transistor T7 may be electrically connected to a scan line of a corresponding horizontal line, for example, an i-th scan line Si. In case that a scan signal having a gate-on voltage is supplied to the i-th scan line Si, the seventh transistor T7 may be turned on so that the voltage of the initialization power supply Vint may be supplied to the first electrode of the light source unit LSU.

The storage capacitor Cst may be electrically connected between the first power supply VDD and the first node N1. The storage capacitor Cst may store a voltage corresponding both to the data signal applied to the first node N1 during each frame period and to the threshold voltage of the first transistor T1.

Although in FIG. 5C the transistors, for example, the first to seventh transistors T1 to T7, included in the pixel circuit PXC have been illustrated as being formed of P-type transistors, the disclosure is not limited thereto. For example, at least one of the first to seventh transistors T1 to T7 may be changed to an N-type transistor.

Figure 5D:
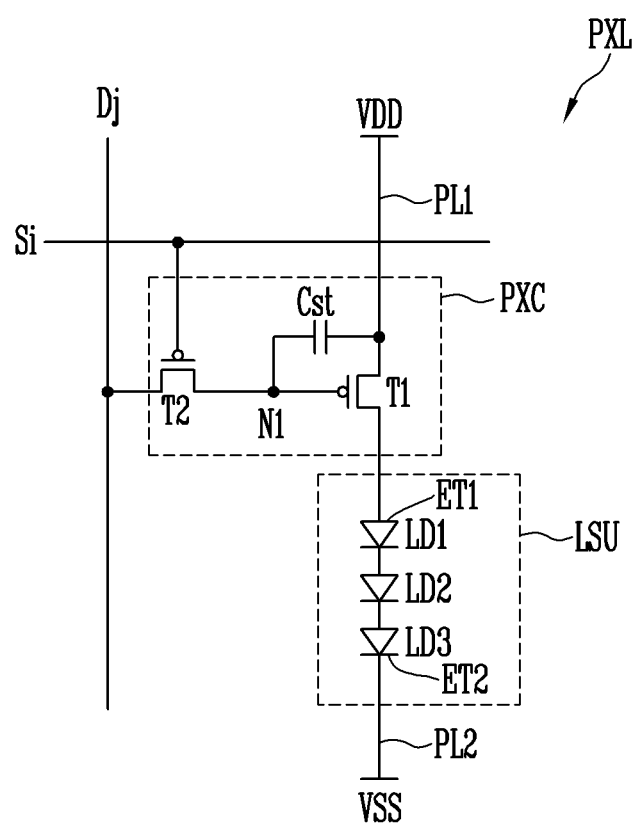
Figure 5E:
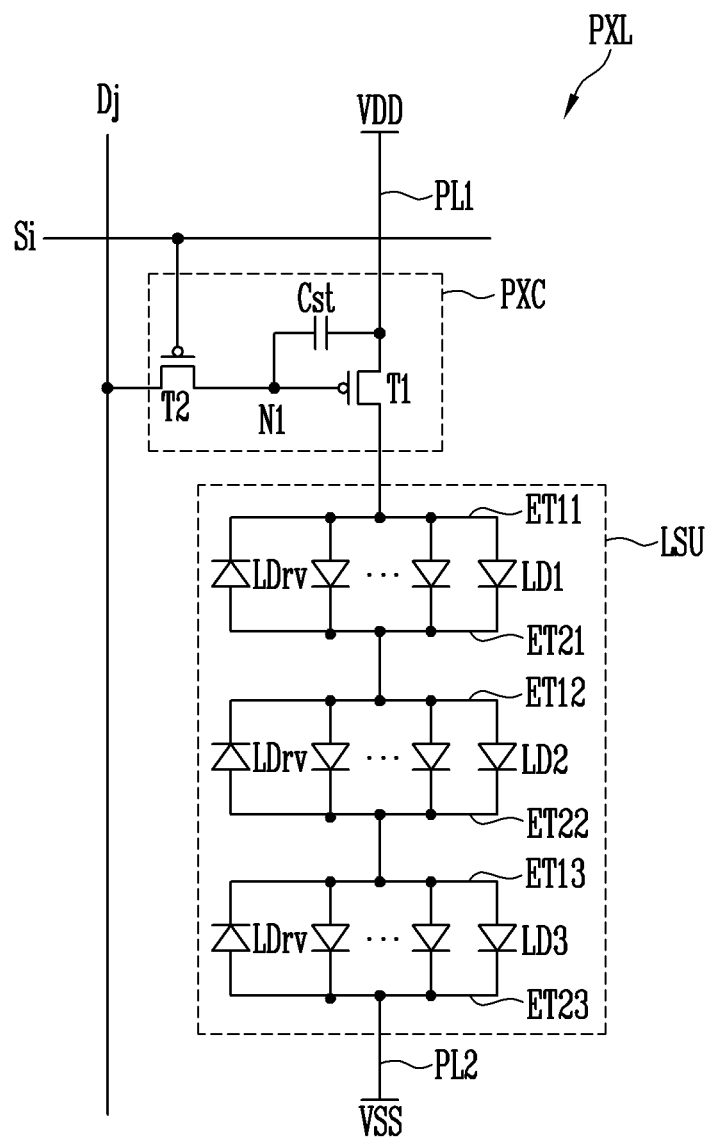

Although FIGS. 5A to 5C illustrate embodiments in which all valid light sources, for example, light emitting elements LD, constituting each light source unit LSU may be electrically connected in parallel to each other, the disclosure is not limited thereto. For example, in an embodiment, as illustrated in FIGS. 5D and 5E, the light source unit LSU of each pixel PXL may include a serial structure. In the following descriptions of embodiments of FIGS. 5D and 5E, detailed explanations of components (for example, the pixel circuit PXC) similar or equal to that of the embodiments of FIGS. 5A to 5C will be omitted.

Referring to FIG. 5D, the light source unit LSU may include a plurality of light emitting elements electrically connected in series to each other. For example, the light source unit LSU may include first, second, and third light emitting elements LD1, LD2, and LD3 which may be electrically connected in series in a forward direction between the first power supply VDD and the second power supply VSS and constitute each valid light source. Hereinafter, in case that a specific or selected light emitting element among the first, second, and third light emitting elements LD1, LD2, and LD3 is designated, the corresponding light emitting element will be referred to as a first light emitting element LD1, a second light emitting element LD2, or a third light emitting element LD3. The term "light emitting element LD" or "light emitting elements LD" will be used to arbitrarily designate at least one light emitting element of the first, second, and the third light emitting elements LD1, LD2, and LD3 or collectively designate the first, second, and third light emitting elements LD1, LD2, and LD3.

The P-type end of the first light emitting element LD1 may be electrically connected to the first power supply VDD through the first electrode ET1 of the light source unit LSU. The N-type end of the first light emitting element LD1 may be electrically connected to the P-type end of the second light emitting element LD2. The P-type end of the second light emitting element LD2 may be electrically connected to the N-type end of the first light emitting element LD1. The N-type end of the second light emitting element LD2 may be electrically connected to the P-type end of the third light emitting element LD3. The P-type end of the third light emitting element LD3 may be electrically connected to the N-type end of the second light emitting element LD2. The N-type end of the third light emitting element LD3 may be electrically connected to the second power supply VSS through the second electrode ET2 of the light source unit LSU. In this way, the first, second, and the third light emitting elements LD1, LD2, and LD3 may be electrically connected in series between the first and second electrodes ET1 and ET2 of the light source unit LSU.

Although in FIG. 5D there is illustrated an embodiment where the light emitting elements LD may be electrically connected to have a three-stage serial structure, the disclosure is not limited thereto. For example, in an embodiment, two light emitting elements LD may be electrically connected to have a two-stage serial structure, or four or more light emitting elements LD may be electrically connected to have a four- or more-stage serial structure.

In case that it is assumed that the same luminance is expressed using light emitting elements LD having the same conditions (for example, the same size and/or number), in a light source unit LSU having a structure in which light emitting elements LD may be electrically connected in series, the voltage to be applied between the first and second electrodes ET1 and ET2 may be increased, and the amount of driving current flowing to the light source unit LSU may be reduced, compared to a light source unit LSU having a structure in which light emitting elements LD may be electrically connected in parallel. Therefore, in the case where the light source unit LSU of each pixel PXL is formed of a serial structure, panel current flowing through the display panel PNL may be reduced as the display device is driven. Hence, power consumption may be reduced. The foregoing serial connection structure may be effectively used in reducing panel current in a large display panel PNL in which the panel current is comparatively large.

In an embodiment, at least one serial stage may include a plurality of light emitting elements LD electrically connected in parallel to each other. The light source unit LSU may be formed of a serial or parallel combination structure. For example, the light source unit LSU may be as illustrated in an embodiment of FIG. 5E.

Referring to FIG. 5E, each serial stage of the light source unit LSU may include a plurality of light emitting elements LD electrically connected in parallel to each other. For example, the light source unit LSU may include a plurality of first light emitting elements LD1 disposed in a first stage (also referred to as "first serial stage" or "first row"), and a plurality of second light emitting elements LD2 disposed in a second stage (also referred to as "second serial stage" or "second row") subsequent to the first stage. Furthermore, the light source unit LSU may selectively further include at least one serial stage subsequent to the second stage. For example, the light source unit LSU may further include a plurality of third light emitting elements LD3 disposed in a third stage (referred to as "third serial stage" or "third row") subsequent to the second stage. Furthermore, in an embodiment, at least one serial stage may further include at least one reverse light emitting element LDrv, but the disclosure is not limited thereto.

The first light emitting elements LD1 may be electrically connected in parallel to each other between first and second electrodes ET11 and ET21 of the first stage. The second light emitting elements LD2 may be electrically connected in parallel to each other between first and second electrodes ET12 and ET22 of the second stage. The third light emitting elements LD3 may be electrically connected in parallel to each other between first and second electrodes ET13 and ET23 of the third stage.

In an embodiment, the first and second electrodes ET11 to ET13 and ET21 to ET23 disposed in each serial stage may form split electrodes which are dispersed and disposed in the light source unit LSU. Hereinafter, the term "first electrode ET1" (also referred to as "first split electrode") will be used to arbitrarily designate at least one first electrode among the first electrodes ET11 to ET13 (also referred to as "first split electrodes") disposed in each serial stage, or collectively designate the first electrodes ET11 to ET13 disposed in each serial stage. Likewise, the term "second electrode ET2" (also referred to as "second split electrode") will be used to arbitrarily designate at least one second electrode among the second electrodes ET21 to ET23 (also referred to as "second split electrodes") disposed in each serial stage, or collectively designate the second electrodes ET21 to ET23 disposed in each serial stage.

Wherein case that the light source unit LSU of each pixel PXL is formed by electrically connecting a plurality of light emitting elements LD in a serial or parallel combination structure, driving current or voltage conditions may be easily controlled to correspond to specifications of a desired product. For example, in case that it is assumed that light emitting elements LD having the same conditions (for example, the same size and/or number) are used and express the same luminance, the light source unit LSU in which the light emitting elements LD may be electrically connected in the serial or parallel combination structure makes it possible to reduce driving current compared to that of the light source unit LSU having a structure in which all of the light emitting elements LD may be electrically connected in parallel to each other as shown in the embodiments of FIGS. 5A to 5C, and makes it possible to reduce driving voltages to be applied to the opposite ends of the light source unit LSU compared to that of the light source unit LSU having a structure in which all of the light emitting elements LD may be electrically connected in series as shown in the embodiment of FIG. 5D. In the case where all of the light emitting elements LD may be electrically connected in series, if at least one of the light emitting elements LD electrically connected in series to each other is not validly connected in the forward direction, a path along which the driving current of the pixel PXL is able to flow is blocked, whereby a black spot defect may be caused. On the other hand, in the case where the light emitting elements LD may be electrically connected to each other in the serial or parallel combination structure, even if some or a number of light emitting elements LD in each serial stage are not completely electrically connected in the forward direction or defects occur in some or a number of light emitting elements LD, the driving current is allowed to flow through the other light emitting elements LD of the corresponding serial stage. Therefore, defects of the pixel PXL may be prevented or reduced.

As shown in the foregoing embodiments, the pixel PXL in accordance with an embodiment may include a pixel circuit PXC and/or a light source unit LSU which may have various structures. The structure of the pixel PXL which may be applied to the disclosure is not limited to the embodiments illustrated in FIGS. 5A to 5E, and each pixel PXL may have various structures. For example, the pixel circuit PXC included in each pixel PXL may be formed of a pixel circuit which may have various structures and/or be operated by various driving schemes. In an embodiment, each pixel PXL may be in a passive light emitting display device, or the like within the spirit and the scope of the disclosure. The pixel circuit PXC may be omitted, and each of the first and second electrodes ET1 and ET2 of the light source unit LSU may be electrically connected or directly electrically connected to the scan line Si, the data line Dj, a power line, and/or a control line.

Figure 6:
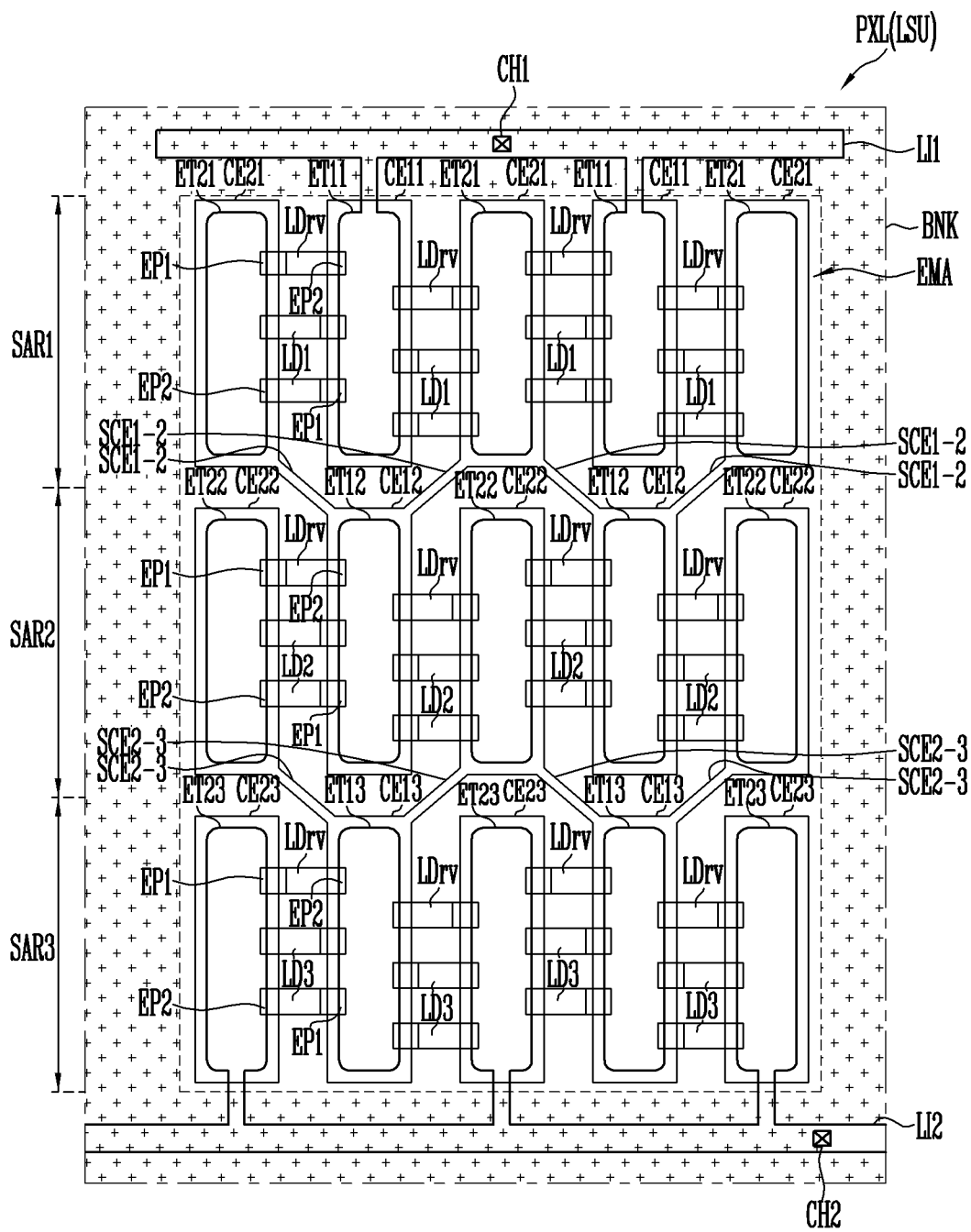
FIGS. 6 and 7 are plan views each illustrating a pixel in accordance with an embodiment.
Figure 7:
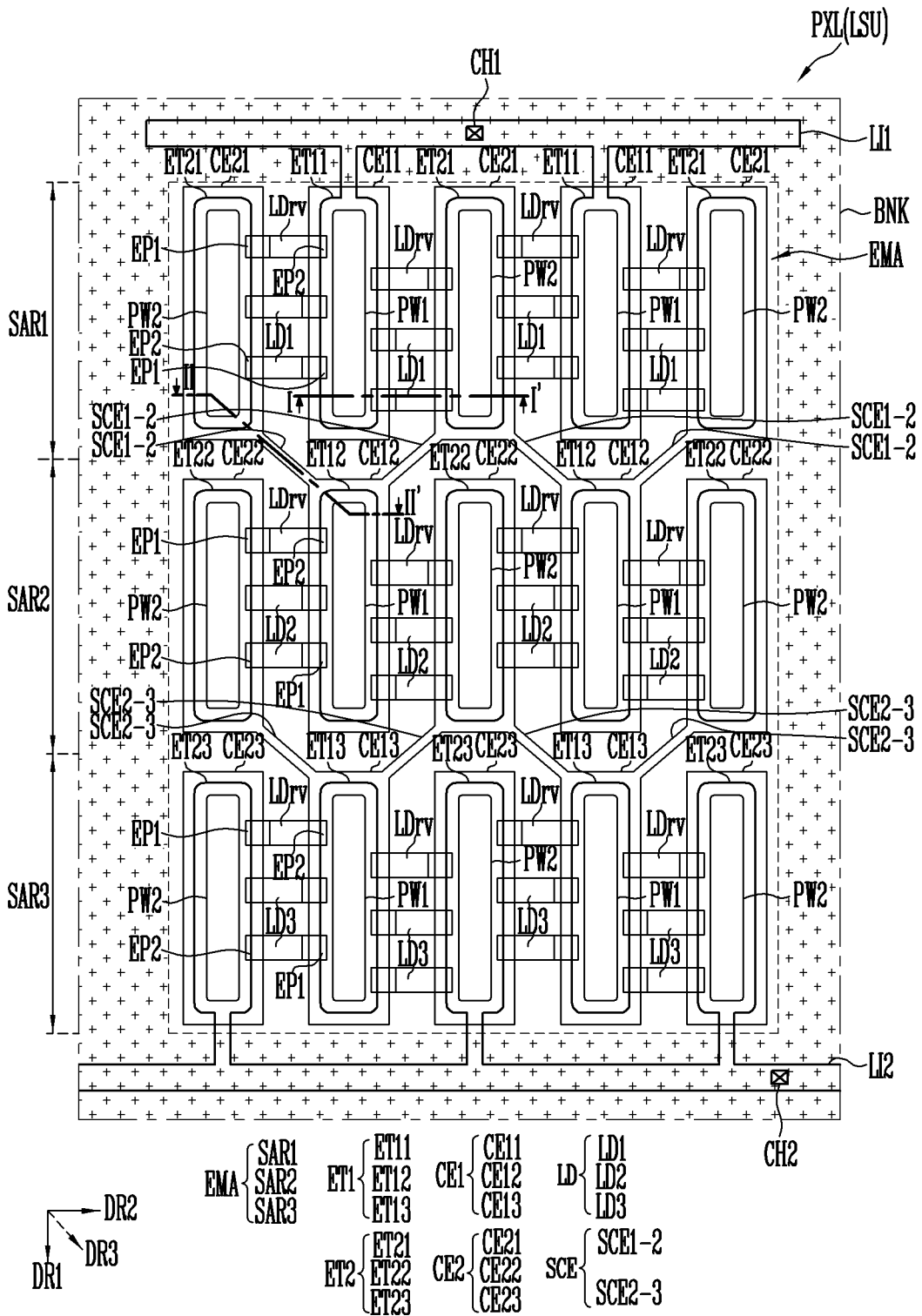

FIGS. 6 and 7 are plan views each illustrating a pixel PXL in accordance with an embodiment. In an embodiment, each pixel PXL illustrated in FIGS. 6 and 7 may be any one of the pixels PXL illustrated in FIGS. 4 to 5E. For example, each pixel PXL illustrated in FIGS. 6 and 7 may be a pixel PXL in accordance with the embodiment of FIG. 5E. Furthermore, in an embodiment, the pixels PXL disposed in the display area (DA of FIG. 4) may have substantially identical or similar structures.

In an embodiment, FIGS. 6 and 7 illustrate the structure of the pixel PXL, centered on the light source unit LSU of the pixel PXL in accordance with each embodiment. Here, the pixel PXL may further include a circuit element (for example, at least one circuit element that forms the pixel circuit PXC of FIGS. 5A to 5E) for controlling each light source unit LSU. In an embodiment, the circuit element may be disposed on a layer different from that of the light source unit LSU. For example, the circuit element may be disposed in a pixel circuit layer located or disposed on one or a surface of the base layer BSL, and the light source unit LSU may be disposed in a display element layer disposed on the pixel circuit layer.

Furthermore, in an embodiment, FIGS. 6 and 7 illustrate an embodiment in which each light source unit LSU may be electrically connected, through first and second contact holes CH1 and CH2, to a predetermined power line (for example, first and/or second power lines PL1 and/or PL2), a circuit element (e.g., at least one circuit element that forms the pixel circuit PXC), and/or a signal line (for example, a scan line Si and/or a data line Dj), but the disclosure is not limited thereto. For example, in an embodiment, at least one of the first and second electrodes ET1 and ET2 of each pixel PXL may be electrically connected or directly electrically connected to a predetermined power line and/or signal line without using, for example, a contact hole and/or an intermediate line.

Referring to FIG. 6, the pixel PXL in accordance with an embodiment may include a plurality of first electrodes ET1 and a plurality of second electrodes ET2 which are separated from each other and dispersed in the emission area EMA, and a plurality of light emitting elements LD electrically connected in a serial or parallel combination structure between the first and second electrodes ET1 and ET2. In an embodiment, the emission area EMA of each pixel PXL may refer to an area where the light emitting elements LD that form the light source unit LSU of the pixel PXL are disposed. Not only the light emitting elements LD but also the first and second electrodes ET1 and ET2 electrically connected to the light emitting elements LD may be disposed in the emission area EMA.

In an embodiment, the emission area EMA may be enclosed by a light shielding and/or reflective bank (also referred to as "pixel defining layer") BNK. For example, the emission area EMA of each pixel PXL may be defined and/or sectioned by the bank BNK.

In an embodiment, the bank BNK may be disposed to enclose each emission area EMA. For example, the bank BNK may be disposed between the emission areas EMA of the pixels PXL such that the bank BNK is disposed in a peripheral area of each pixel PXL and/or an area between adjacent pixels PXL.

In an embodiment, the first and second electrodes ET1 and ET2 may be dispersed in the emission area EMA in the form of a matrix in a first direction (for example, a column direction or a vertical direction) DR1 and a second direction (for example, a row direction or a horizontal direction) DR2. In the following descriptions, an area where the first and second electrodes ET1 and ET2 and the light emitting elements LD of each serial stage are disposed may be defined as a sub-area with regard to the first direction DR1. For example, if the light source unit LSU may include a plurality of light emitting elements LD which are dispersed and disposed in three serial stages, the emission area EMA in which the light source unit LSU is disposed may be sectioned into the three sub-areas with regard to the first direction DR1. For example, the emission area EMA may include a first sub-area SAR1, a second sub-area SAR2, and a third sub-area SAR3 which are successively disposed in the first direction DR1.

At least one pair of first-stage first and second electrodes ET11 and ET21, and a plurality of first light emitting elements LD1 electrically connected therebetween may be disposed in the first sub-area SAR1. For example, a plurality of first-stage first electrodes ET11 and a plurality of first-stage second electrodes ET21 may be disposed in the first sub-area SAR1. Furthermore, at least one pair of first-stage first and second contact electrodes CE11 and CE21 that respectively correspond to the first and second electrodes ET11 and ET21 of the first stage may be selectively further disposed in the first sub-area SAR1.

The first and second electrodes ET11 and ET21 of the first stage may be disposed at positions spaced apart from each other in the first sub-area SAR1. In an embodiment, the first and second electrodes ET11 and ET21 of the first stage may be regularly arranged or disposed in the first sub-area SAR1, but the disclosure is not limited thereto.

In an embodiment, the first and second electrodes ET11 and ET21 of the first stage each may have a substantially bar shape extending in one direction in the first sub-area SAR1. For example, the first and second electrodes ET11 and ET21 of the first stage each may have a substantially bar shape extending in the first direction DR1 and be successively or alternately disposed at positions spaced apart from each other in the second direction DR2 intersecting with the first direction DR1. However, the shapes, the orientations, and/or the relative disposition structure of the first and second electrodes ET11 and ET21 of the first stage are not limited thereto and may be changed in various ways. For example, in an embodiment, the first and second electrodes ET11 and ET21 of the first stage may be disposed at positions spaced apart from each other in a bihelical structure or the like within the spirit and the scope of the disclosure.

In an embodiment, each first-stage first electrode ET11 may be integrally or non-integrally connected to a first line (also referred to as "first connection line" or "first connection pattern") LI1. For example, each pixel PXL may further include a first line LI1 electrically connected to at least one first-stage first electrode ET11. For example, each pixel PXL may further include a first line LI1 integrally connected to a plurality of first-stage first electrodes ET11. The first-stage first electrodes ET11 and the first line LI1 may be regarded as different areas of one electrode, line, or pattern.

In an embodiment, in an area between the first-stage first electrodes ET11 and the first line LI1, the width of the conductive pattern that forms the first-stage first electrodes ET11 and the first line LI1 may be partially reduced. If the foregoing structure is used, any one first-stage first electrode ET11 may be easily separated from the first line LI1, as needed. For example, in the case where a short-circuit defect is caused in at least one first light emitting element LD1 electrically connected to any one first-stage first electrode ET11, the any one first-stage first electrode ET11 may be separated from the first line LI1 to allow the defect of the pixel PXL attributable to the short-circuit defect to be repaired. However, the disclosure is not limited thereto. For example, in an embodiment, the width of each first-stage first electrode ET11 may remain constant to an area in which the first-stage first electrode ET11 may be electrically connected to the first line LI1.

In an embodiment, the first line LI1 may be supplied with a voltage of the first power supply VDD (a first power voltage) or a first driving signal (for example, a scan signal, a data signal, or a predetermined other control signal) during a period in which the display device is operated. In an embodiment, the first line LI1 may be electrically connected to a first contact hole CH1, a predetermined circuit element (for example, at least one transistor that forms the pixel circuit PXC), a power line (for example, the first power line PL1), and/or a signal line (for example, the scan line Si, the data line Dj, or a predetermined control line). For example, the first line LI1 may be electrically connected to a predetermined circuit element disposed thereunder through the first contact hole CH1, and be electrically connected to the first power line PL1 through the circuit element. In an embodiment, the first line LI1 may be electrically connected, via the first contact hole CH1, for example, to a signal line to which a predetermined first driving signal is supplied. In an embodiment, the first line LI1 may be electrically connected or directly electrically connected to the first power line PL1 or a predetermined signal line without using the first contact hole CH1, and/or the circuit element. The first line LI1 may be integrally or non-integrally connected to the first power line PL1 or the predetermined signal line.

In an embodiment, the first line LI1 electrically connected to the first-stage first electrodes ET11 of each of the pixels PXL may be first fabricated to be electrically connected in common to a plurality of pixels PXL and be supplied with a first alignment signal (or a first alignment voltage) at the step of aligning the light emitting elements LD. Thereafter, the first line LI1 between the pixels PXL may be open (or disconnected), so that the pixels PXL can be fabricated to be individually operable.

In an embodiment, each first-stage second electrode ET21 may have a separate individual pattern shape. Each first-stage second electrode ET21 may be electrically connected to at least one electrode of a subsequent stage. For example, each first-stage second electrode ET21 may be electrically connected to any one second-stage first electrode ET12 and/or any one second-stage first contact electrode CE12 through the corresponding first-stage second contact electrode CE21 or without using the first-stage second contact electrode CE21.

A plurality of first light emitting elements LD1 may be disposed between the first and second electrodes ET11 and ET21 of the first stage. For example, a plurality of first light emitting elements LD1 may be arranged or disposed in parallel to each other between each first-stage first electrode ET11 and the corresponding first-stage second electrode ET21.

Each first light emitting element LD1 may include a first end EP1 electrically connected to any one first-stage first electrode ET11, and a second end EP2 electrically connected to any one first-stage second electrode ET21. In an embodiment, the first end EP1 may be a P-type end, and the second end EP2 may be an N-type end.

In an embodiment, each first light emitting element LD1 may be electrically connected in the forward direction between first and second electrodes ET11 and ET21 of the first stage. For example, the first end EP1 of each of the first light emitting elements LD1 may be electrically connected or directly electrically connected to any one first-stage first electrode ET11, or may be electrically connected to the any one first-stage first electrode ET11 through any one first-stage first contact electrode CE11. Likewise, the second end EP2 of each of the first light emitting elements LD1 may be electrically connected or directly electrically connected to any one first-stage second electrode ET21, or may be electrically connected to the any one first-stage second electrode ET21 through any one first-stage second contact electrode CE21. The first light emitting elements LD1 may form valid light sources of the first stage.

In an embodiment, at least one reverse light emitting element LDrv electrically connected in a direction opposite to that of the first light emitting elements LD1 may be further electrically connected between the first and second electrodes ET11 and ET21 of the first stage. The at least one reverse light emitting element LDrv may remain disabled in the pixel PXL.

In an embodiment, each first-stage first contact electrode CE11 may be disposed on each corresponding first-stage first electrode ET11. Each first-stage second contact electrode CE21 may be disposed on each corresponding first-stage second electrode ET21. For example, in the case where a plurality of first-stage first electrodes ET11 and a plurality of first-stage second electrodes ET21 are disposed in the first sub-area SAR1, a plurality of first-stage first contact electrodes CE11 disposed on each first-stage first electrode ET11, and a plurality of first-stage second contact electrodes CE21 disposed on each first-stage second electrode ET21 may be disposed in the first sub-area SAR1. In an embodiment, the first and second contact electrodes CE11 and CE21 of the first stage may be successively or alternately disposed at positions spaced apart from each other in the second direction DR2 in the first sub-area SAR1.

Each first-stage first contact electrode CE11 may be disposed on each corresponding first-stage first electrode ET11 and the first end EP1 of at least one first light emitting element LD1 adjacent to the first-stage first electrode ET11, and electrically connect the first end EP1 to the corresponding first-stage first electrode ET11. Likewise, each first-stage second contact electrode CE21 may be disposed on each corresponding first-stage second electrode ET21 and the second end EP2 of at least one first light emitting element LD1 adjacent to the first-stage second electrode ET21, and electrically connect the second end EP2 to the corresponding first-stage second electrode ET21. For example, the first and second contact electrodes CE11 and CE21 of the first stage may electrically connect the first light emitting elements LD1 between the first and second electrodes ET11 and ET21 of the first stage.

In an embodiment, each first-stage first contact electrode CE11 may have a separate individual pattern shape. Each first-stage second contact electrode CE21 may be integrally or non-integrally connected with at least one second-stage first contact electrode CE12. For example, at least one 1-2-th stage connection electrode SCE1-2 electrically connected to each first-stage second contact electrode CE21 to at least one second-stage first contact electrode CE12 of a subsequent stage may be disposed in a boundary area between the first sub-area SAR1 and the second sub-area SAR2.

In an embodiment, the 1-2-th stage connection electrode SCE1-2 may extend, in the boundary area between the first and second sub-areas SAR1 and SAR2, in a third direction DR3 (for example, a diagonal direction) intersecting the first and second directions DR1 and DR2, and electrically connect each first-stage second contact electrode CE21 with at least one second-stage first contact electrode CE12. For example, the 1-2-th stage connection electrode SCE1-2 may extend in a diagonal direction in the boundary area between the first and second sub-areas SAR1 and SAR2, and electrically connect each first-stage second contact electrode CE21 to at least one second-stage first contact electrode CE12.

In an embodiment, the 1-2-th stage connection electrode SCE1-2 may be integrally connected with at least one first-stage second contact electrode CE21 and at least one second-stage first contact electrode CE12. At the step of forming the first and second contact electrodes CE1 and CE2 of each stage, at least one connection electrode (also referred to as "connector", "bridge", or "bridge patter") SCE for electrically connecting the light emitting elements LD of each stage in series may be formed simultaneously therewith. Hence, a process of fabricating the pixel PXL and the display device including the pixel PXL may be simplified, and the efficiency thereof may be enhanced. In the case where a plurality of contact electrodes disposed in two successive serial stages and at least one connection electrode SCE (for example, at least one first-stage second contact electrode CE21, at least one second-stage first contact electrode CE12, and the 1-2-th stage connection electrode SCE1-2) electrically connecting the plurality of contact electrodes may be integrally connected to each other, they may be regarded as different predetermined areas of one contact electrode.

At least one pair of second-stage first and second electrodes ET12 and ET22, and a plurality of second light emitting elements LD2 electrically connected therebetween may be disposed in the second sub-area SAR2. For example, a plurality of second-stage first electrodes ET12 and a plurality of second-stage second electrodes ET22 may be disposed in the second sub-area SAR2. Furthermore, at least one pair of second-stage first and second contact electrodes CE12 and CE22 that respectively correspond to the first and second electrodes ET12 and ET22 of the second stage may be selectively further disposed in the second sub-area SAR2.

The first and second electrodes ET12 and ET22 of the second stage may be disposed at positions spaced apart from each other in the second sub-area SAR2. In an embodiment, the first and second electrodes ET12 and ET22 of the second stage may be regularly arranged or disposed in the second sub-area SAR2, but the disclosure is not limited thereto.

In an embodiment, the first and second electrodes ET12 and ET22 of the second stage each may have a substantially bar shape extending in one direction in the second sub-area SAR2. For example, the first and second electrodes ET12 and ET22 of the second stage each may have a substantially bar shape extending in the first direction DR1 and be successively and/or alternately disposed at positions spaced apart from each other in the second direction DR2 intersecting with the first direction DR1. However, the shapes, the orientations, and/or the relative disposition structure of the first and second electrodes ET12 and ET22 of the second stage may be changed in various ways.

In an embodiment, each of the first and second electrodes ET12 and ET22 of the second stage that is an intermediate stage of the serial structure may have a separate individual pattern shape. Each of the first and second electrodes ET12 and ET22 of the second stage may be electrically connected to at least one electrode of a preceding stage (for example, the first stage) or a subsequent stage (for example, the third stage). For example, each second-stage first electrode ET12 may be electrically connected to any one first-stage (for example, preceding-stage) second electrode ET21 and/or any one first-stage second contact electrode CE21 through the corresponding second-stage first contact electrode CE12 or without using the second-stage first contact electrode CE12. Each second-stage second electrode ET22 may be electrically connected to any one third-stage (for example, subsequent-stage) first electrode ET13 and/or any one third-stage first contact electrode CE13 through the corresponding second-stage second contact electrode CE22 or without using the second-stage second contact electrode CE22.

In an embodiment, in the case the light source unit LSU has an only two-stage serial structure, each second-stage first electrode ET12 may have a separate individual pattern shape, and each second-stage second electrode ET22 may be electrically connected or directly electrically connected to the second line LI2 to which a power voltage (for example, a voltage of the second power supply VSS (a second power voltage)) and/or signal (for example, second driving signal) different from that of the first line LI1 is supplied.

A plurality of second light emitting elements LD2 may be disposed between the first and second electrodes ET12 and ET22 of the second stage. For example, a plurality of second light emitting elements LD2 may be arranged or disposed in parallel to each other between each second-stage first electrode ET12 and the corresponding second-stage second electrode ET22.

Each second light emitting element LD2 may include a first end EP1 electrically connected to any one second-stage first electrode ET12, and a second end EP2 electrically connected to any one second-stage second electrode ET22. In an embodiment, the first end EP1 may be a P-type end, and the second end EP2 may be an N-type end.

In an embodiment, each second light emitting element LD2 may be electrically connected in the forward direction between the first and second electrodes ET12 and ET22 of the second stage. For example, the first end EP1 of each of the second light emitting elements LD2 may be electrically connected or directly electrically connected to any one second-stage first electrode ET12, or may be electrically connected to the any one second-stage first electrode ET12 through any one second-stage first contact electrode CE12. Likewise, the second end EP2 of each of the second light emitting elements LD2 may be electrically connected or directly electrically connected to any one second-stage second electrode ET22, or may be electrically connected to the any one second-stage second electrode ET22 through any one second-stage second contact electrode CE22. The second light emitting elements LD2 may form valid light sources of the second stage.

In an embodiment, at least one reverse light emitting element LDrv electrically connected in a direction opposite to that of the second light emitting elements LD2 may be further electrically connected between the first and second electrodes ET12 and ET22 of the second stage. The at least one reverse light emitting element LDrv may remain disabled in the pixel PXL.

In an embodiment, each second-stage first contact electrode CE12 may be disposed on each corresponding second-stage first electrode ET12. Each second-stage second contact electrode CE22 may be disposed on each corresponding second-stage second electrode ET22. For example, in the case where a plurality of second-stage first electrodes ET12 and a plurality of second-stage second electrodes ET22 are disposed in the second sub-area SAR2, a plurality of second-stage first contact electrodes CE12 disposed on each second-stage first electrode ET12, and a plurality of second-stage second contact electrodes CE22 disposed on each second-stage second electrode ET22 may be disposed in the second sub-area SAR2. In an embodiment, the first and second contact electrodes CE12 and CE22 of the second stage may be successively or alternately disposed at positions spaced apart from each other in the second direction DR2 in the second sub-area SAR2.

Each second-stage first contact electrode CE12 may be disposed on each corresponding second-stage first electrode ET12 and the first end EP1 of at least one second light emitting element LD2 adjacent to the second-stage first electrode ET12, and electrically connect the first end EP1 to the corresponding second-stage first electrode ET12. Likewise, each second-stage second contact electrode CE22 may be disposed on each corresponding second-stage second electrode ET22 and the second end EP2 of at least one second light emitting element LD2 adjacent to the second-stage second electrode ET22, and electrically connect the second end EP2 to the corresponding second-stage second electrode ET22. For example, the first and second contact electrodes CE12 and CE22 of the second stage may electrically connect the second light emitting elements LD2 between the first and second electrodes ET12 and ET22 of the second stage.

In an embodiment, each second-stage first contact electrode CE12 may be integrally or non-integrally connected with at least one first-stage (for example, preceding-stage) second contact electrode CE21. Each second-stage second contact electrode CE22 may be integrally or non-integrally connected with at least one third-stage (for example, subsequent-stage) first contact electrode CE13. For example, at least one 1-2-th stage connection electrode SCE1-2 formed to electrically connect at least one first-stage second contact electrode CE21 and at least one second-stage first contact electrode CE12 may be disposed in a boundary area between the first sub-area SAR1 and the second sub-area SAR2. For example, at least one 2-3-th stage connection electrode SCE2-3 formed to electrically connect at least one second-stage second contact electrode CE22 and at least one third-stage first contact electrode CE13 may be disposed in a boundary area between the second sub-area SAR2 and the third sub-area SAR3.

In an embodiment, the 2-3-th stage connection electrode SCE2-3 may extend, in the boundary area between the second and third sub-areas SAR2 and SAR3, in the third direction DR3 intersecting with the first and second directions DR1 and DR2, and electrically connect each second-stage second contact electrode CE22 with at least one third-stage first contact electrode CE13. For example, the 2-3-th stage connection electrode SCE2-3 may extend in a diagonal direction in the boundary area between the second and third sub-areas SAR2 and SAR3, and electrically connect each second-stage second contact electrode CE22 to at least one third-stage first contact electrode CE13. In an embodiment, the 2-3-th stage connection electrode SCE2-3 may be integrally connected with at least one second-stage second contact electrode CE22 and at least one third-stage first contact electrode CE13.

In an embodiment, if the light source unit LSU has an only two-stage serial structure, each second-stage second contact electrode CE22 may have a separate individual pattern shape. Each second-stage second contact electrode CE22 may be electrically connected to the second line Ll2 through the second-stage second electrode ET22.

At least one pair of third-stage first and second electrodes ET13 and ET23, and a plurality of third light emitting elements LD3 electrically connected therebetween may be disposed in the third sub-area SAR3. For example, a plurality of third-stage first electrodes ET13 and a plurality of third-stage second electrodes ET23 may be disposed in the third sub-area SAR3. Furthermore, at least one pair of third-stage first and second contact electrodes CE13 and CE23 that respectively correspond to the first and second electrodes ET13 and ET23 of the third stage may be selectively further disposed in the third sub-area SAR3.

The first and second electrodes ET13 and ET23 of the third stage may be disposed at positions spaced apart from each other in the third sub-area SAR3. In an embodiment, the first and second electrodes ET13 and ET23 of the third stage may be regularly arranged or disposed in the third sub-area SAR3, but the disclosure is not limited thereto.

In an embodiment, the first and second electrodes ET13 and ET23 of the third stage each may have a substantially bar shape extending in one direction in the third sub-area SAR3. For example, the first and second electrodes ET13 and ET23 of the third stage each may have a substantially bar shape extending in the first direction DR1 and be successively or alternately disposed at positions spaced apart from each other in the second direction DR2 intersecting with the first direction DR1. However, the shapes, the orientations, and/or the relative disposition structure of the first and second electrodes ET13 and ET23 of the third stage may be changed in various ways.

In an embodiment, each third-stage first electrode ET13 may have a separate individual pattern shape. Each third-stage first electrode ET13 may be electrically connected to at least one electrode of a preceding stage. For example, each third-stage first electrode ET13 may be electrically connected to any one second-stage second electrode ET22 and/or any one second-stage second contact electrode CE22 through the corresponding third-stage first contact electrode CE13 or without using the third-stage first contact electrode CE13.

In an embodiment, each third-stage second electrode ET23 may be integrally or non-integrally connected to a second line (also referred to as "second connection line" or "second connection pattern") Ll2. For example, each pixel PXL may further include a second line Ll2 electrically connected to at least one third-stage second electrode ET23. For example, each pixel PXL may further include a second line Ll2 integrally connected to a plurality of third-stage second electrodes ET23. The third-stage second electrodes ET23 and the second line Ll2 may be regarded as different areas of one electrode, line, or pattern.

In an embodiment, in an area between the third-stage second electrodes ET23 and the second line LI2, the width of the conductive pattern that forms the third-stage second electrodes ET23 and the second line LI2 may be partially reduced. If the foregoing structure is used, any one third-stage second electrode ET23 may be easily separated from the second line LI2, as needed. For example, in the case where a short-circuit defect is caused in at least one third light emitting element LD3 electrically connected to any one third-stage second electrode ET23, the any one third-stage second electrode ET23 may be separated from the second line LI2 to allow the defect of the pixel PXL attributable to the short-circuit defect to be repaired. However, the disclosure is not limited thereto. For example, in an embodiment, the width of each third-stage second electrode ET23 may remain constant to an area in which the third-stage second electrode ET23 may be electrically connected to the second line LI2.

In an embodiment, the second line LI2 may be supplied with the voltage of the second power supply VSS or a second driving signal (for example, a scan signal, a data signal, or a predetermined other control signal) during a period in which the display device is operated. In an embodiment, the second line LI2 may be electrically connected to a second contact hole CH2, a predetermined circuit element (for example, at least one transistor that forms the pixel circuit PXC), a power line (for example, the second power line PL2), and/or a signal line (for example, the scan line Si, the data line Dj, or a predetermined control line). For example, the second line LI2 may be electrically connected, through the second contact hole CH2, to the second power line PL2 disposed thereunder. In an embodiment, the second line LI2 may be electrically connected or directly electrically connected to the second power line PL2 or a predetermined signal line without using, for example, the second contact hole CH2, and/or the circuit element. The second line LI2 may be integrally or non-integrally connected to the second power line PL2 or the predetermined signal line.

In an embodiment, the second line LI2 electrically connected to the second electrodes ET13 of the last stage of each of the pixels PXL, for example, the third stage, may be electrically connected in common to a plurality of pixels PXL. The second line LI2 may be supplied with a predetermined second alignment signal (or a second alignment voltage) at the step of aligning the light emitting elements LD. During a period in which the display device is actually driven, the second line LI2 may be supplied with the second power supply VSS or a predetermined second driving signal.

A plurality of third light emitting elements LD3 may be disposed between the first and second electrodes ET13 and ET23 of the third stage. For example, a plurality of third light emitting elements LD3 may be arranged or disposed in parallel to each other between each third-stage first electrode ET13 and the corresponding third-stage second electrode ET23.

Each third light emitting element LD3 may include a first end EP1 electrically connected to any one third-stage first electrode ET13, and a second end EP2 electrically connected to any one third-stage second electrode ET23. In an embodiment, the first end EP1 may be a P-type end, and the second end EP2 may be an N-type end.

In an embodiment, each third light emitting element LD3 may be electrically connected in the forward direction between the first and second electrodes ET13 and ET23 of the third stage. For example, the first end EP1 of each of the third light emitting elements LD3 may be electrically connected or directly electrically connected to any one third-stage first electrode ET13, or may be electrically connected to the any one third-stage first electrode ET13 through any one third-stage first contact electrode CE13. Likewise, the second end EP2 of each of the third light emitting elements LD3 may be electrically connected or directly electrically connected to any one third-stage second electrode ET23, or may be electrically connected to the any one third-stage second electrode ET23 through any one third-stage second contact electrode CE23. The third light emitting elements LD3 may form valid light sources of the third stage.

In an embodiment, at least one reverse light emitting element LDrv electrically connected in a direction opposite to that of the third light emitting elements LD3 may be further electrically connected between the first and second electrodes ET13 and ET23 of the third stage. The at least one reverse light emitting element LDrv may remain disabled in the pixel PXL. For example, the pixel PXL may include at least one reverse light emitting element LDrv disposed in the emission area EMA, as well as including a plurality of light emitting elements LD, for example, first, second, and/or third light emitting elements, LD1, LD2, and LD3, disposed in the emission area EMA to form valid light sources.

In an embodiment, the number of light emitting elements LD disposed in the emission area EMA may be greater than the number of reverse light emitting elements LDrv. For example, each of the first, second, and third sub-areas SAR1, SAR2, and SAR3 may include first, second, and third light emitting elements LD1, LD2, and LD3 the number of which is greater than the number of reverse light emitting elements LDrv.

In an embodiment, at the step of aligning the light emitting elements LD, the light emitting elements LD supplied to the emission area EMA may be controlled to be aligned and biased in any one direction (for example, the forward direction) by adjusting alignment signals (or alignment voltages) to be applied to the respective alignment electrodes or forming a magnetic field. For example, at the step of aligning the light emitting elements LD, as the waveforms of the alignment signals are adjusted or a magnetic field is formed in each emission area EMA, the number of light emitting elements LD oriented in the forward direction such that each first end EP1 thereof is oriented toward the first alignment electrode and each second end EP2 thereof is oriented toward the second alignment electrode can be controlled to be greater than the number of reverse light emitting elements LDrv oriented such that each first end EP1 thereof is oriented toward the second alignment electrode and each second end EP2 thereof is oriented toward the first alignment electrode. For example, the light emitting elements LD may be aligned by controlling the processing conditions such that a ratio of the number of light emitting elements LD oriented in the forward direction and the number of reverse light emitting elements LDrv becomes approximately 80:20.

In an embodiment, each of the light emitting elements LD disposed in the emission area EMA may be a light emitting element which is made of material having an inorganic crystal structure and has a subminiature size, for example, ranging from the nanometer scale to the micrometer scale. For example, each light emitting element LD may be a subminiature rod-type light emitting element having a size ranging from the nanometer scale to the micrometer scale, as illustrated in FIGS. 1A to 3B. The size, the type, the shape, for example, of the light emitting elements LD may be changed in various ways.

Although FIG. 6 illustrates that, in the area where a pair of first and second electrodes ET1 and ET2 are disposed to face each other, each light emitting element LD is uniformly horizontally arranged or disposed in the first direction DR1 between the first and second electrodes ET1 and ET2, the disclosure is not limited thereto. For example, at least one of the light emitting elements LD may be arranged or disposed and/or electrically connected in a diagonal direction between the first and second electrodes ET1 and ET2. As an example, although not illustrated in FIG. 6, at least one light emitting element (for example, an invalid light source other than a reverse light emitting element LDrv) that may not be completely electrically connected between the first and second electrodes ET1 and ET2 may be further disposed in each pixel area and/or an area provided around the pixel area.

In an embodiment, the light emitting elements LD may be prepared in a diffused form in a predetermined solution, and then supplied to the emission area EMA of each pixel PXL by an inkjet scheme or the like within the spirit and the scope of the disclosure. For example, the light emitting elements LD may be mixed with a volatile solvent and supplied to each emission area EMA. Here, if predetermined alignment signals (or alignment voltages) are applied to the first and second electrodes ET1 and ET2 (or the first and second alignment electrodes that correspond to the respective states of the first and second electrodes ET1 and ET2 before the first and second electrodes ET1 and ET2 are divided by a boundary of the respective sub-areas), an electric field is formed between the first and second electrodes ET1 and ET2, whereby the light emitting elements LD may be aligned between the first and second electrodes ET1 and ET2 (or the first and second alignment electrodes). After the light emitting elements LD have been aligned, the solvent may be removed by a volatilization scheme or other schemes. In this way, the light emitting elements LD may be reliably disposed between the first and second electrodes ET1 and ET2. Thereafter, since the first and second contact electrodes CE1 and CE2 are formed on the opposite ends of the light emitting elements LD, for example, on the first and second ends EP1 and EP2, the light emitting elements LD may be more reliably electrically connected between the first and second electrodes ET1 and ET2.

In an embodiment, each third-stage first contact electrode CE13 may be disposed on each corresponding third-stage first electrode ET13. Each third-stage second contact electrode CE23 may be disposed on each corresponding third-stage second electrode ET23. For example, in the case where a plurality of third-stage first electrodes ET13 and a plurality of third-stage second electrodes ET23 are disposed in the third sub-area SAR3, a plurality of third-stage first contact electrodes CE13 disposed on each third-stage first electrode ET13, and a plurality of third-stage second contact electrodes CE23 disposed on each third-stage second electrode ET23 may be disposed in the third sub-area SAR3. In an embodiment, the first and second contact electrodes CE13 and CE23 of the third stage may be successively or alternately disposed at positions spaced apart from each other in the second direction DR2 in the third sub-area SAR3.

Each third-stage first contact electrode CE13 may be disposed on each corresponding third-stage first electrode ET13 and the first end EP1 of at least one third light emitting element LD3 adjacent to the third-stage first electrode ET13, and electrically connect the first end EP1 to the corresponding third-stage first electrode ET13. Likewise, each third-stage second contact electrode CE23 may be disposed on each corresponding third-stage second electrode ET23 and the second end EP2 of at least one third light emitting element LD3 adjacent to the third-stage second electrode ET23, and electrically connect the second end EP2 to the corresponding third-stage second electrode ET23. For example, the first and second contact electrodes CE13 and CE23 of the third stage may electrically connect the third light emitting elements LD3 between the first and second electrodes ET13 and ET23 of the third stage.

In an embodiment, each third-stage first contact electrode CE13 may be integrally or non-integrally connected with at least one second-stage (for example, a preceding-stage) second contact electrode CE22. For example, each third-stage first contact electrode CE13 may be integrally connected with at least one 2-3-th stage connection electrode SCE2-3 and at least one second-stage second contact electrode CE22 that are disposed in the boundary area between the second and third sub-areas SAR2 and SAR3. Each third-stage second contact electrode CE23 may have a separate individual pattern shape.

In the case where the emission area EMA includes at least three sub-areas, as described above, in a K-th sub-area (K is a natural number of 3 or more) of the emission area EMA, there may be disposed the first and second electrodes of a K-th stage that are disposed at positions spaced apart from each other, K-th light emitting elements arranged or disposed in parallel to each other between the first and second electrodes of the K-th stage, the first and second contact electrodes of the K-th stage that are respectively disposed on the first and second electrodes of the K-th stage and to electrically connect the K-th light emitting elements between the first and second electrodes of the K-th stage. In a boundary area between the K-th sub-area and a sub-area (for example, a [K−1]-th sub-area) of a preceding stage, there may be disposed at least one a [K−1]-K-th stage connection electrode to electrically connect the first contact electrode of the K-th stage to the second contact electrode of the preceding stage (for example, the [K−1]-th stage). In the foregoing embodiment, the first electrode ET11 of the first stage may be electrically connected to the first line LI1, and the second electrode of the K-th stage or the last stage may be electrically connected to the second line LI2. Furthermore, each of the second electrode ET21 of the first stage, the first and second electrodes of intermediate stages including the second stage, and the first electrode of the K-th stage or the last stage may have a separate individual pattern shape.

Referring to FIG. 7, the pixel PXL may further include a plurality of first partition walls PW1 (also referred to as "first wall(s)" or "first bank(s)") which overlap each first electrode ET1, and a plurality of second partition walls PW2 (also referred to as "second wall(s)" or "second bank(s)") which overlap each second electrode ET2. In an embodiment, the first partition walls PW1 and the second partition walls PW2 each may have a separate individual pattern.

In an embodiment, the first partition walls PW1 and the second partition walls PW2 may be respectively disposed under or below the first electrodes ET1 and the second electrodes ET2. For example, each first partition wall PW1 may be disposed under or below any one first electrode ET1 disposed in any one sub-area of the first, second, and third sub-areas SAR1, SAR2, and SAR3. Each second partition wall PW2 may be disposed under or below any one second electrode ET2 disposed in any one sub-area of the first, second, and third sub-areas SAR1, SAR2, and SAR3.

In an embodiment, each first partition wall PW1 may have a width less than that of each first electrode ET1 and be disposed under or below the first electrode ET1. For example, each first partition wall PW1 may have a shape substantially corresponding to the first electrode ET1 and be disposed inside the first electrode ET1, in a plan view.

In case that the first partition walls PW1 are disposed under or below the first electrodes ET1, the first electrodes ET1 may protrude upward in the area in which the first partition walls PW1 are disposed. Therefore, light emitted from the first ends EP1 of the light emitting elements LD that face the first electrodes ET1 may be controlled to more effectively travel in the frontal direction of the display device.

In an embodiment, each second partition wall PW2 may have a width less than that of each second electrode ET2 and be disposed under or below the second electrode ET2. For example, each second partition wall PW2 may have a shape substantially corresponding to each second electrode ET2 and be disposed inside the second electrode ET2, in a plan view.

In case that the second partition walls PW2 are disposed under or below the second electrodes ET2, the second electrodes ET2 may protrude upward in the area in which the second partition walls PW2 are disposed. Therefore, light emitted from the second ends EP2 of the light emitting elements LD that face the second electrodes ET2 may be controlled to more effectively travel in the frontal direction of the display device.

In accordance with embodiments of FIGS. 6 and 7, the emission area EMA of each pixel PXL is divided into a plurality of sub-areas in any one direction (for example, the first direction DR1), and the first and second electrodes ET1 and ET2, the light emitting elements LD, and the first and second contact electrodes CE1 and CE2 are disposed in each sub-area. The second contact electrodes CE2 of any one stage may be electrically connected to the first contact electrodes CE1 of a subsequent stage, between adjacent sub-areas, through the connection electrode SCE passing through the boundary area between the sub-areas. In this way, the light emitting elements LD supplied to each emission area EMA may be electrically connected in a serial or parallel combination structure to form each light source unit LSU.

In accordance with the foregoing embodiments, since the light source unit LSU has a serial or parallel combination structure, each pixel PXL may be reliably driven, and a driving current that flows through the display panel PNL may be reduced. Hence, the power consumption efficiency may be improved. Furthermore, the light emitting elements LD are biased-aligned, a plurality of first and second electrodes ET1 and ET2 are separately disposed in a plurality of sub-areas, and the first and second contact electrodes CE1 and CE2 may be alternately electrically connected between the adjacent sub-areas. Hence, main alignment direction of the biased-aligned light emitting elements LD may match with the forward direction of each serial stage. Therefore, the number of light emitting elements LD used as valid light sources to form each light source unit LSU among the light emitting elements supplied to the emission area EMA of each pixel PXL may be increased. For example, in accordance with the foregoing embodiments, the application efficiency of the light emitting elements LD can be enhanced.

Figure 10:
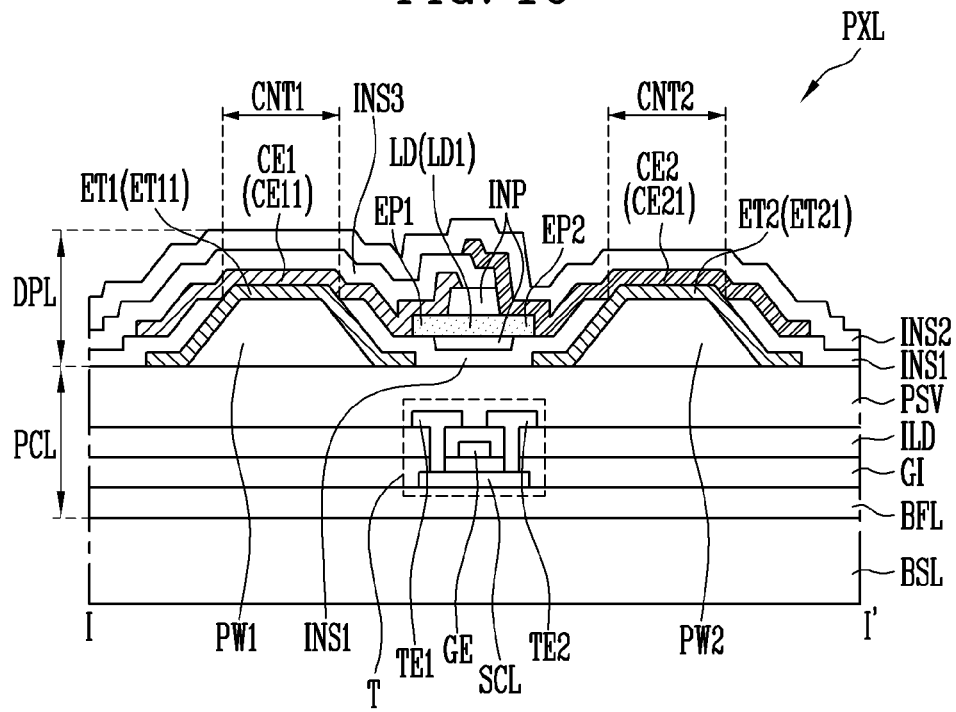
Figure 11:
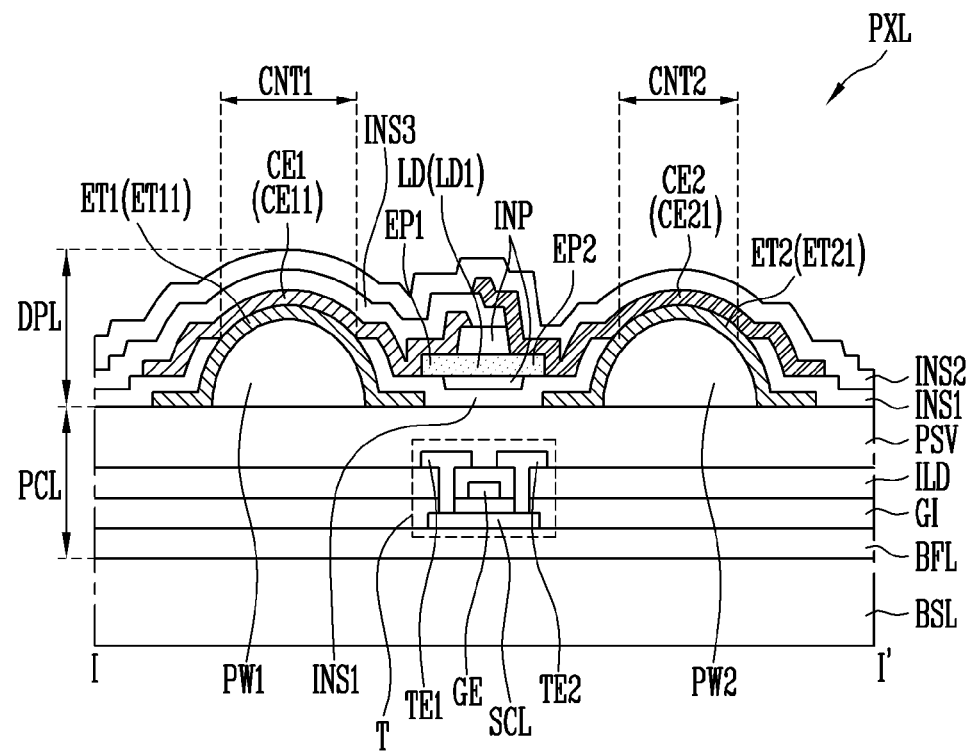
Figure 12:
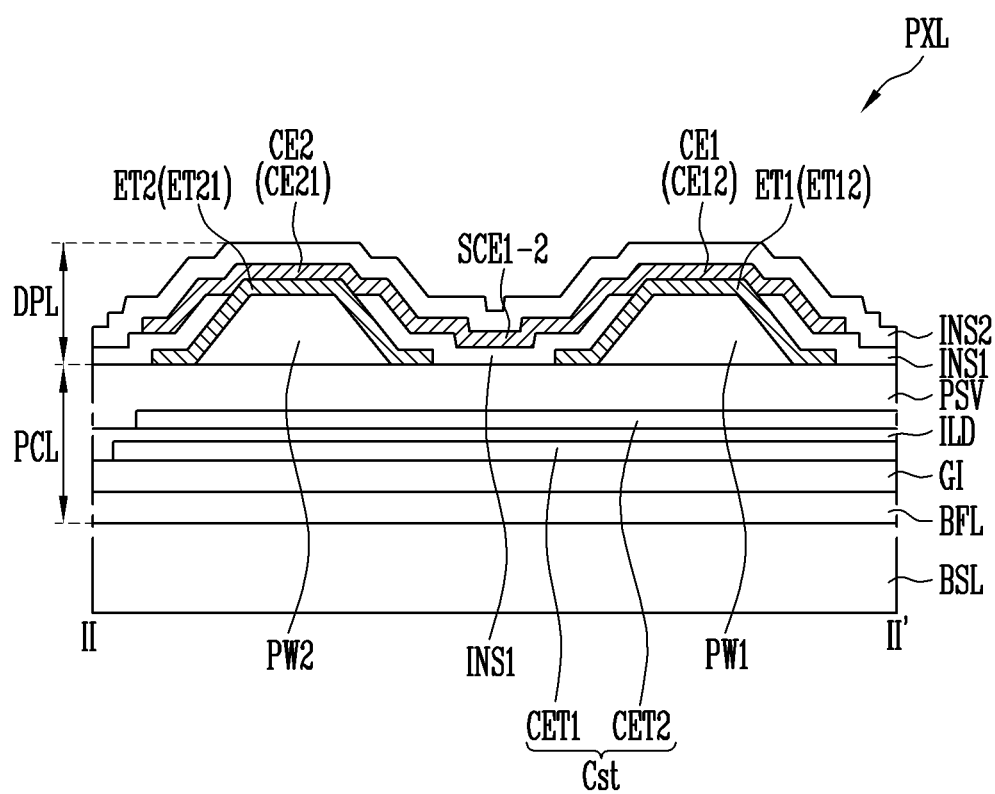
FIG. 12 is a sectional view illustrating a pixel in accordance with an embodiment, and for example illustrates an embodiment of a cross-section of the pixel corresponding to line of FIG. 7.

FIGS. 8 to 11 are sectional views each illustrating a pixel PXL in accordance with an embodiment, and for example illustrate different embodiments of a cross-section of the pixel PXL corresponding to line I-I' of FIG. 7. FIG. 12 is a sectional view illustrating a pixel PXL in accordance with an embodiment, and for example illustrates an embodiment of a cross-section of the pixel PXL corresponding to line II-IF of FIG. 7. Hereinafter, an embodiment of the cross-sectional structure of each pixel PXL will be described with reference to FIGS. 8 to 12 along with FIGS. 4 to 7.

Referring to FIGS. 4 to 12, the pixel PXL in accordance with an embodiment may include a display element layer DPL disposed on one or a surface of the base layer BSL and including a plurality of light emitting elements LD. Furthermore, the pixel PXL may selectively include a pixel circuit layer PCL. For example, the pixel PXL may further include a pixel circuit layer PCL disposed between the base layer BSL and the display element layer DPL.

In an embodiment, the pixel circuit layer PCL may include at least one circuit element electrically connected to the light emitting elements LD. For example, the pixel circuit layer PCL may include at least one circuit element which forms the pixel circuit PXC of each pixel PXL.

For example, the pixel circuit layer PCL may include a plurality of transistors T and a storage capacitor Cst that are disposed in each pixel area and form the corresponding pixel circuit PXC, and further include at least one power line and/or a signal line that may be electrically connected to the pixel circuit PXC and/or the light source unit LSU. Here, in the case where the pixel circuit PXC is omitted and each light source unit LSU may be electrically connected or directly electrically connected to the first and second power lines PL1 and PL2 (or predetermined signal lines), the pixel circuit layer PCL may be omitted. For the sake of explanation, FIGS. 8 to 11 representatively illustrate only one transistor T among circuit elements and lines that are disposed in the pixel circuit layer PCL, and FIG. 12 illustrates a storage capacitor Cst disposed in the pixel circuit layer PCL. Here, the plane or section structure of the pixel circuit layer PCL may be changed in various ways. The positions and cross-sectional structures of each transistor T and the storage capacitor Cst may be changed in various ways depending on embodiments.

Furthermore, the pixel circuit layer PCL may include a plurality of insulating layers disposed between respective electrodes and/or lines. In an embodiment, the pixel circuit layer PCL may include a buffer layer BFL, a gate insulating layer GI, an interlayer insulating layer ILD, and a passivation layer PSV which are successively stacked on one or a surface of the base layer BSL. In an embodiment, the pixel circuit layer PCL may further include at least one light shielding pattern (not shown) disposed under or below at least some or a number of transistors T.

The buffer layer BFL may prevent impurities from diffusing into each circuit element. The buffer layer BFL may be formed of a single layer, or may be formed of multiple layers having at least two or more layers. In the case where the buffer layer BFL has a multilayer structure, the respective layers may be formed of the same or similar material or different materials. In an embodiment, the buffer layer BFL may be omitted.

In an embodiment, each transistor T may include a semiconductor layer SCL, a gate electrode GE, and first and second transistor electrodes TE1 and TE2. Although FIGS. 8 to 11 illustrate an embodiment in which each transistor T may include the first and second transistor electrodes TE1 and TE2 that are formed separately from the semiconductor layer SCL, the disclosure is not limited thereto. For example, in an embodiment, the first and/or second transistor electrode TE1 and/or TE2 provided in at least one transistor T disposed in each pixel area may be integrally formed with the corresponding semiconductor layer SCL.

The semiconductor layer SCL may be disposed on the buffer layer BFL. For example, the semiconductor layer SCL may be disposed between the gate insulating layer GI and the base layer BSL on which the buffer layer BFL is formed. The semiconductor layer SCL may include a first area which comes into contact with each first transistor electrode TE1, a second area which comes into contact with each second transistor electrode TE2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, for example, within the spirit and the scope of the disclosure. The channel area of the semiconductor layer SCL may be an intrinsic semiconductor, which is an undoped semiconductor pattern. Each of the first and second areas of the semiconductor layer SCL may be a semiconductor pattern doped with a predetermined impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD and overlap at least one area of the semiconductor layer SCL.

The first and second transistor electrodes TE1 and TE2 may be disposed on each semiconductor layer SCL with at least one interlayer insulating layer ILD interposed therebetween. For example, the first and second transistor electrodes TE1 and TE2 may be disposed on respective different ends of the semiconductor layer SCL with the gate insulating layer GI and the interlayer insulating layer ILD interposed therebetween. The first and second transistor electrodes TE1 and TE2 may be electrically connected to each semiconductor layer SCL. For example, the first and second transistor electrodes TE1 and TE2 may be electrically connected to the first and second areas of the semiconductor layer SCL through corresponding contact holes which pass through the gate insulating layer GI and the interlayer insulating layer ILD. In an embodiment, any one of the first and second transistor electrodes TE1 and TE2 may be a source electrode, and the other may be a drain electrode.

At least one transistor T provided in the pixel circuit PXC may be electrically connected to at least one pixel electrode. For example, any one (for example, the drain electrode) of the first and second transistor electrodes TE1 and TE2 of the first transistor T1 illustrated in FIG. 5E may be electrically connected to the first-stage first electrodes ET11 of the corresponding pixel PXL both through a contact hole (for example, the first contact hole CH1) passing through the passivation layer PSV and through the first line LI1 provided over the passivation layer PSV.

The storage capacitor Cst may include a first capacitor electrode CET1 and a second capacitor electrode CET2 which are disposed on different layers and overlap each other. In an embodiment, the first capacitor electrode CET1 may be disposed on the same layer as that of the gate electrode GE of the transistor T. The second capacitor electrode CET2 may be disposed on the same layer as that of the first and second transistor electrodes and TE2 of the transistor T. Here, the disclosure is not limited thereto. The positions of the first capacitor electrode CET1 and/or the second capacitor electrode CET2 may be changed in various ways. For example, in an embodiment, the interlayer insulating layer ILD may be formed of a plurality of insulating layers, and the first or second capacitor electrode CET1 or CET2 may be disposed between the plurality of insulating layers. In an embodiment, at least one of the first and second capacitor electrodes CET1 and CET2 may be formed of a plurality conductive layers.

In an embodiment, at least one signal line and/or power line that may be electrically connected to each pixel PXL may be disposed on a layer identical with that of an electrode of the transistors T of the circuit elements that form the pixel circuit PXC. For example, the scan line Si of each pixel PXL may be disposed on the same layer as that of the gate electrodes GE. The data line Dj of each pixel PXL may be disposed on the same layer as that of the first and second transistor electrodes TE1 and TE2 of the transistors T. Furthermore, the first and/or second power lines PL1 and PL2 may be disposed on the same layer as that of the gate electrodes GE or the first and second transistor electrodes TE1 and TE2 of the transistors T.

In an embodiment, the display element layer DPL may include a light source unit LSU of each of the pixels PXL. For example, the display element layer DPL may include a plurality of first and second electrodes ET1 and ET2 disposed in the emission area EMA of each pixel PXL, a plurality of light emitting elements LD disposed between the first and second electrodes ET1 and ET2, and a plurality of first and second contact electrodes CE1 and CE2 provided to electrically connect the light emitting elements LD between the first and second electrodes ET1 and ET2. The display element layer DPL may further include, for example, at least one conductive layer and/or insulating layer.

In an embodiment, the display element layer DPL may include first and second partition walls PW1 and PW2, first and second electrodes ET1 and ET2, a first insulating layer INS1, light emitting elements LD, an insulating pattern INP, first and second contact electrodes CE1 and CE2, and a second insulating layer INS2, which are successively disposed and/or formed over the base layer BSL and/or the pixel circuit layer PCL.

The first and second partition walls PW1 and PW2 may be disposed at positions spaced apart from each other in the emission area EMA of each pixel PXL. The first and second partition walls PW1 and PW2 may protrude from the base layer BSL and/or the pixel circuit layer PCL in a height direction of the base layer BSL. In an embodiment, the first and second partition walls PW1 and PW2 may have substantially the same height, but the disclosure is not limited thereto.

In an embodiment, the first partition wall PW1 may be disposed between the base layer BSL and/or the pixel circuit layer PCL and each first electrode ET1. The first partition walls PW1 may be disposed adjacent to the first ends EP1 of the light emitting elements LD. For example, one or a side surface of each of the first partition walls PW1 may be positioned adjacent to the first ends EP1 of the light emitting elements LD and disposed to face the first ends EP1. In an embodiment, in the case where at least one reverse light emitting element LDrv is disposed around at least one first partition wall PW1, the one or a side surface of the first partition wall PW1 may be disposed to face the second end EP2 of the reverse light emitting element LDrv.

In an embodiment, the second partition wall PW2 may be disposed between the base layer BSL and/or the pixel circuit layer PCL and the second electrode ET2. The second partition wall PW2 may be disposed adjacent to the second ends EP2 of the light emitting elements LD. For example, one or a side surface of the second partition wall PW2 may be positioned adjacent to the second ends EP2 of the light emitting elements LD and disposed to face the second ends EP2. In an embodiment, in the case where at least one reverse light emitting element LDrv is disposed around at least one second partition wall PW2, the one or a side surface of the second partition wall PW2 may be disposed to face the first end EP1 of the reverse light emitting element LDrv.

Figure 8:
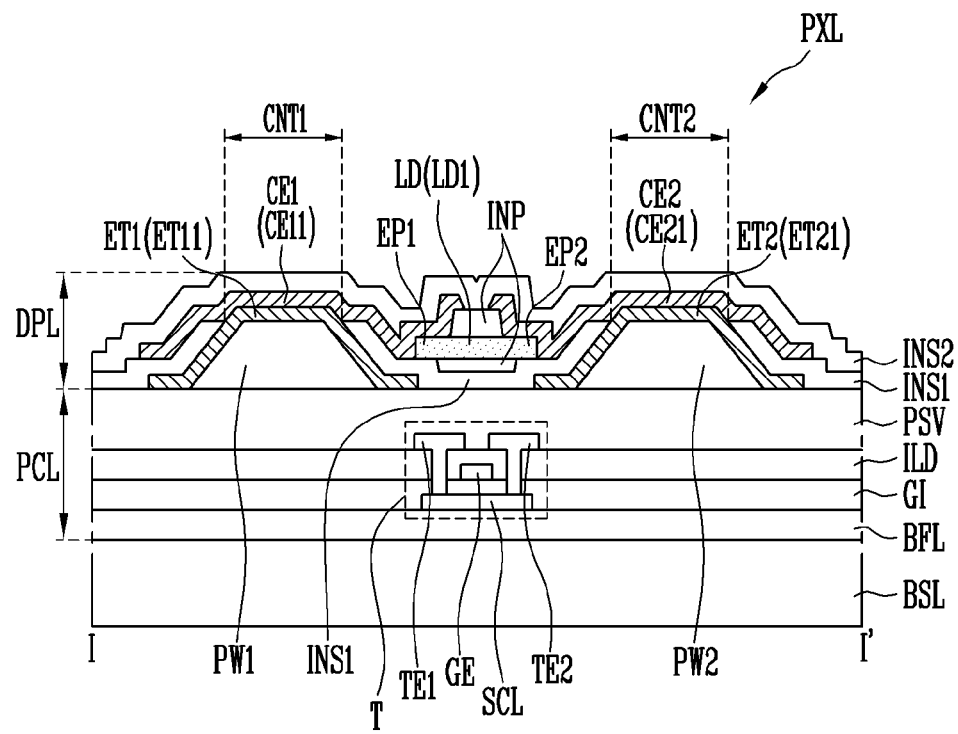
FIGS. 8 to 11 are schematic cross-sectional views each illustrating a pixel in accordance with an embodiment, and for example illustrate different embodiments of a cross-section of the pixel corresponding to line I-I' of FIG. 7.
Figure 9:
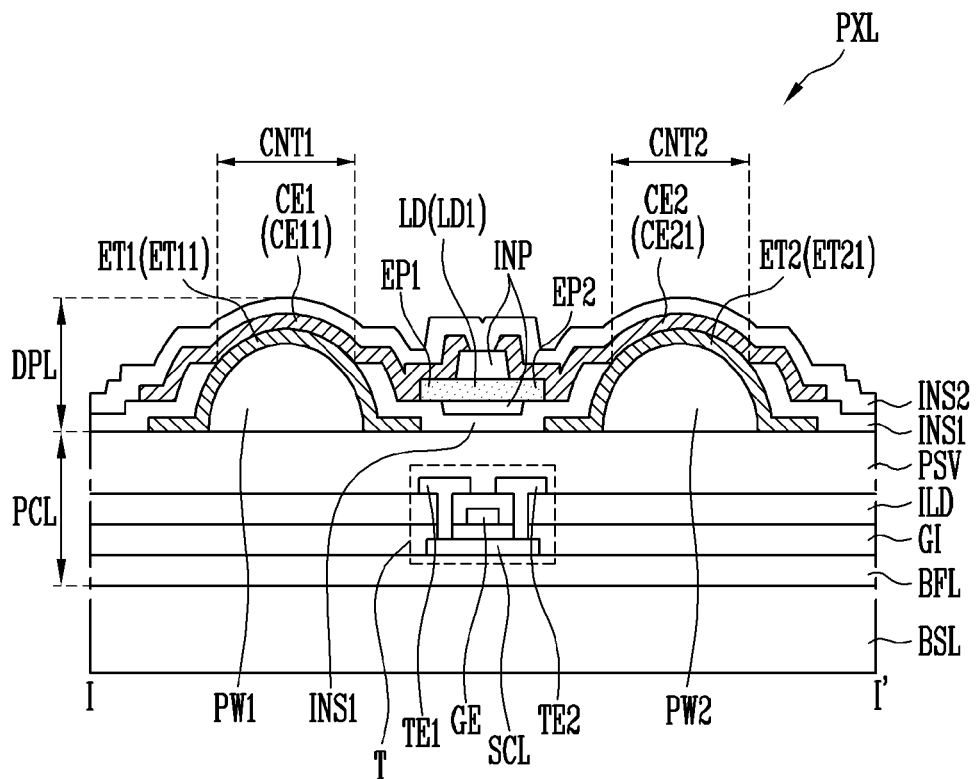

In an embodiment, each of the first and second partition walls PW1 and PW2 may have various shapes. In an embodiment, as illustrated in FIGS. 8 and 10, the first and second partition walls PW1 and PW2 may have a trapezoidal cross-section the width of which is gradually reduced upward. Each of the first and second partition walls PW1 and PW2 may have an inclined surface on at least one or a side. In an embodiment, as illustrated in FIGS. 9 and 11, the first and second partition walls PW1 and PW2 may have a semi-circular or semi-elliptical cross-section the width of which is gradually reduced upward. Each of the first and second partition walls PW1 and PW2 may have a curved surface on at least one or a side surface. At least one electrode and/or insulating layer disposed over the first and second partition walls PW1 and PW2 may have a curved surface in an area corresponding to the first and second partitions PW1 and PW2.

In other words, the shape of each of the first and second partition walls PW1 and PW2 may be changed in various ways rather than being particularly limited. In an embodiment, at least one of the first and second partition walls PW1 and PW2 may be omitted or changed in position.

Each of the first and second partition walls PW1 and PW2 may include insulating material having at least one inorganic material and/or organic material. For example, the first and second partition walls PW1 and PW2 may include at least one inorganic layer including various inorganic insulating materials such as silicon nitride ($SiN_x$) or silicon oxide ($SiO_x$). As an example, the first and second partition walls PW1 and PW2 may include at least one organic layer and/or photoresist layer containing various kinds of organic insulating materials, or may form a single- or multi-layer insulator containing organic or inorganic materials in combination. In an embodiment, the constituent materials of the first and second partition walls PW1 and PW2 may be changed in various ways.

In an embodiment, each of the first and second partition walls PW1 and PW2 may function as a reflector. For example, the first and second partition walls PW1 and PW2, along with the first and second electrodes ET1 and ET2 provided on the first and second partition walls PW1 and PW2, may function as reflectors that guide light emitted from each light emitting element LD in a desired direction, thus enhancing the light efficiency of the pixel PXL.

The first and second electrodes ET1 and ET2 may be respectively disposed over the first and second partition walls PW1 and PW2. The first and second electrodes ET1 and ET2 may be disposed at positions spaced apart from each other in each pixel area (for example, each emission area EMA).

In an embodiment, the first and second electrodes ET1 and ET2 that are respectively disposed over the first and second partition walls PW1 and PW2 may have shapes corresponding to the respective shapes of the first and second partition walls PW1 and PW2. For example, the first and second electrodes ET1 and ET2 may have inclined surfaces or curved surfaces corresponding to the first and second partition walls PW1 and PW2, respectively, and protrude in the height direction of the base layer BSL.

Each of the first and second electrodes ET1 and ET2 may include at least one conductive material. For example, each of the first and second electrodes ET1 and ET2 may include at least one material among at least one metal of various metal materials including silver (Ag), magnesium (Mg), aluminium (Al), platinum (Pt), palladium (Pd), gold (Au), nickel (Ni), neodymium (Nd), iridium (Ir), chromium (Cr), titanium (Ti), molybdenum (Mo), copper (Cu), for example, or an alloy thereof, conductive oxide such as indium tin oxide (ITO), indium zinc oxide (IZO), zinc oxide (ZnO), antimony zinc oxide (AZO), indium tin zinc oxide (ITZO), tin oxide (SnO2), and a conductive polymer such as PEDOT, but the disclosure is not limited thereto. For example, each of the first and second electrodes ET1 and ET2 may include other conductive materials such as a carbon nanotube and graphene. In other words, each of the first and second electrodes ET1 and ET2 may include at least one of various conductive materials to have conductivity, and the constituent material thereof is not particularly limited. Furthermore, each of the first and second electrodes ET1 and ET2 may have the same or similar conductive material, or at least one different conductive material.

Each of the first and second electrodes ET1 and ET2 may have a single-layer or multilayer structure. For example, each of the first and second electrodes ET1 and ET2 may include at least one reflective electrode layer. Each of the first and second electrodes ET1 and ET2 may selectively further include at least one of at least one transparent electrode layer disposed over and/or under or below the reflective electrode layer, and at least one conductive capping layer covering or overlapping an upper portion of the reflective electrode layer and/or the transparent electrode layer.

In an embodiment, the reflective electrode layer of each of the first and second electrodes ET1 and ET2 may be formed of conductive material having a uniform reflectivity. For example, the reflective electrode layer may include at least one of various metal materials including silver (Ag), magnesium (Mg), aluminium (Al), platinum (Pt), palladium (Pd), gold (Au), nickel (Ni), neodymium (Nd), iridium (Ir), chromium (Cr), titanium (T1), molybdenum (Mo), copper (Cu), for example, or an alloy thereof, but the disclosure is not limited thereto. In other words, the reflective electrode layer may be formed of various reflective conductive materials. Each of the first and second electrodes ET1 and ET2 that may include the reflective electrode layer may enable light emitted from the opposite ends of each of the light emitting elements LD, for example, the first and second ends EP1 and EP2, to travel in a direction (for example, in a frontal direction) in which an image is displayed. For example, if the first and second electrodes ET1 and ET2 respectively have inclined or curved surfaces corresponding to the shapes of the first and second partition walls PW1 and PW2 and are respectively disposed to face the first and second ends EP1 and EP2 of the light emitting elements LD, light emitted from the first and second ends EP1 and EP2 of each of the light emitting elements LD may be reflected by the first and second electrodes ET1 and ET2 and thus more reliably travel in the frontal direction of the display panel PNL (for example, in an upward direction of the base layer BSL). Thereby, the efficiency of light emitted from the light emitting elements LD may be enhanced.

Furthermore, the transparent electrode layer of each of the first and second electrodes ET1 and ET2 may be formed of various transparent conductive materials. For example, the transparent electrode layer may include ITO, IZO or ITZO, but the disclosure is not limited thereto. In an embodiment, each of the first and second electrodes ET1 and ET2 may have a triple-layer structure having a stacked structure of ITO/Ag/ITO. As such, if the first and second electrodes ET1 and ET2 each are formed of a multilayer structure including at least two or more layers, voltage drop due to signal delay (RC delay) may be minimized. Thus, a desired voltage can be effectively transmitted to the light emitting elements LD.

If each of the first and second electrodes ET1 and ET2 may include the conductive capping layer covering or overlapping the reflective electrode layer and/or the transparent electrode layer, it is possible to prevent the reflective electrode layer of the first and second electrodes ET1 and ET2 from being damaged due to defects caused during the manufacturing process of the pixel PXL. However, the conductive capping layer may be selectively included in the first and second electrodes ET1 and ET2, and may be omitted depending on embodiments. Furthermore, the conductive capping layer may be considered as a component of each of the first and second electrodes ET1 and ET2, or considered as a separate component disposed on the first and second electrodes ET1 and ET2.

The first insulating layer INS1 may be disposed on predetermined areas of the first and second electrodes ET1 and ET2. For example, the first insulating layer INS1 may be formed to cover or overlap predetermined areas of the first and second electrodes ET1 and ET2, and may include an opening to expose other predetermined areas of the first and second electrodes ET1 and ET2. For example, the first insulating layer INS1 may expose the first and second electrodes ET1 and ET2 in predetermined first and second contact portions CNT1 and CNT2. In an embodiment, the first insulating layer INS1 may be omitted. The light emitting elements LD may be disposed on or directly disposed on the passivation layer PSV and/or one end of each of the first and second electrodes ET1 and ET2.

In an embodiment, the first insulating layer INS1 may be primarily formed to cover or overlap the overall surfaces of the first and second electrodes ET1 and ET2. After the light emitting elements LD are supplied and aligned on the first insulating layer INS1, the first insulating layer INS1 may be partially opened to expose the first and second electrodes ET1 and ET2 in respective predetermined areas (for example, the respective first and second contact portions CNT1 and CNT2) on the first and second partition walls PW1 and PW2. In an embodiment, the first insulating layer INS1 may be patterned in the form of an individual pattern which is sectionally disposed under or below the light emitting elements LD after the supply and alignment of the light emitting elements LD have been completed.

In other words, the first insulating layer INS1 may be interposed between the first and second electrodes ET1 and ET2 and the light emitting elements LD, and may expose at least one area of each of the first and second electrodes ET1 and ET2. After the first and second electrodes ET1 and ET2 are formed, the first insulating layer INS1 may be formed to cover or overlap the first and second electrodes ET1 and ET2, so that it is possible to prevent the first and second electrodes ET1 and ET2 from being damaged or to prevent metal from being precipitated in a subsequent process. Furthermore, the first insulating layer INS1 may stably support each light emitting element LD.

The first insulating layer INS1 may be formed of a single layer or multiple layers, and include at least one inorganic insulating material and/or organic insulating material. For example, the first insulating layer INS1 may include various kinds of organic or inorganic insulating materials including silicon nitride ($SiN_x$), silicon oxide ($SiO_x$), aluminium oxide ($Al_2O_3$), for example, within the spirit and the scope of the disclosure. The constituent material of the first insulating layer INS1 is not particularly limited.

A plurality of light emitting elements LD may be supplied to and aligned in each pixel area, for example, the emission area EMA of each pixel PXL, in which the first insulating layer INS1 is formed. For example, a plurality of light emitting elements LD may be supplied to each emission area EMA through an inkjet method or the like, and the light emitting elements LD may be aligned with the directionality between the first and second electrodes ET1 and ET2 by predetermined alignment voltages (or alignment signals) applied to the first and second electrodes ET1 and ET2.

In an embodiment, at least some or a number of the light emitting elements LD may be disposed in the horizontal direction between a pair of first and second electrodes ET1 and ET2 such that the opposite ends (for example, the first and second ends EP1 and EP2) of each light emitting element LD with respect to the longitudinal direction thereof overlap the pair of first and second electrodes ET1 and ET2. Furthermore, in an embodiment, other some or a number of the light emitting elements LD may be disposed in a diagonal direction between the pair of first and second electrodes ET1 and ET2. In an embodiment, at least some or a number of the light emitting elements LD may be disposed between a pair of first and second electrodes ET1 and ET2 such that the at least some or a number of light emitting elements LD do not overlap the first and second electrodes ET1 and ET2, and may be electrically connected to the first and second electrodes ET1 and ET2 respectively through the first contact electrode CE1 and the second contact electrode CE2.

The insulating pattern INP may be disposed on predetermined areas of the light emitting elements LD. For example, the insulating pattern INP may expose the first and second ends EP1 and EP2 of the light emitting elements LD and be partially disposed over only the predetermined areas of the light emitting elements LD including respective central areas of the light emitting elements LD. The insulating pattern INP may be formed in an independent pattern in each emission area EMA, but the disclosure is not limited thereto. The insulating pattern INP may be omitted depending on embodiments. The opposite ends of the first and second contact electrodes CE1 and CE2 may be disposed on or directly disposed on the light emitting elements LD.

The insulating pattern INP may be formed of a single layer or multiple layers, and include at least one inorganic insulating material and/or organic insulating material. For example, the insulating pattern INP may include various kinds of organic or inorganic insulating materials including silicon nitride ($SiN_x$), silicon oxide ($SiO_x$), aluminium oxide ($Al_2O_3$), photoresist (PR) material, for example, within the spirit and the scope of the disclosure. The constituent material of the insulating pattern INP is not particularly limited.

After the alignment of the light emitting elements LD has been completed, the insulating pattern INP is formed on the light emitting elements LD so that the light emitting elements LD may be prevented from being removed from the aligned position. Furthermore, in the case where space may be present between the first insulating layer INS1 and the light emitting elements LD, the space may be filled with the insulating material drawn thereinto during a process of forming the insulating pattern INP. Consequently, the light emitting elements LD may be more stably supported.

The opposite ends of the light emitting elements LD, for example, the first and second ends EP1 and EP2, which are not covered or overlapped by the insulating pattern INP, may be respectively covered or overlapped by the first and second contact electrodes CE1 and CE2. For example, respective one ends of the first and second contact electrodes CE1 and CE2 may be disposed, at positions spaced apart from each other, on the first and second ends EP1 and EP2 of the light emitting elements LD, with the insulating pattern INP interposed therebetween.

In an embodiment, the first and second contact electrodes CE1 and CE2 may be simultaneously formed on the same layer on one or a surface of the base layer BSL, as illustrated in FIGS. 8 and 9. Hence, a process of fabricating the pixel PXL and the display device including the pixel PXL may be simplified. For example, compared to the case where the first and second contact electrodes CE1 and CE2 are formed through respective mask processes, the number of mask processes needed to form the pixel PXL may be reduced, and the first and second contact electrodes CE1 and CE2 may be more easily formed.

In an embodiment, the first and second contact electrodes CE1 and CE2 may be successively formed on different layers on one or a surface of the base layer BSL, as illustrated in FIGS. 10 and 11. An additional third insulating layer INS3 may be disposed between the first and second contact electrodes CE1 and CE2. In other words, the positions and the relative disposition relationship of the first and second contact electrodes CE1 and CE2 may be changed in various ways.

Furthermore, the first and second contact electrodes CE1 and CE2 may be disposed over the first and second electrodes ET1 and ET2 to cover or overlap exposed areas (for example, the first and second contact portions CNT1 and CNT2) of the first and second electrodes ET1 and ET2. For example, the first and second contact electrodes CE1 and CE2 may be disposed on at least predetermined areas of the first and second electrodes ET1 and ET2 to come into contact with the first and second electrodes ET1 and ET2 in the first and second contact portions CNT1 and CNT2. Hence, the first and second contact electrodes CE1 and CE2 may be respectively electrically connected to the first and second electrodes ET1 and ET2. The first and second electrodes ET1 and ET2 may be respectively electrically connected to the first and second ends EP1 and EP2 of the light emitting elements LD through the first and second contact electrodes CE1 and CE2.

In an embodiment, at least one contact electrode of the first and second contact electrodes CE1 and CE2 may be integrally or non-integrally connected to at least one contact electrode disposed in a preceding stage or a subsequent stage. For example, as illustrated in FIG. 12, each first-stage second contact electrode CE21 may be integrally connected to at least one 1-2-th stage connection electrode SCE1-2 and at least one second-stage first contact electrode CE12.

The first and second contact electrodes CE1 and CE2 may be formed of various transparent conductive materials. For example, the first and second contact electrodes CE1 and CE2 may include at least one of various transparent conductive materials including ITO, IZO, and ITZO, and may be substantially transparent or translucent to satisfy a predetermined transmittancy. Hence, light emitted from the light emitting elements LD through the first and second ends EP1 and EP2 may be emitted out of the display device through the first and second contact electrodes CE1 and CE2.

The second insulating layer INS2 may be disposed on the first and second contact electrodes CE1 and CE2. For example, the second insulating layer INS2 may be formed and/or disposed on the overall surface of the display area DA of the base layer BSL on which the first and second partition walls PW1 and PW2, the first and second electrodes ET1 and ET2, the light emitting elements LD, the insulating pattern INP, and the first and second contact electrodes CE1 and CE2 are formed, so that the second insulating layer INS2 may cover or overlap the first and second partition walls PW1 and PW2, the first and second electrodes ET1 and ET2, the light emitting elements LD, the insulating pattern INP, and the first and second contact electrodes CE1 and CE2. The second insulating layer INS2 may include at least one inorganic layer and/or organic layer.

In an embodiment, the second insulating layer INS2 may include a thin-film encapsulation layer having a multilayer structure, but the disclosure is not limited thereto. In an embodiment, at least one overcoat layer, and/or an encapsulation substrate, for example, may be further disposed over the second insulating layer INS2.

In an embodiment, the second insulating layer INS2 may be formed of a single layer or multiple layers, and include at least one inorganic insulating material and/or organic insulating material. For example, the second insulating layer INS2 may include various kinds of organic or inorganic insulating materials including silicon nitride ($SiN_x$), silicon oxide ($SiO_x$), for example, within the spirit and the scope of the disclosure The constituent material of the second insulating layer INS2 is not particularly limited.

Figure 13:
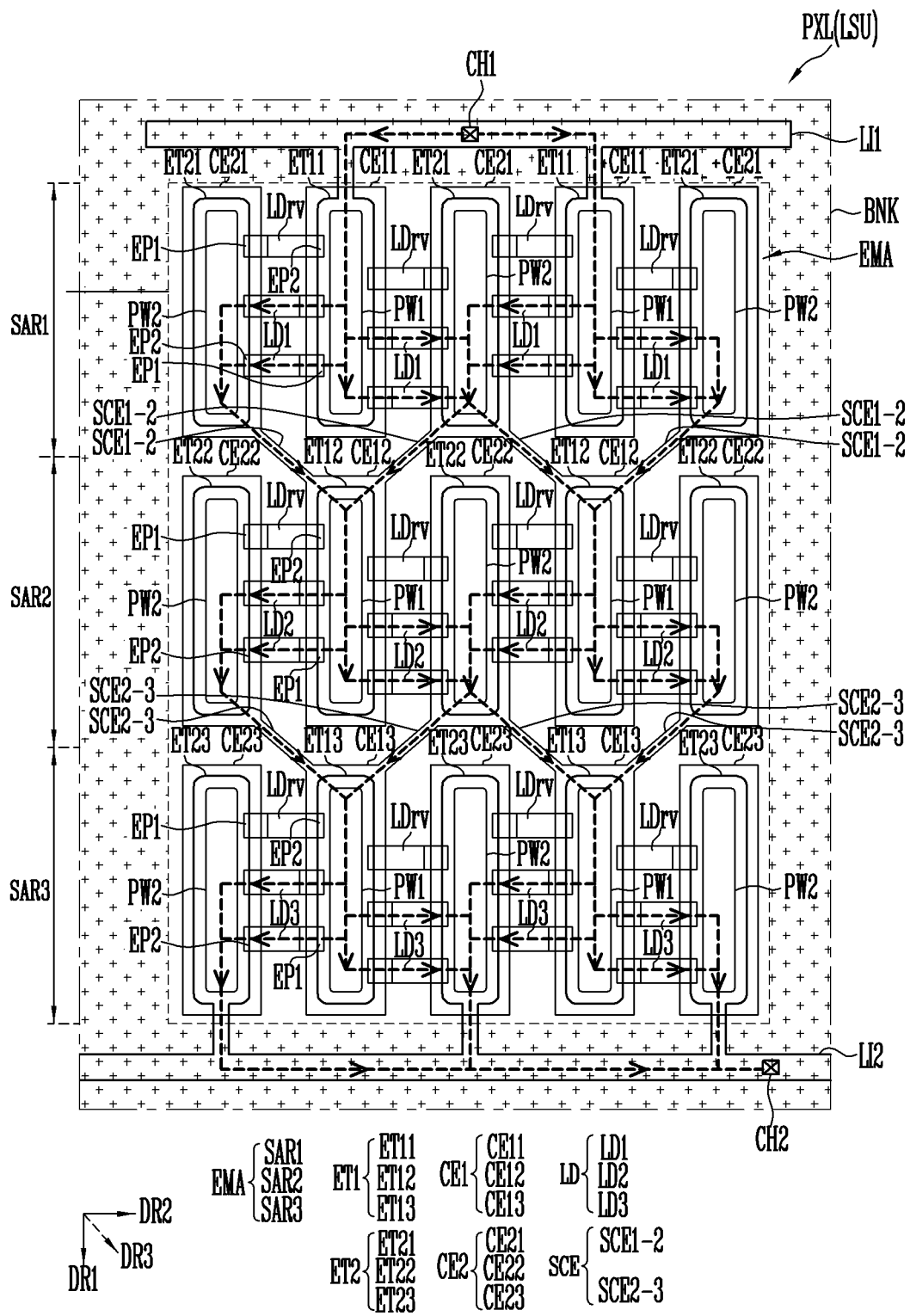
FIG. 13 is a plan diagram illustrating driving current flowing through a pixel in accordance with an embodiment, and for example illustrates the flow of driving current flowing through the pixel of FIG. 7.

FIG. 13 is a plan view illustrating driving current flowing through a pixel PXL in accordance with an embodiment, and for example illustrates the driving current flowing through the pixel PXL of FIG. 7. For example, in FIG. 13, the flow of driving current flowing through the pixel PXL of FIG. 7 in case that the pixel PXL is driven to emit light in response to a data signal having a predetermined grayscale is designated by the dotted arrows.

Referring to FIGS. 4 to 13, if driving current flows from the first power line PL1 to the second power line PL2 via the pixel PXL by the driving transistor (for example, the first transistor T1 of FIG. 5E) of each pixel PXL, the driving current may be drawn into the light source unit LSU through the first contact hole CH1. For example, driving current may be supplied to the first electrodes ET11 of the first stage through the first contact hole CH1. The driving current may flow to the second electrodes ET21 of the first stage via the first light emitting elements LD1 electrically connected in the forward direction between the first and second electrodes ET11 and ET21 of the first stage. Therefore, each of the first light emitting elements LD1 may emit light at a luminance corresponding to related distributed current.

Driving current that flows through the second electrodes ET21 of the first stage may be drawn to the first electrodes ET12 of the second stage through the 1-2-th stage connection electrodes SCE1-2. The driving current may flow to the second electrodes ET22 of the second stage via the second light emitting elements LD2 electrically connected in the forward direction between the first and second electrodes ET12 and ET22 of the second stage. Therefore, each of the second light emitting elements LD2 may emit light at a luminance corresponding to related distributed current.

Driving current that flows through the second electrodes ET22 of the second stage may be drawn to the first electrodes ET13 of the third stage through the 2-3-th stage connection electrodes SCE2-3. The driving current may flow to the second electrodes ET23 of the third stage via the third light emitting elements LD3 electrically connected in the forward direction between the first and second electrodes ET13 and ET23 of the third stage. Therefore, each of the third light emitting elements LD3 may emit light at a luminance corresponding to related distributed current.

Driving current that flows through the second electrodes ET23 of the third stage may be drawn into the second power line PL2 via the second contact hole CH2. In this way, driving current of each pixel PXL may flow successively via the first, second, and third light emitting elements LD1, LD2, and LD3. Hence, the pixel PXL may emit light at a luminance corresponding to a data signal supplied during each frame period.

FIGS. 14A to 14E are plan views sequentially illustrating a method of fabricating a display device in accordance with an embodiment, and for example illustrate an embodiment of a method of fabricating a display device including the pixel PXL of FIG. 7. FIGS. 15A to 15E are sectional views successively illustrating a method of fabricating a display device in accordance with an embodiment, and for example illustrate embodiments of a cross-section corresponding to line of FIGS. 14A to 14E, respectively. The cross-section of the connection structure of the light emitting element LD electrically connected in the forward direction between the first and second electrodes ET1 and ET2 has been disclosed in detail in the embodiments of FIGS. 8 to 12, so that in FIGS. 15A to 15E, the cross-section of a connection structure of the reverse light emitting element LDrv will be illustrated.

Figure 14A:
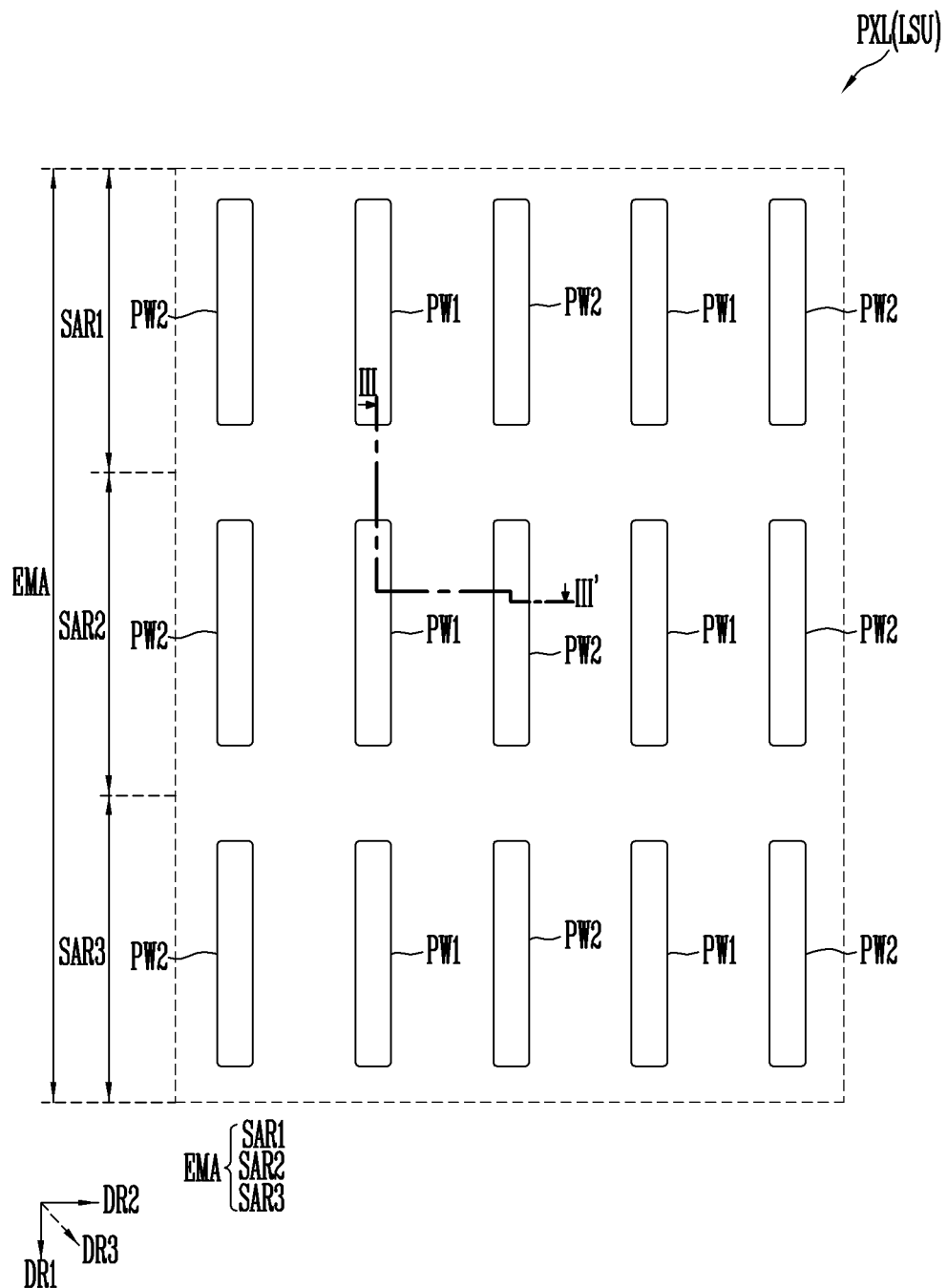
FIGS. 14A to 14E are plan views sequentially illustrating a method of fabricating a display device in accordance with an embodiment, and for example illustrate an embodiment of a method of fabricating a display device including the pixel of FIG. 7.
Figure 15A:
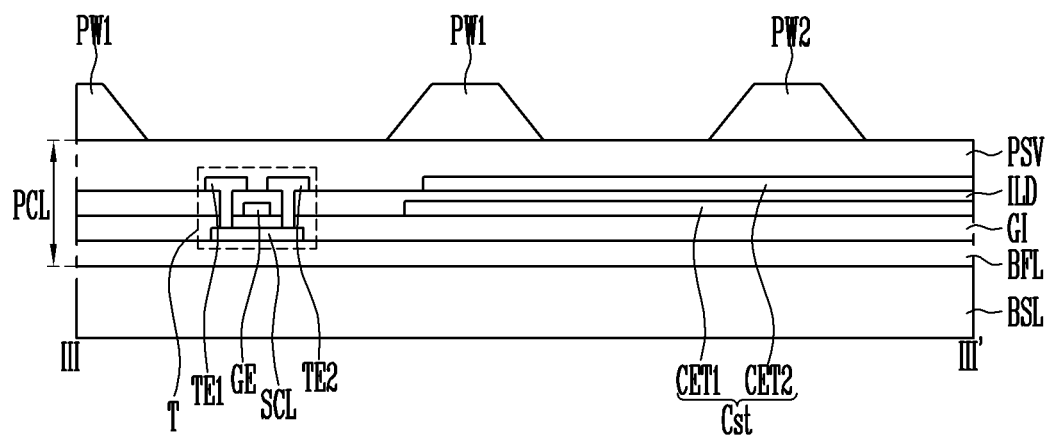
FIGS. 15A to 15E are sectional views successively illustrating a method of fabricating a display device in accordance with an embodiment, and for example illustrate an embodiment of a cross-section corresponding to line of FIGS. 14A to 14E, respectively.

Referring to FIGS. 14A and 15A, the first and second partition walls PW1 and PW2 are formed at positions spaced apart from each other in the emission area EMA of each pixel PXL. In an embodiment, the first and second partition walls PW1 and PW2 may be formed in each pixel area (for example, the emission area EMA of the corresponding pixel PXL) on the base layer BSL and/or the pixel circuit layer PCL.

In an embodiment, in the case where the emission area EMA may include a plurality of sub-areas, for example, first, second, and third sub-areas SAR1, SAR2, and SAR3, at least one pair of first and second partition walls PW1 and PW2 may be formed in each of the first, second, and third sub-areas SAR1, SAR2, and SAR3. For example, in the case where the emission area EMA is sectioned into the first, second, and third sub-areas SAR1, SAR2, and SAR3 in the first direction DR1, at least one first partition wall PW1 and at least one second partition wall PW2 may be successively or alternately arranged or disposed in the second direction DR2 in each of the first, second, and third sub-areas SAR1, SAR2, and SAR3. The first and second partition walls PW1 and PW2 may be selectively formed. In an embodiment, the step of forming the first and/or second partition walls PW1 and/or PW2 will be omitted.

In an embodiment, the first and second partition walls PW1 and PW2 may be formed through a process of forming an insulating layer including inorganic material and/or organic material and/or a patterning process (for example, a mask process), and may be formed through various types of processes. In an embodiment, the first and second partition walls PW1 and PW2 may be simultaneously formed using the same or similar material on the same layer (or the same plane) on the base layer BSL, but the disclosure is not limited thereto.

Figure 14B:
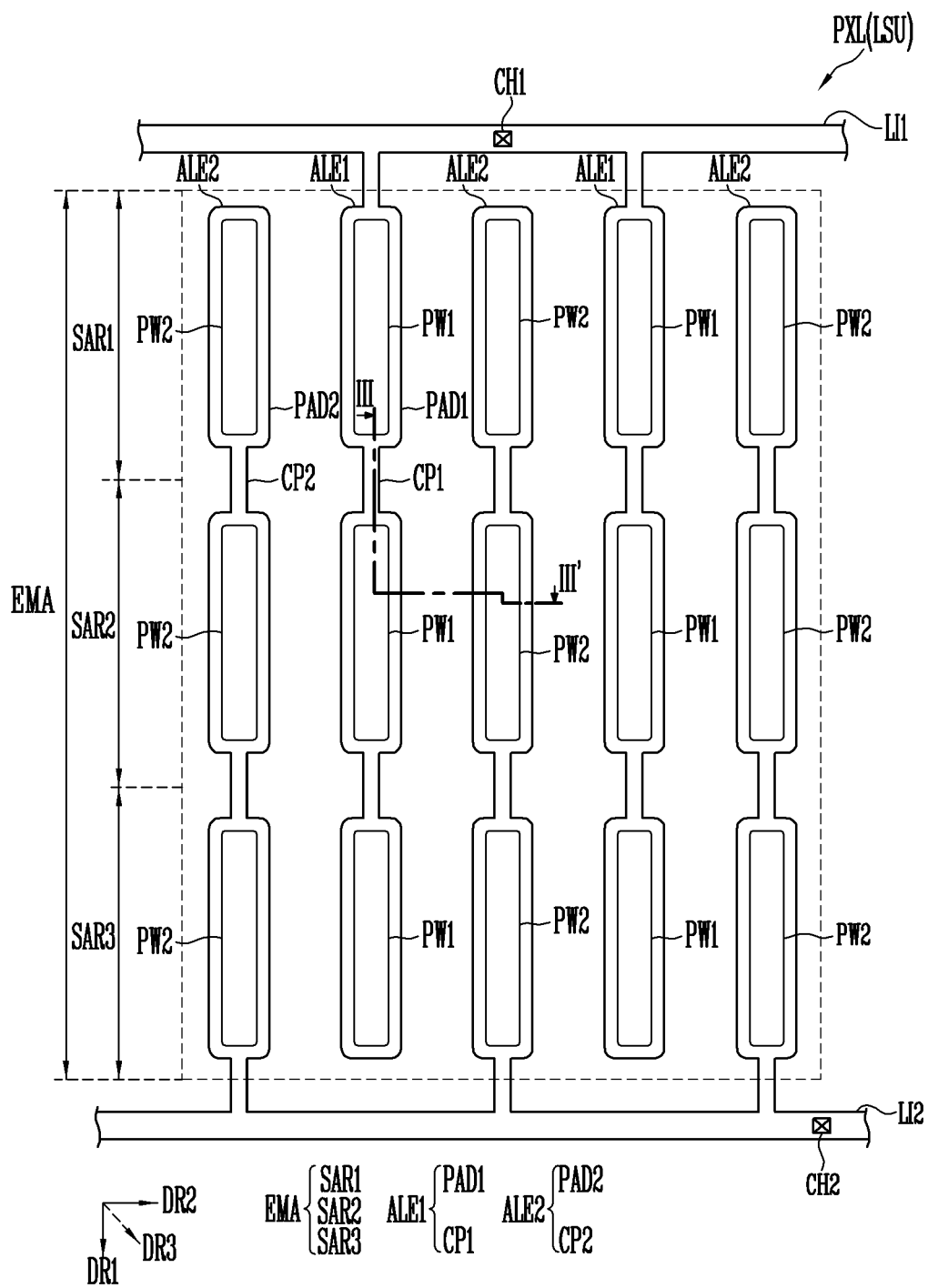
Figure 15B:
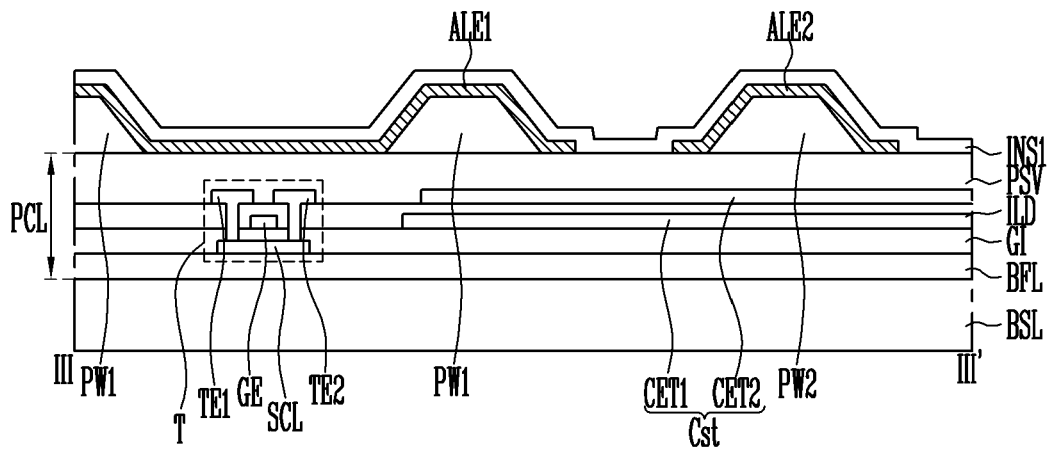

Referring to FIGS. 14B and 15B, at least one first alignment electrode ALE1 and at least one second alignment electrode ALE2 may be formed in the emission area EMA of each pixel PXL in which the first and second partition walls PW1 and PW2 are selectively formed. For example, a plurality of first alignment electrodes ALE1 and a plurality of second alignment electrodes ALE2 may be formed in the emission area EMA of each pixel PXL. In an embodiment, the first and second alignment electrodes ALE1 and ALE2 each may extend in the first direction DR1 and be spaced apart from each other with respect to the second direction DR2. For example, a plurality of first alignment electrodes ALE1 and second alignment electrodes ALE2 may be formed in each emission area EMA and disposed alternately in the second direction DR2.

In an embodiment, each first alignment electrode ALE1 may include a plurality of first pad electrodes PAD1 disposed in a line along the first direction DR1 in each emission area EMA and formed to cover or overlap each first partition wall PW1, and at least one first connector CP1 disposed between the first pad electrodes PAD1 and integrally connected to the first pad electrodes PAD1. In an embodiment, each first connector CP1 may be open during a subsequent process. Hence, each of the first pad electrodes PAD1 separated from each other may form a first electrode ET1. In an embodiment, each first connector CP1 may be formed to have a width less than that of each first pad electrode PAD1. During the subsequent process, the first connector CP1 may be more easily open or removed. However, the disclosure is not limited thereto. For example, in an embodiment, each first connector CP1 may have the same width as that of the first pad electrode PAD1.

Likewise, each second alignment electrode ALE2 may include a plurality of second pad electrodes PAD2 disposed in a line along the first direction in each emission area EMA and formed to cover or overlap each second partition wall PW2, and at least one second connector CP2 disposed between the second pad electrodes PAD2 and integrally connected to the second pad electrodes PAD2. In an embodiment, each second connector CP2 may be open during a subsequent process. Hence, each of the second pad electrodes PAD2 separated from each other may form a second electrode ET2. In an embodiment, each second connector CP2 may be formed to have a width less than that of each second pad electrode PAD2. Hence, during the subsequent process, the second connector CP2 may be more easily open or removed. However, the disclosure is not limited thereto. For example, in an embodiment, each second connector CP2 may have the same width as that of the second pad electrode PAD2.

In an embodiment, the first and second alignment electrodes ALE1 and ALE2 may be formed through a process of forming a conductive layer including at least one conductive material and/or a patterning process, and may be formed through various types of processes.

Each of the first and second alignment electrodes ALE1 and ALE2 may be formed of a single layer or multiple layers. For example, each of the first and second alignment electrodes ALE1 and ALE2 may have a multilayer structure including a reflective electrode layer, a conductive capping layer, for example, within the spirit and the scope of the disclosure The step of forming the first and second alignment electrodes ALE1 and ALE2 may include the step of forming respective reflective electrode layers on the first and second partition walls PW1 and PW2, and the step of forming respective conductive capping layers on the respective reflective electrode layers.

The first and second alignment electrodes ALE1 and ALE2 may be simultaneously formed on the same layer on the base layer BSL, but the disclosure is not limited thereto. In the case where the first and second alignment electrodes ALE1 and ALE2 are simultaneously formed, the number of mask processes to be used to fabricate the display device may be reduced or minimized.

In an embodiment, at the step of forming the first and second alignment electrodes ALE1 and ALE2, the first line LI1 electrically connected to the first alignment electrodes ALE1 and the second line LI2 electrically connected to the second alignment electrodes ALE2 may be formed together. For example, at least one first line LI1 may be formed integrally with the first alignment electrodes ALE1 such that the at least one first line LI1 may be electrically connected in common to the first alignment electrodes ALE1 disposed in a plurality of pixels PXL disposed in the display area DA. At least one second line LI2 may be formed integrally with the second alignment electrodes ALE2 such that the at least one second line LI2 may be electrically connected in common to the second alignment electrodes ALE2 disposed in the plurality of pixels PXL.

In an embodiment, after the first and second alignment electrodes ALE1 and ALE2 are formed, the first insulating layer INS1 may be formed to cover or overlap at least the first and second alignment electrodes ALE1 and ALE2. For example, after the first and second alignment electrodes ALE1 and ALE2 and the first and second lines LI1 and LI2 are formed, the first insulating layer INS1 may be formed to cover or overlap the first and second alignment electrodes ALE1 and ALE2 and the first and second lines LI1 and LI2. The first insulating layer INS1 may be selectively formed. In an embodiment, the process of forming the first insulating layer INS1 may be omitted.

In an embodiment, the first insulating layer INS1 may be formed through a deposition process of an insulating layer including inorganic insulating material and/or organic insulating material, and may be formed through various types of processes. For example, the first insulating layer INS1 may be formed through a deposition process of an insulating layer including at least one inorganic insulating material.

The first insulating layer INS1 may be formed of a single layer or multiple layers. In the case where the first insulating layer INS1 is formed of multiple layers, insulating material layers that constitute the first insulating layer INS1 may be successively formed.

Figure 14C:
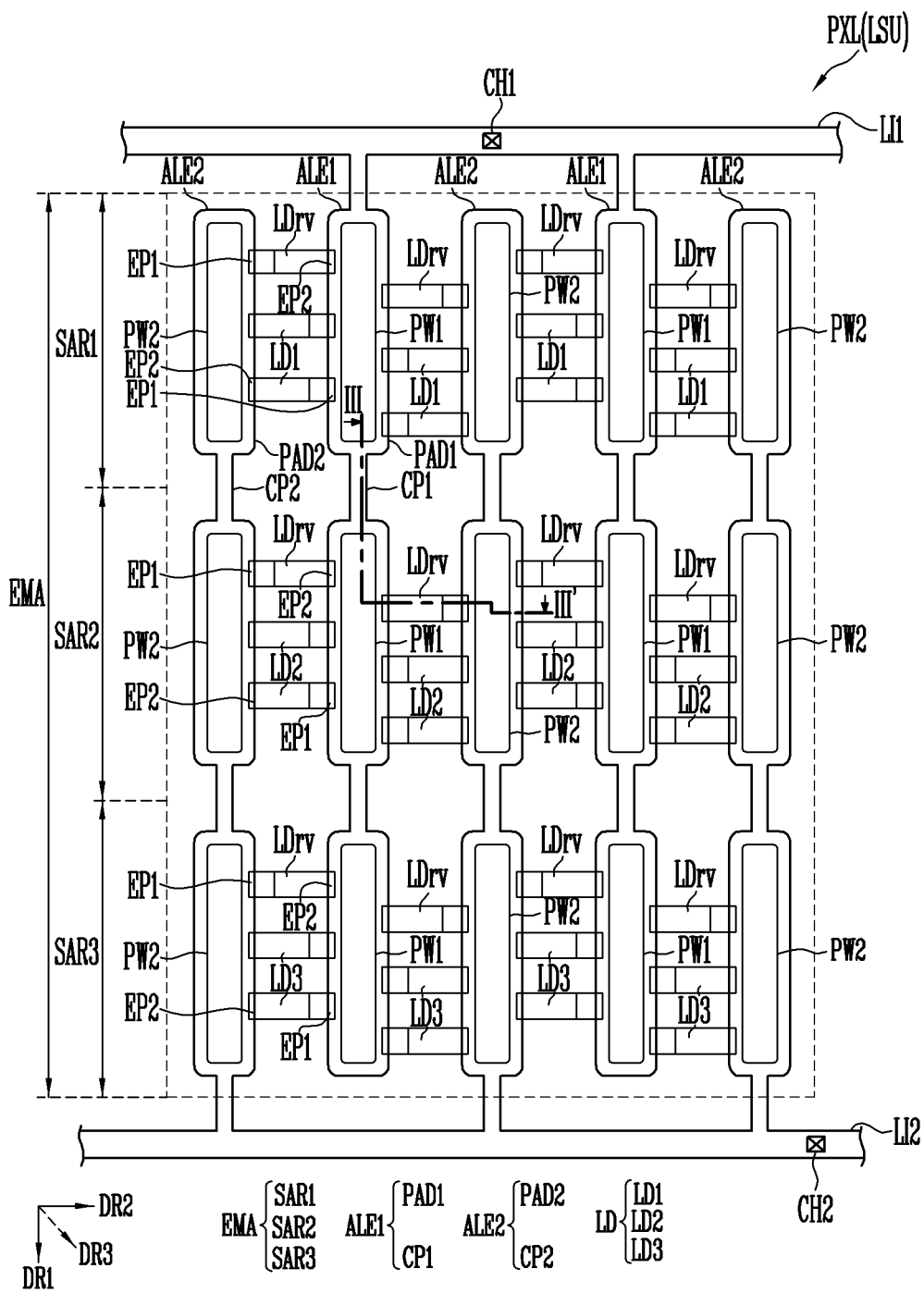
Figure 15C:
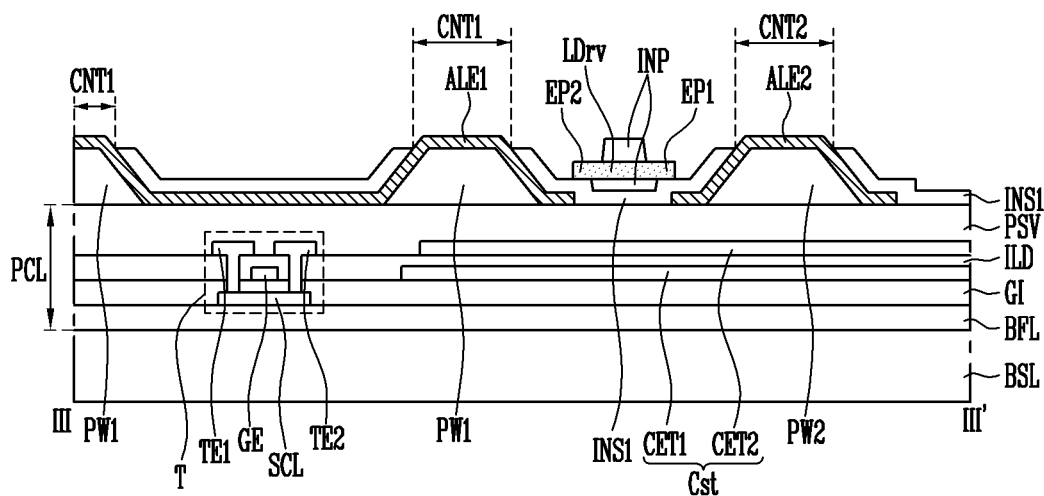

Referring to FIGS. 14C and 15C, a plurality of light emitting elements LD are supplied to each emission area EMA in which the first and second alignment electrodes ALE1 and ALE2, the first insulating layer INS1, for example, are formed. The light emitting elements LD are arranged or disposed between the first and second alignment electrodes ALE1 and ALE2. In an embodiment, the light emitting elements LD may be supplied to each emission area EMA through various schemes including an inkjet scheme. If predetermined alignment signals (or alignment voltages) are applied to the first and second alignment electrodes ALE1 and ALE2 through the first and second lines LI1 and LI2 simultaneously with the supply of the light emitting elements LD or after the supply of the light emitting elements LD, the light emitting elements LD are aligned between the first and second alignment electrodes ALE1 and ALE2. For example, the light emitting elements LD may be arranged or disposed in the forward direction between the first and second alignment electrodes ALE1 and ALE2 such that each of the first and second ends EP1 and EP2 of each light emitting element LD faces any corresponding one of the first and second alignment electrodes ALE1 and ALE2. During the foregoing process, at least one reverse light emitting element LDrv may be disposed between at least one pair of first and second alignment electrodes ALE1 and ALE2 in a direction opposite to that of the light emitting elements LD. The reverse light emitting element LDrv along with the light emitting elements LD may be supplied to each pixel area (for example, the emission area EMA of each pixel PXL) through an inkjet printing scheme or the like, and arranged or disposed in a reverse direction between the first and second alignment electrodes ALE1 and ALE2 such that the first end EP1 thereof faces any one second alignment electrode ALE2, and the second end EP2 thereof faces any one first alignment electrode ALE1.

In an embodiment, a ratio of the number of light emitting elements LD arranged or disposed in the forward direction and the number of reverse light emitting elements LDrv may be adjusted by various schemes, for example, by applying a magnetic field, or adjusting the waveforms of alignment signals to be applied at the step of aligning the light emitting elements LD. For example, the light emitting elements LD may be biased-aligned by controlling the processing conditions such that the number of light emitting elements LD arranged or disposed in the forward direction between the first and second alignment electrodes ALE1 and ALE2 is approximately two or more times as many as the number of reverse light emitting elements LDrv. The number of light emitting elements LD arranged or disposed in the forward direction between the first and second alignment electrodes ALE1 and ALE2 and to be used as valid light sources may be increased, so that the light emitting elements LD may be more efficiently used.

In an embodiment, after the light emitting elements LD are aligned between the alignment electrodes ALE1 and ALE2, the insulating pattern INP may be formed on the light emitting elements LD and/or the reverse light emitting elements LDrv. The insulating pattern INP may be selectively formed. In an embodiment, the process of forming the insulating pattern INP may be omitted.

Furthermore, the first insulating layer INS1 may be etched through a process of patterning the insulating material layer for forming the insulating pattern INP or an etching process that is executed before or after the patterning process, so that one area of each of the first and second alignment electrodes ALE1 and ALE2 is exposed. For example, the first insulating layer INS1 may be etched such that the first and second alignment electrodes ALE1 and ALE2 are exposed in areas corresponding to the predetermined first and second contact portions CNT1 and CNT2.

Figure 14D:
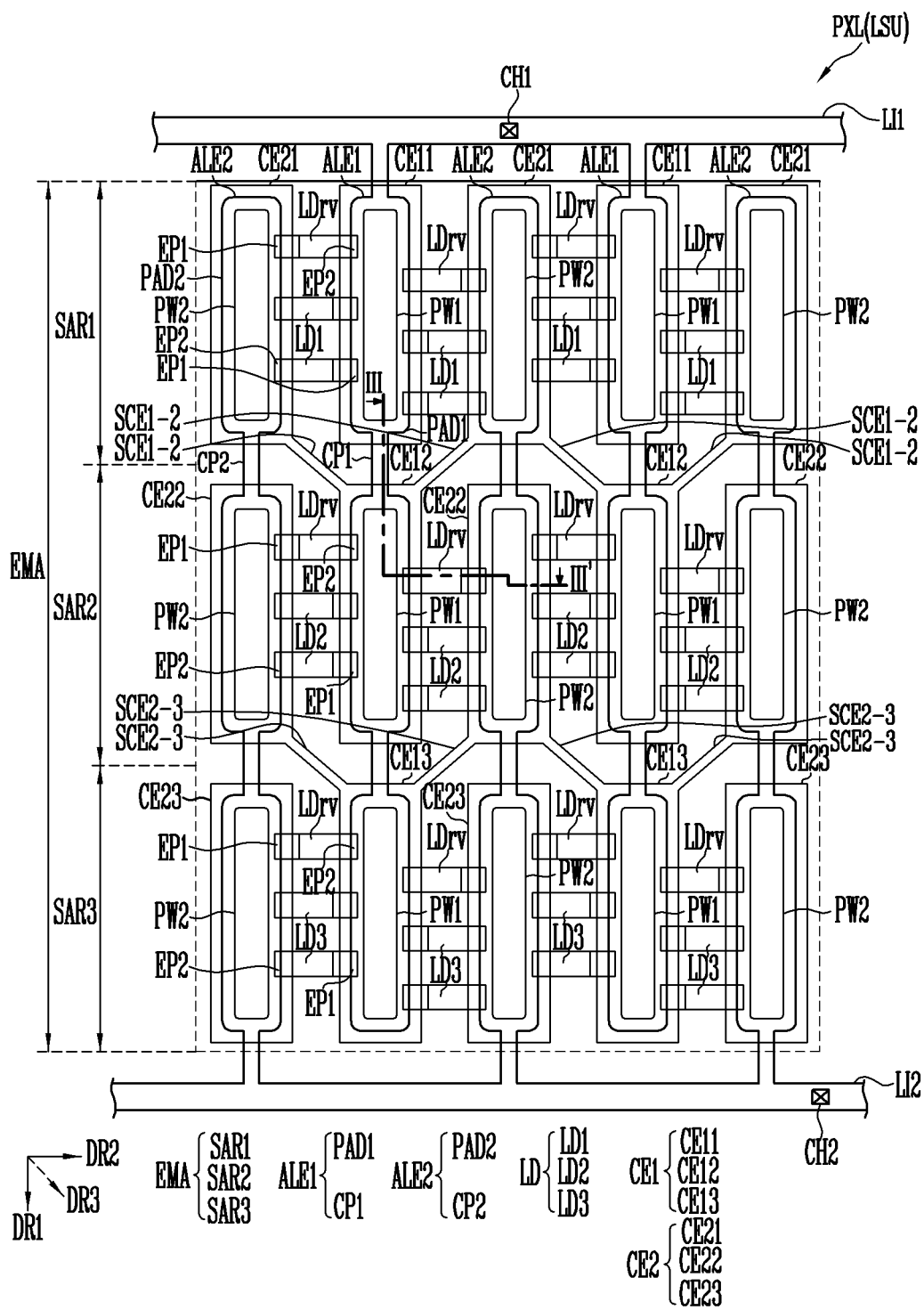
Figure 15D:
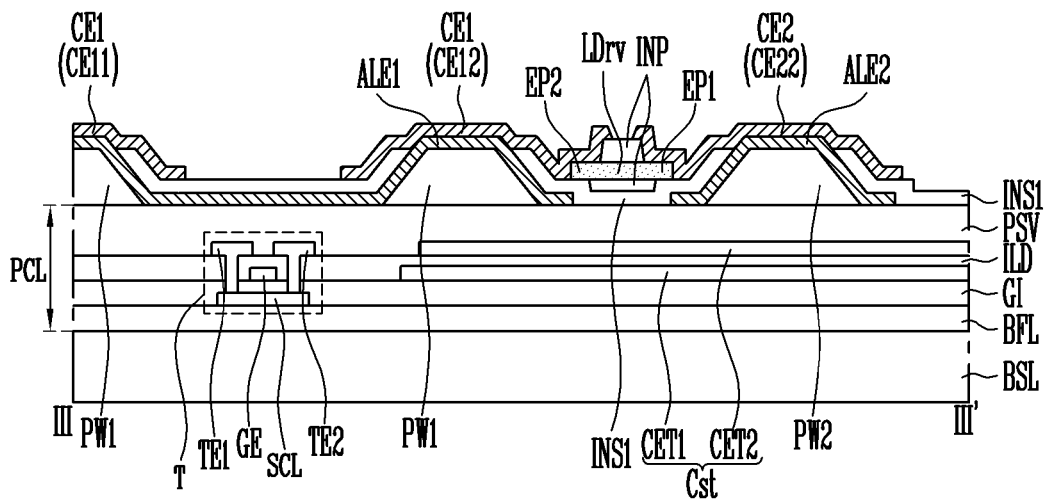

Referring to FIGS. 14D and 15D, the first and second contact electrodes CE1 and CE2 are formed in each emission area EMA in which the light emitting elements LD and/or at least one reverse light emitting element LDrv is arranged or disposed. Thereby, the light emitting elements LD and/or at least one reverse light emitting element LDrv may be electrically connected between the first and second alignment electrodes ALE1 and ALE2.

In an embodiment, in each emission area EMA, a plurality of first contact electrodes CE1 may be formed on different predetermined areas of each first alignment electrode ALE1 in the first direction DR1. For example, the first contact electrodes CE11, CE12, and CE13 of the first stage, the second stage, and the third stage may be formed both on the first pad electrodes PAD1 successively disposed in the first, second, and third sub-areas SAR1, SAR2, and SAR3 in the first direction DR1, and on the first ends EP1 of the light emitting elements LD adjacent to the first pad electrodes PAD1. Hence, the first ends EP1 of the light emitting elements LD may be electrically connected to the adjacent first alignment electrode ALE1 through the first contact electrodes CE1. Furthermore, during the foregoing process, the second end EP2 of the at least one reverse light emitting element LDrv may be electrically connected to the adjacent first alignment electrode ALE1.

Likewise, in each emission area EMA, a plurality of second contact electrodes CE2 may be formed on different predetermined areas of each second alignment electrode ALE2 in the first direction DR1. For example, the second contact electrodes CE21, CE22, and CE23 of the first stage, the second stage, and the third stage may be formed both on the second pad electrodes PAD2 successively disposed in the first, second, and third sub-areas SAR1, SAR2, and SAR3 in the first direction DR1, and on the second ends EP2 of the light emitting elements LD adjacent to the second pad electrodes PAD2. Hence, the second ends EP2 of the light emitting elements LD may be electrically connected to the adjacent second alignment electrode ALE2 through the second contact electrodes CE2. Furthermore, during the foregoing process, the first end EP1 of the at least one reverse light emitting element LDrv may be electrically connected to the adjacent second alignment electrode ALE2.

In an embodiment, the first and second contact electrodes CE1 and CE2 may be simultaneously formed at the same processing step. For example, the first and second contact electrodes CE1 and CE2 may be simultaneously formed by applying transparent conductive material onto the base layer BSL on which the light emitting elements LD, for example, are arranged or disposed, and patterning the conductive layer.

In an embodiment, at the step of forming the first and second contact electrodes CE1 and CE2, at least one connection electrode SCE may also be formed to cross-connect the first and second contact electrodes CE1 and CE2 that are disposed in two successive stages (for example, two successive serial stages) of the emission area EMA in the first direction DR1. For example, during a process of patterning the first and second contact electrodes CE1 and CE2, at least one connection electrode SCE that electrically connects the second contact electrode CE2 disposed in any one stage of the emission area EMA to at least one first contact electrode CE1 disposed in a subsequent stage may be formed integrally with the second contact electrode CE2 of the any one stage and the first contact electrode CE1 of the subsequent stage. For example, at least one 1-2-th stage connection electrode SCE1-2 that electrically connects each first-stage second contact electrode CE21 to at least one second-stage first contact electrode CE12 in the boundary area of the first and second sub-areas SAR1 and SAR2, and at least one 2-3-th stage connection electrode SCE2-3 that electrically connects each second-stage second contact electrode CE22 to at least one third-stage first contact electrode CE13 in the boundary area of the second and third sub-areas SAR2 and SAR3 may be formed.

Figure 14E:
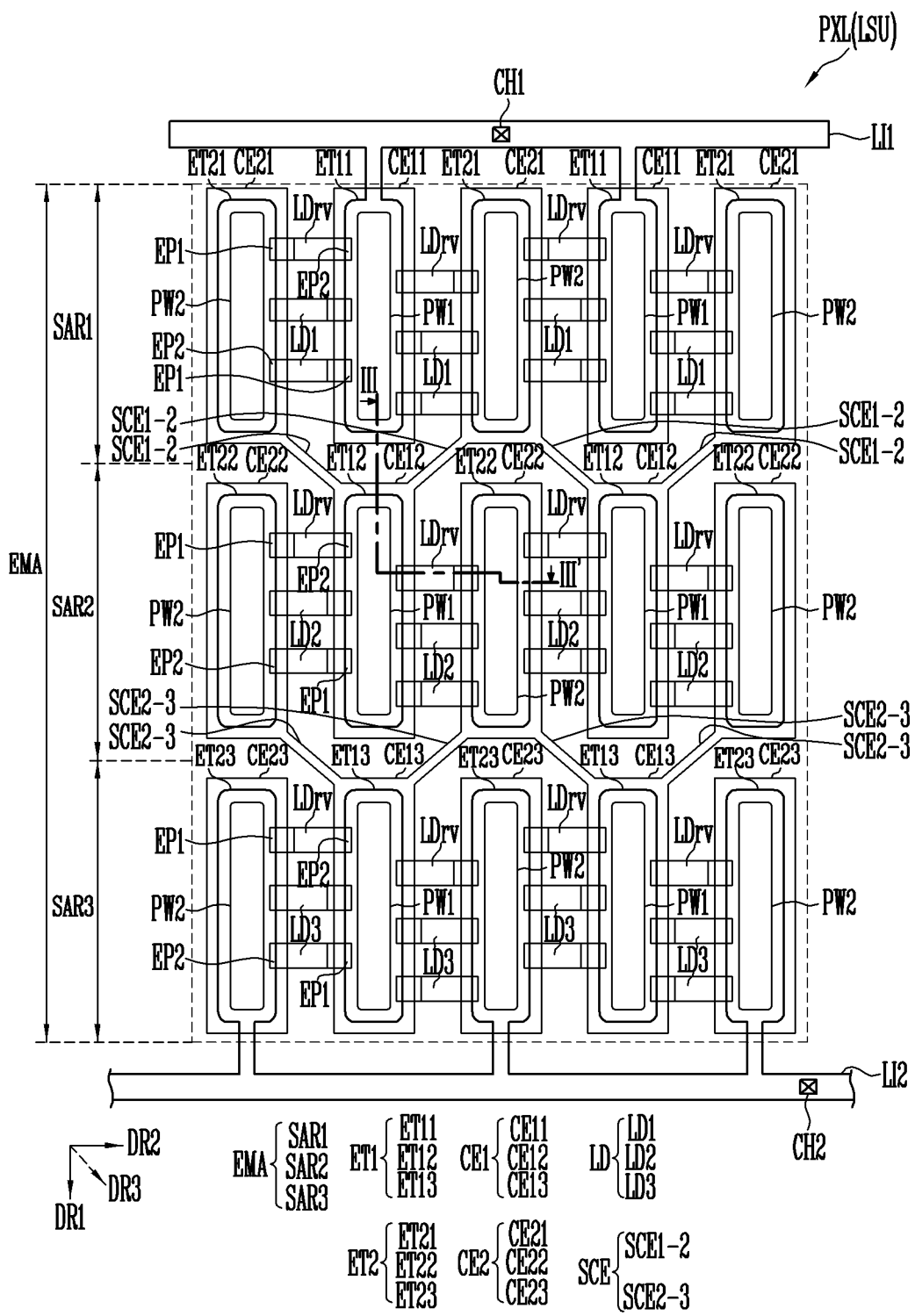
Figure 15E:
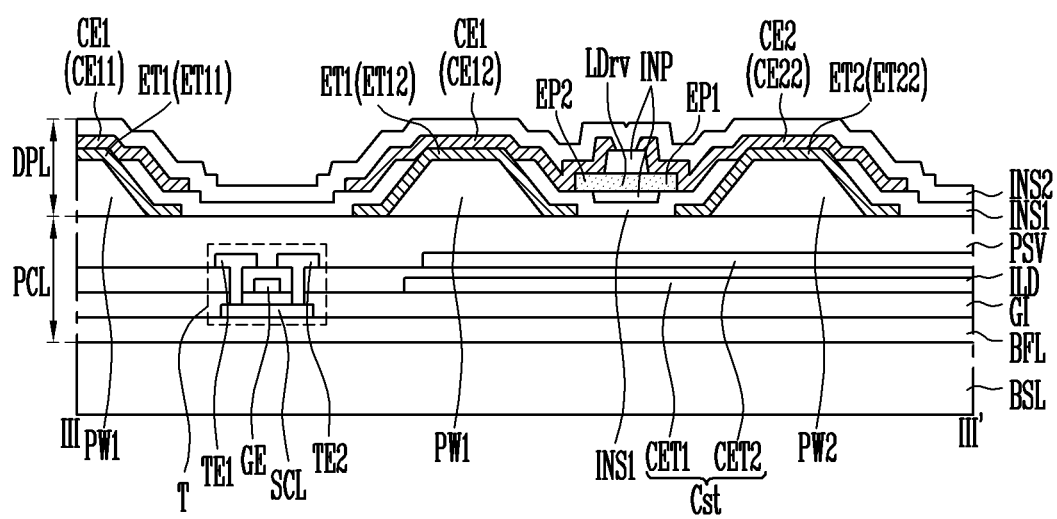

Referring to FIGS. 14E and 15E, the first and second alignment electrodes ALE1 and ALE2 may be respectively divided into a plurality of first electrodes ET1 and a plurality of second electrodes ET2 in each emission area EMA in which the first and second contact electrodes CE1 and CE2 are formed. For example, as the first and second connectors CP1 and CP2 of the first and second alignment electrodes ALE1 and ALE2 are open or removed using a laser cut scheme or the like of disconnecting a predetermined conductive pattern, line, or the like by applying a laser beam, each first alignment electrode ALE1 may be divided into a plurality of first electrodes ET1 and each second alignment electrode ALE2 may be divided into a plurality of second electrodes ET2.

Furthermore, during a process of forming the first and second electrodes ET1 and ET2 by dividing the first and second alignment electrodes ALE1 and ALE2, the first line LI1 that has been electrically connected between the pixel PXL may be open, so that the first line LI1 may be individually separated by respective pixels PXL. Hence, the pixels PXL may be individually driven.

The second insulating layer INS2 may be formed over the first and second contact electrodes CE1 and CE2. In an embodiment, the second insulating layer INS2 may be formed to cover or overlap the overall surface of the display area DA before or after the first and second alignment electrodes ALE1 and ALE2 are divided into the first and second electrodes ET1 and ET2.

The method of fabricating the display device in accordance with an embodiment may further include the step of checking whether the light emitting elements LD is defective, and repairing a defective pixel PXL when needed. This will be described in detail later herein.

Figure 16A:
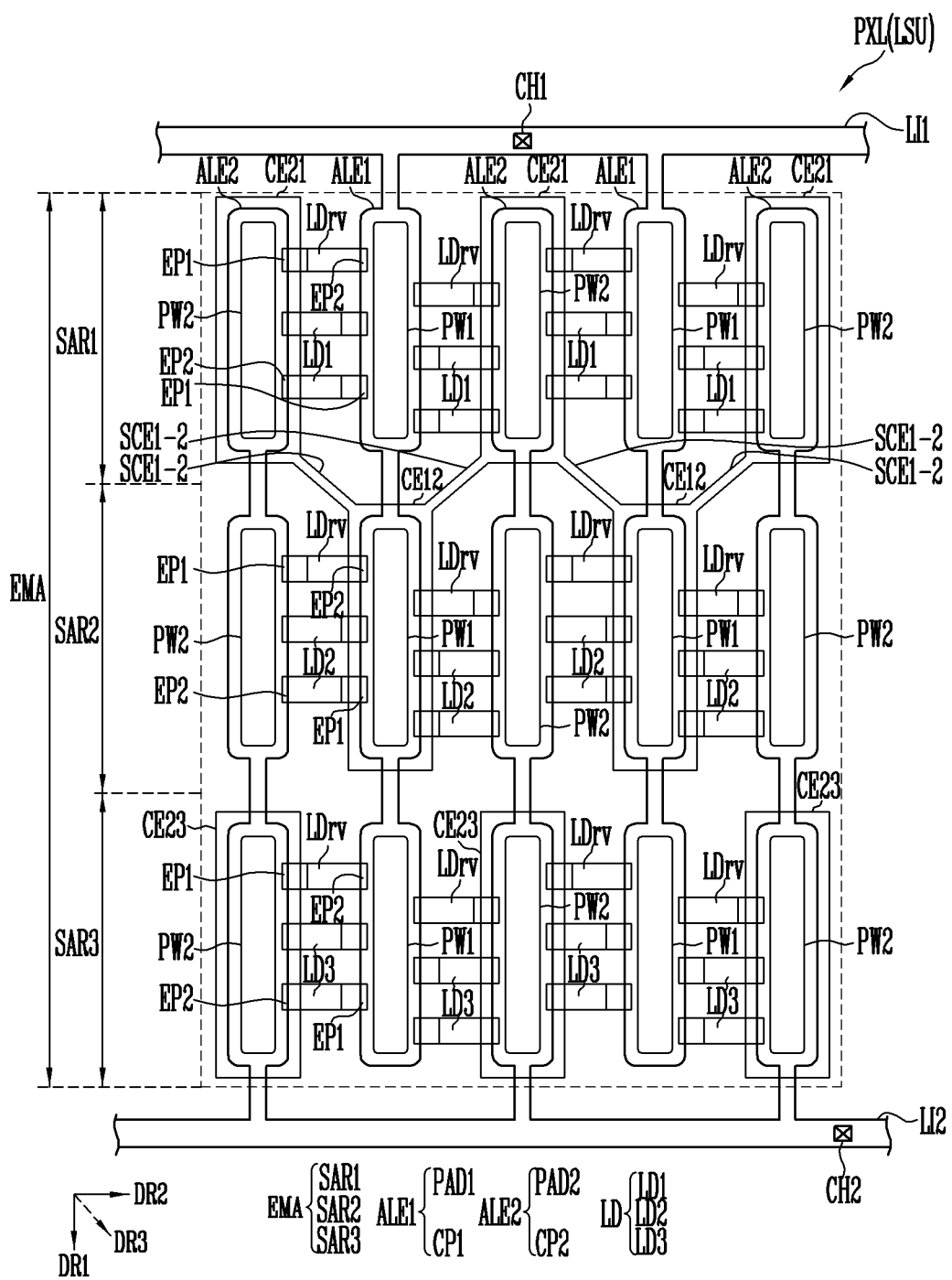
FIGS. 16A and 16B are plan views illustrating a method of fabricating a display device in accordance with an embodiment, and for example illustrate an embodiment pertaining to a method of forming first and second contact electrodes.
Figure 16B:
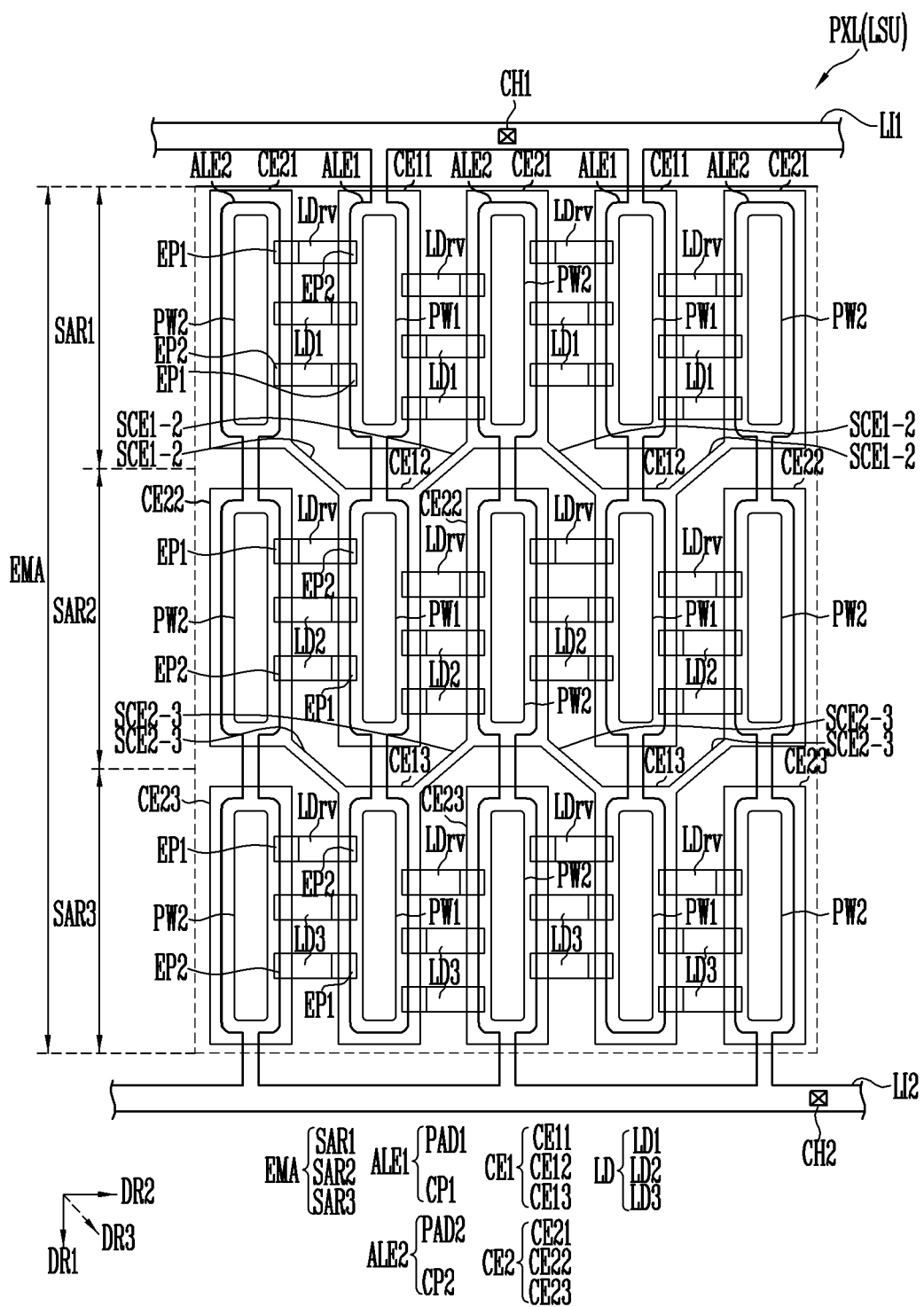

FIGS. 16A and 16B are plan views illustrating a method of fabricating a display device in accordance with an embodiment, and for example illustrate an embodiment pertaining to a method of forming first and second contact electrodes CE1 and CE2. In the following description of the method of fabricating the display device in accordance with an embodiment of FIGS. 16A and 16B, detailed descriptions of configurations similar or identical with that of the embodiments of FIGS. 14A to 15E will be omitted.

Referring to FIGS. 16A and 16B, the first and second contact electrodes CE1 and CE2 may be divided into a plurality of groups to be successively formed. In other words, in an embodiment, some or a number of contact electrodes of the first and second contact electrodes CE1 and CE2 disposed in each emission area EMA and some other or a number of contact electrodes may be successively formed. For example, after at least one second contact electrode CE2 disposed in an odd-numbered stage of the emission area EMA and at least one first contact electrode CE1 disposed in an even-numbered stage of the emission area EMA are formed, at least one first contact electrode CE1 disposed in the odd-numbered stage of the emission area EMA and at least one second contact electrode CE2 disposed in the even-numbered stage of the emission area EMA may be formed.

For example, at least one second-stage first contact electrode CE12 may be formed in the second sub-area SAR2 simultaneously with forming at least one first-stage second contact electrode CE21 and at least one third-stage second contact electrode CE23 in the first and third sub-areas SAR1 and SAR3. In an embodiment, at least one first-stage second contact electrode CE21 and at least one second-stage first contact electrode CE12 may be integrally formed.

Thereafter, at least one second-stage second contact electrode CE22 may be formed in the second sub-area SAR2 simultaneously with forming at least one first-stage first contact electrode CE11 and at least one third-stage first contact electrode CE13 in the first and third sub-areas SAR1 and SAR3. In an embodiment, at least one second-stage second contact electrode CE22 and at least one third-stage first contact electrode CE13 may be integrally formed. In other words, the first and second contact electrodes CE1 and CE2 may be simultaneously or successively formed, and the method of forming the first and second contact electrodes CE1 and CE2 may be changed in various ways.

FIGS. 17 to 20 are plan views each illustrating a pixel PXL in accordance with an embodiment, and for example illustrate different embodiments pertaining to the pixel PXL in which a defect has been repaired. In an embodiment, FIGS. 17 to 20 each illustrate a repaired pixel PXL according to each embodiment on the assumption that driving defects attributable to defective light emitting elements LDd have occurred at various positions in the pixel PXL according to the embodiment of FIG. 7.

Figure 17:
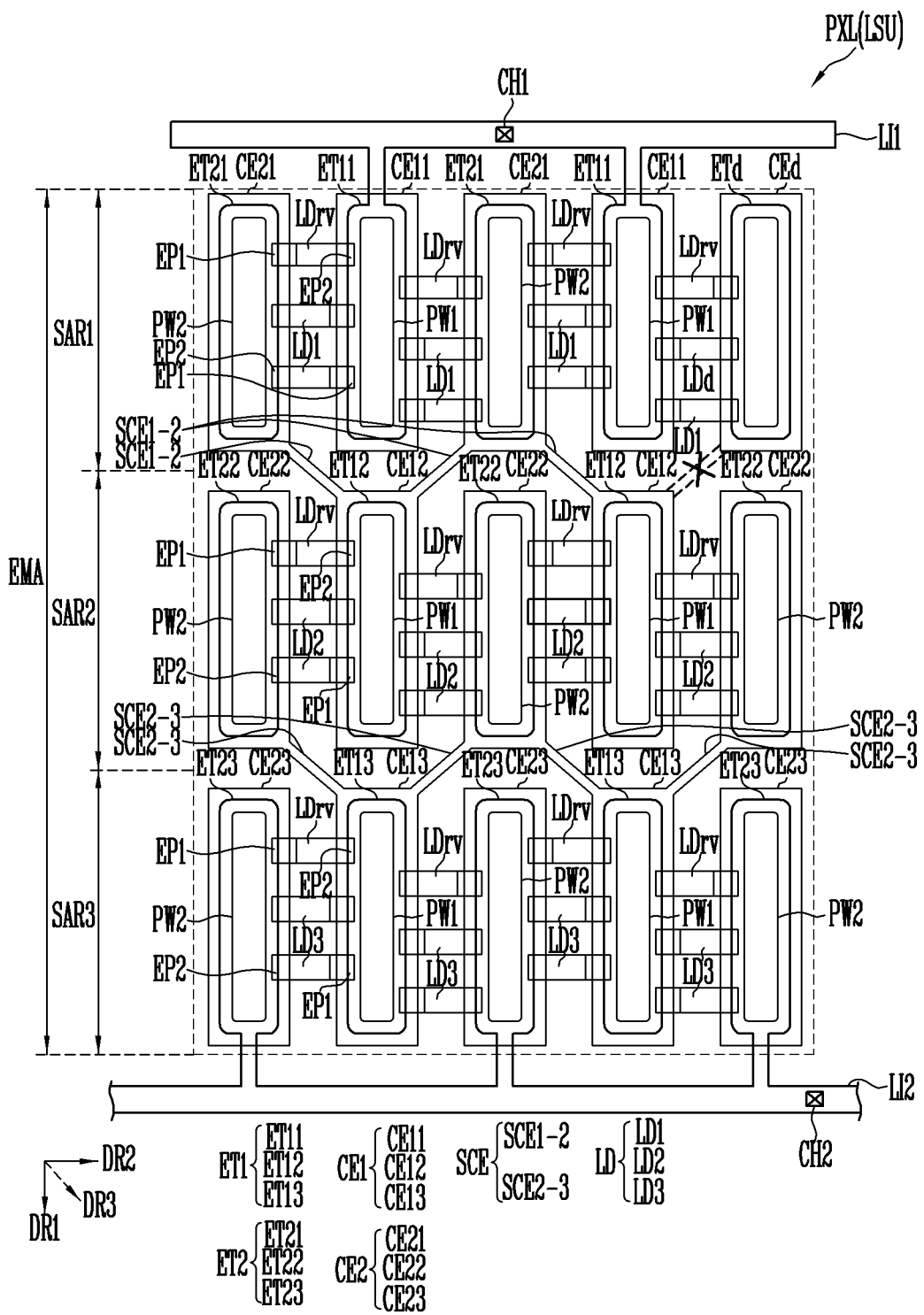
FIGS. 17 to 20 are plan views each illustrating a pixel in accordance with an embodiment, and for example illustrate different embodiments pertaining to the pixel in which a defect has been repaired.
Figure 18:
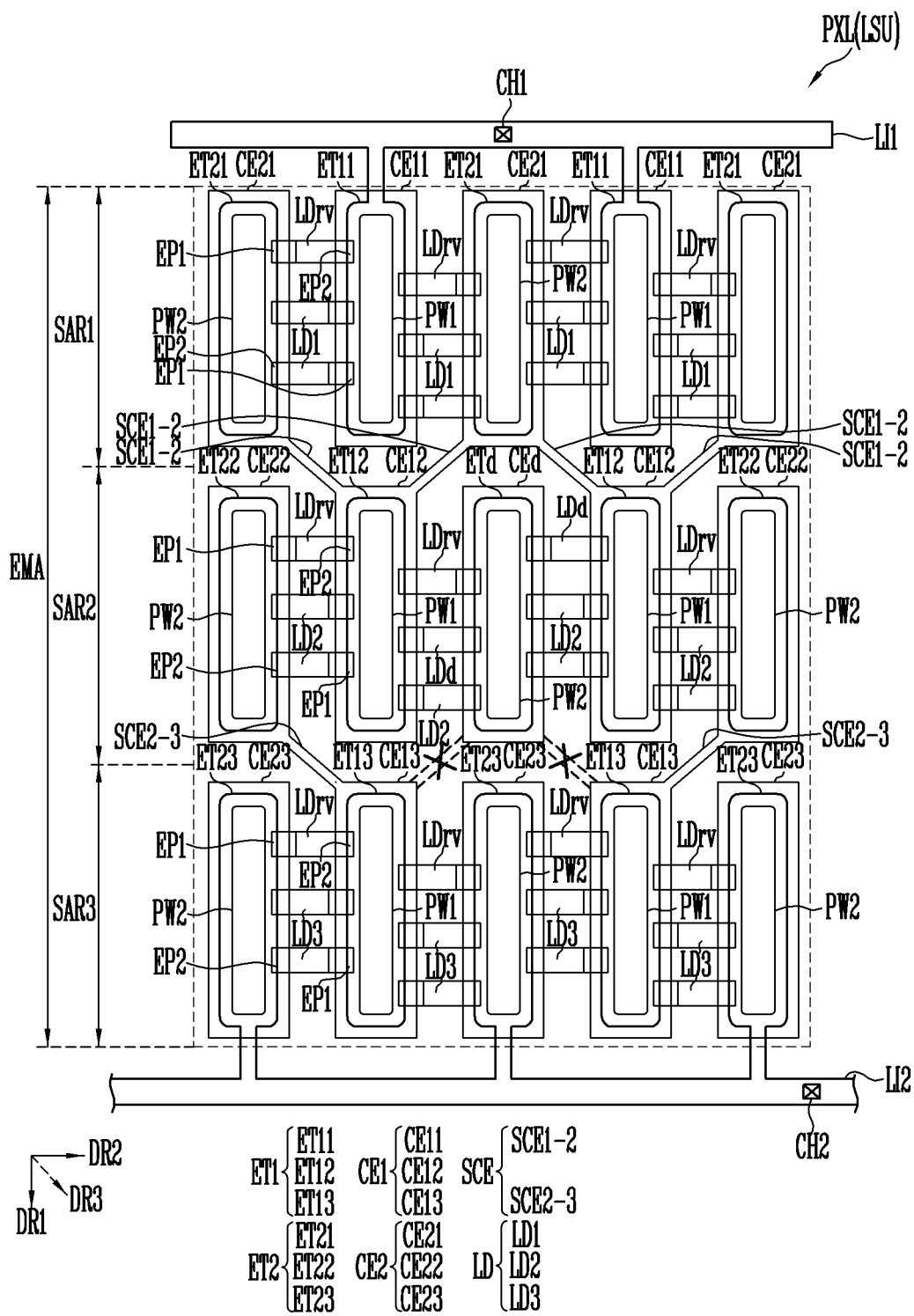

Referring to FIGS. 17 and 18, in the case where there has occurred a short-circuit defect in which the first end EP1 and the second end EP2 are short-circuited in at least one light emitting element (hereinafter, referred to as "defective light emitting element LDd") electrically connected in the forward direction between the first and second electrodes ET1 and ET2, most driving current flows through the defective light emitting element LDd in at least the corresponding serial stage, whereby the pixel PXL may not express a desired luminance. In an embodiment, at least one of the first and second contact electrodes CE1 and CE2 electrically connected or directly electrically connected to the defective light emitting element LDd may be separated (or isolated) from the other one of the first and second contact electrodes CE1 and CE2 to allow the defect of the pixel PXL to be repaired.

In an embodiment, as illustrated in FIG. 17, in the case where there is an electrode having an individual pattern shape among the first and second electrodes ET1 and ET2 electrically connected to the first and second ends EP1 and EP2 of the defective light emitting element LDd, the corresponding contact electrode electrically connected to the electrode having the individual pattern may be separated from the other contact electrodes. For example, in the case where the first-stage first electrode ET11 electrically connected to the defective light emitting element LDd disposed in the first stage may be electrically connected to the first line LI1, and a second electrode ETd of the first stage electrically connected to the defective light emitting element LDd has an individual pattern shape, the connection electrode SCE for electrically connecting the second electrode ETd of the first stage to the first contact electrode CE12 of the second stage may be open by a laser cut scheme or the like within the spirit and the scope of the disclosure. Hence, the second electrode ETd and the second contact electrode CEd may be electrically isolated so that current cannot flow through the second electrode ETd and the second contact electrode CEd that may be electrically connected to the defective light emitting element LDd. The driving current flows through the light emitting elements LD that may be electrically connected between the other first and second electrodes ET11 and ET21 of the corresponding serial stage (for example, the first stage), so that the pixel PXL can express a desired luminance.

In an embodiment, as illustrated in FIG. 18, in the case where at least two defective light emitting elements LDd may be electrically connected in common to either first or second electrodes ETd and any one corresponding contact electrode CEd, the any one contact electrode CEd may be separated from the other first and second contact electrodes CE1 and CE2. For example, as the connection electrode SCE that electrically connects the any one contact electrode CEd to the first or second contact electrode CE1 or CE2 of a preceding stage or a subsequent stage is open, the first or second electrode ETd and the contact electrode CEd electrically connected to the defective light emitting elements LDd may be electrically isolated. Therefore, the defect of the pixel PXL may be repaired.

The method of fabricating the display device including the pixel PXL in accordance with the foregoing embodiments may include the step of checking whether the light emitting elements LD arranged or disposed in each pixel PXL have been short-circuited. Furthermore, the method of fabricating the display device may further include, in case that it is determined that at least one of the light emitting elements LD is a defective light emitting element LDd, the step of opening the connection electrode SCE that electrically connects the first or second contact electrode CEd electrically connected to the defective light emitting element LDd to the first or second contact electrode CE1 or CE2 of another serial stage (for example, a preceding stage or a subsequent stage).

Figure 19:
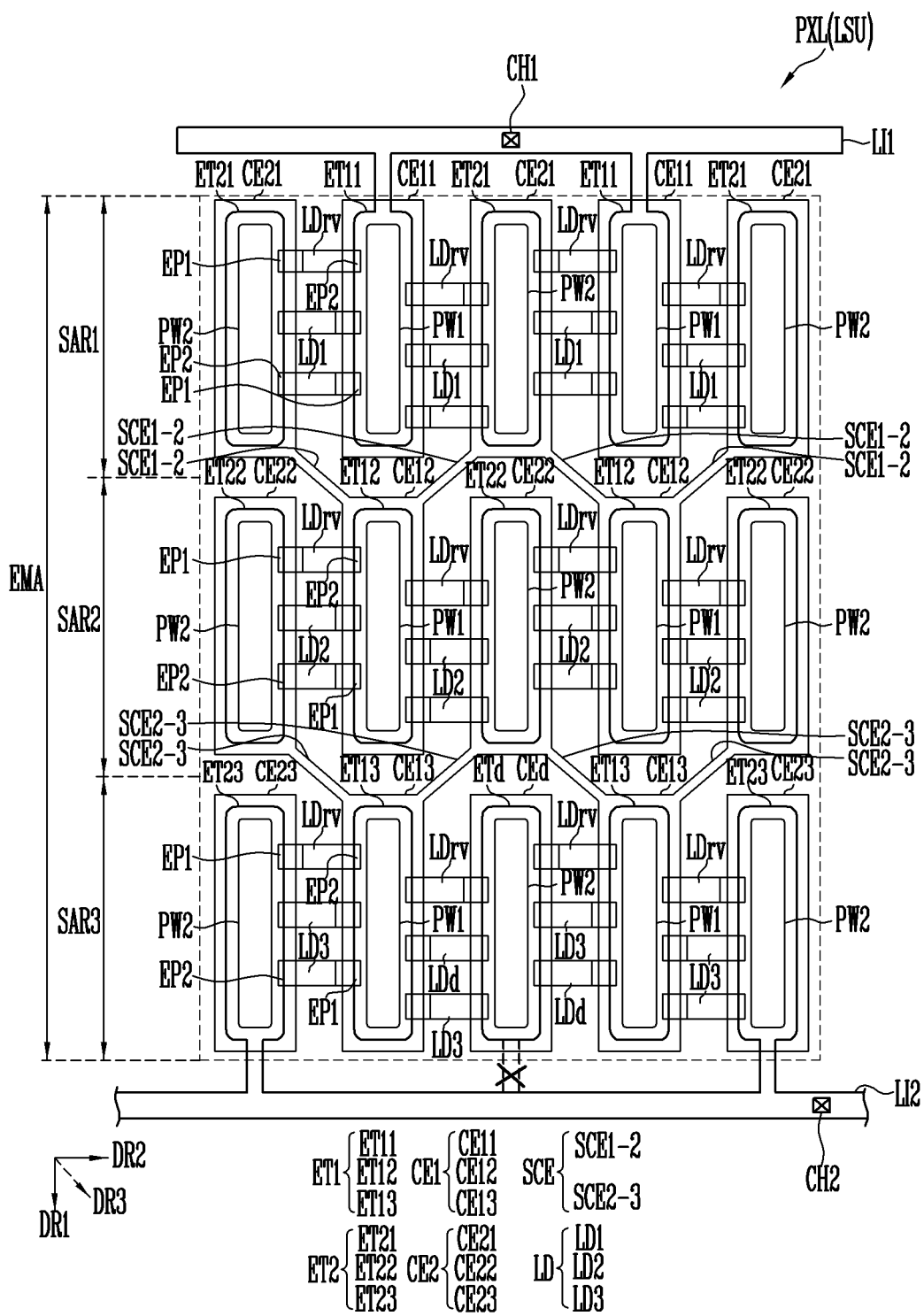
Figure 20:
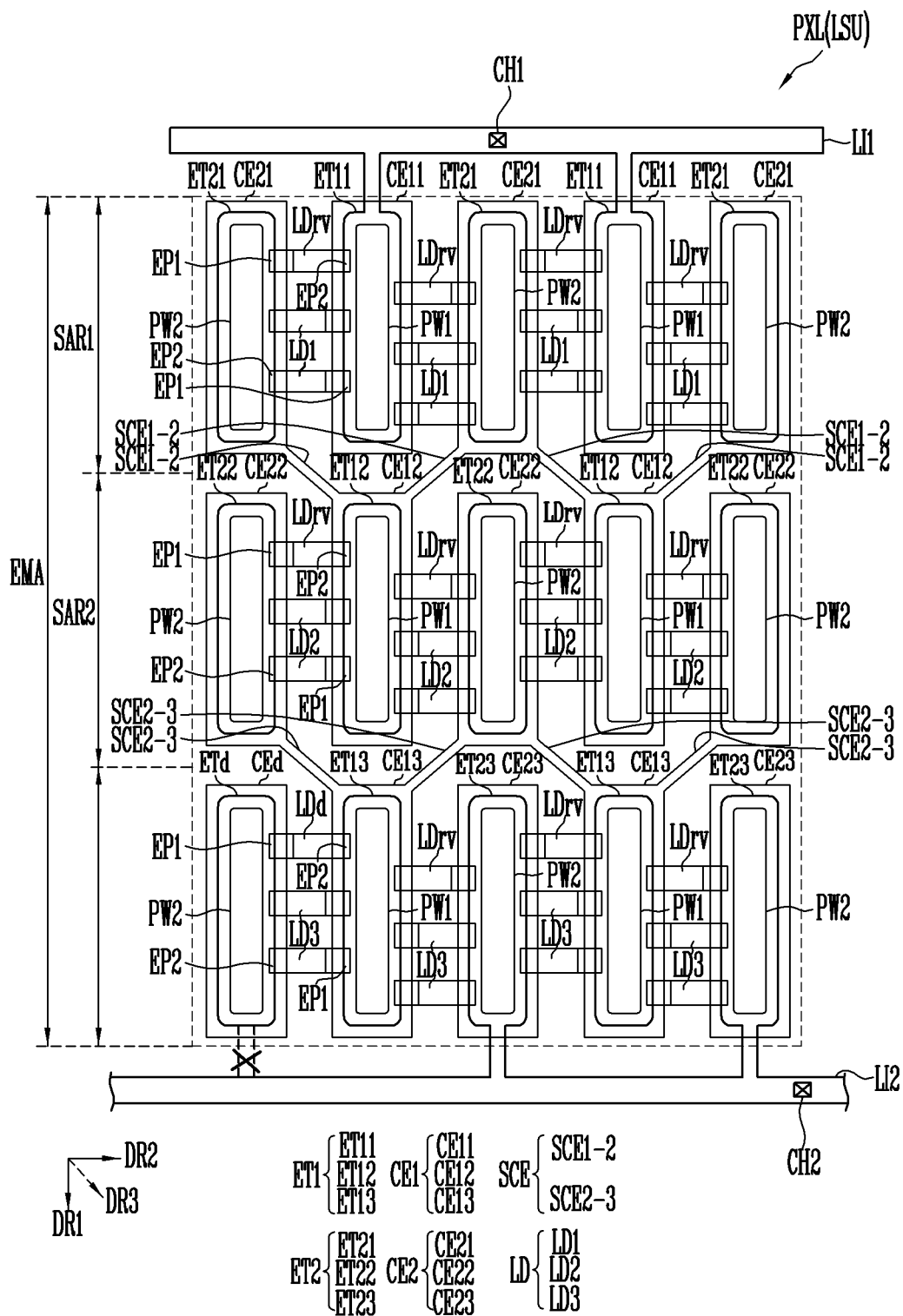

Referring to FIGS. 19 and 20, as the first or second electrode ET1 or ET2 electrically connected to at least one defective light emitting element LDd is separated from the first or second line LI1 or LI2, a defect of the pixel PXL attributable to the defective light emitting element LDd may be repaired. For example, in the case where a plurality of first and second electrodes ET1 and ET2 are disposed in each serial stage, and the defective light emitting element LDd may be electrically connected between a pair of first and second electrodes ET1 and ET2 disposed in the first serial stage or the last serial stage, any one electrode of the pair of first and second electrodes ET1 and ET2 may be separated from the first or second line LI1 or LI2.

For example, in the case where the light source unit LSU may include three serial stages, and at least one defective light emitting element LDd may be electrically connected between at least one pair of third-stage first and second electrodes ET13 and ET23, at least one third-stage second electrode ETd electrically connected to the defective light emitting element LDd may be separated from the second line LI2 by a laser cut scheme or the like within the spirit and the scope of the disclosure. Likewise, in the case where at least one defective light emitting element LDd may be electrically connected between at least one pair of first-stage first and second electrodes ET11 and ET21, at least one first-stage first electrode ET11 electrically connected to the defective light emitting element LDd may be separated from the first line LI1 by a laser cut scheme or the like within the spirit and the scope of the disclosure.

The method of fabricating the display device including the pixel PXL in accordance with the foregoing embodiments may include the step of checking whether the light emitting elements LD arranged or disposed in each pixel PXL have been short-circuited. Furthermore, the method of fabricating the display device may further include, in case that it is determined that at least one of the light emitting elements LD is a defective light emitting element LDd, the step of separating the first or second electrode ETd electrically connected to the defective light emitting element LDd from the first or second line LI1 or LI2.

As described above, in case that a defect attributable to a defective light emitting element LDd is detected in at least one pixel PXL, the defect of the pixel PXL may be easily repaired by isolating the first or second electrode ETd electrically connected to the defective light emitting element LDd from the first or second contact electrode CEd. Consequently, the yield of the display device may be increased.

Figure 21:
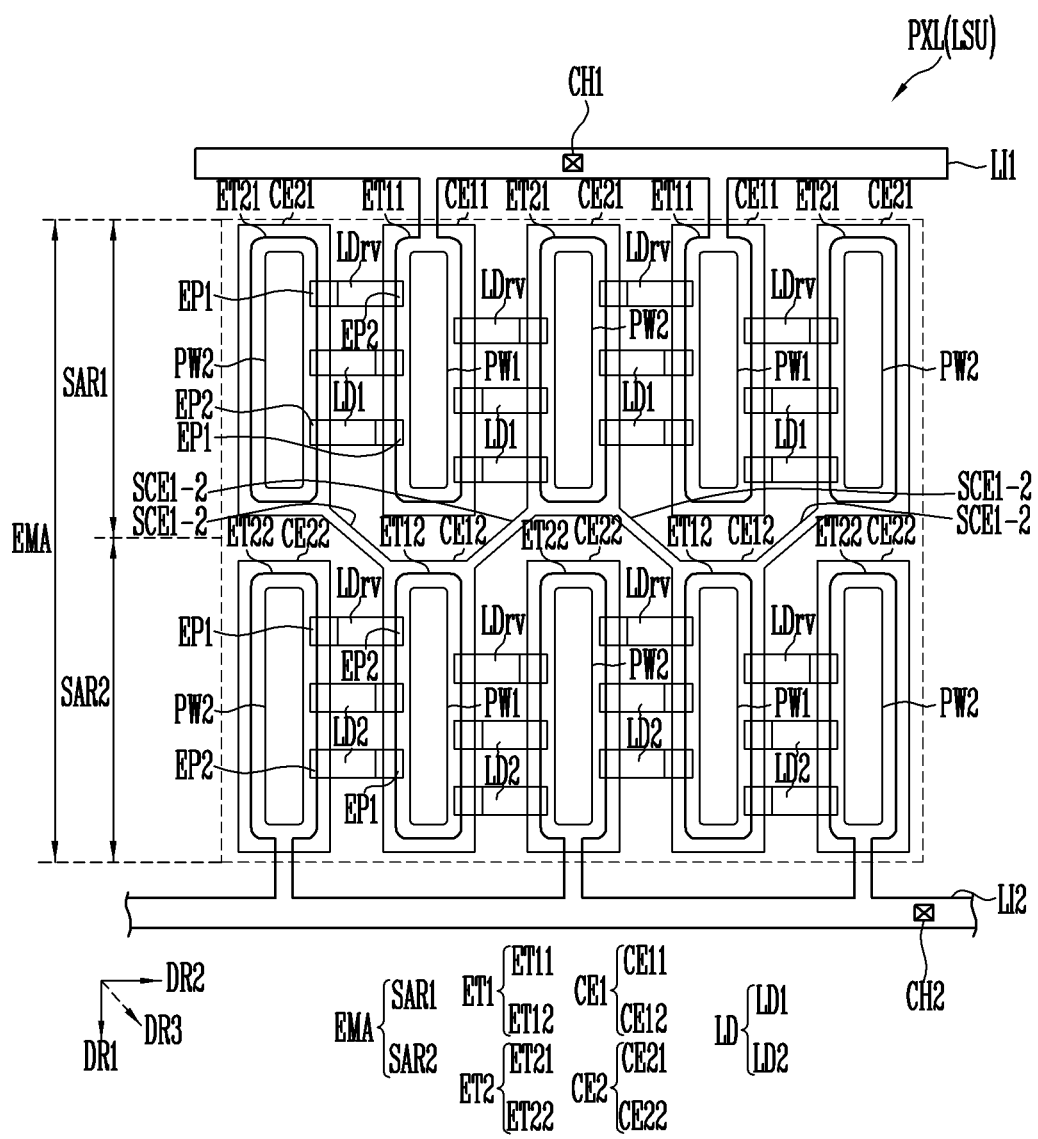
FIGS. 21 and 22 are plan views each illustrating a pixel in accordance with an embodiment, and for example illustrate different modified embodiments pertaining to the embodiment of FIG. 7.
Figure 22:
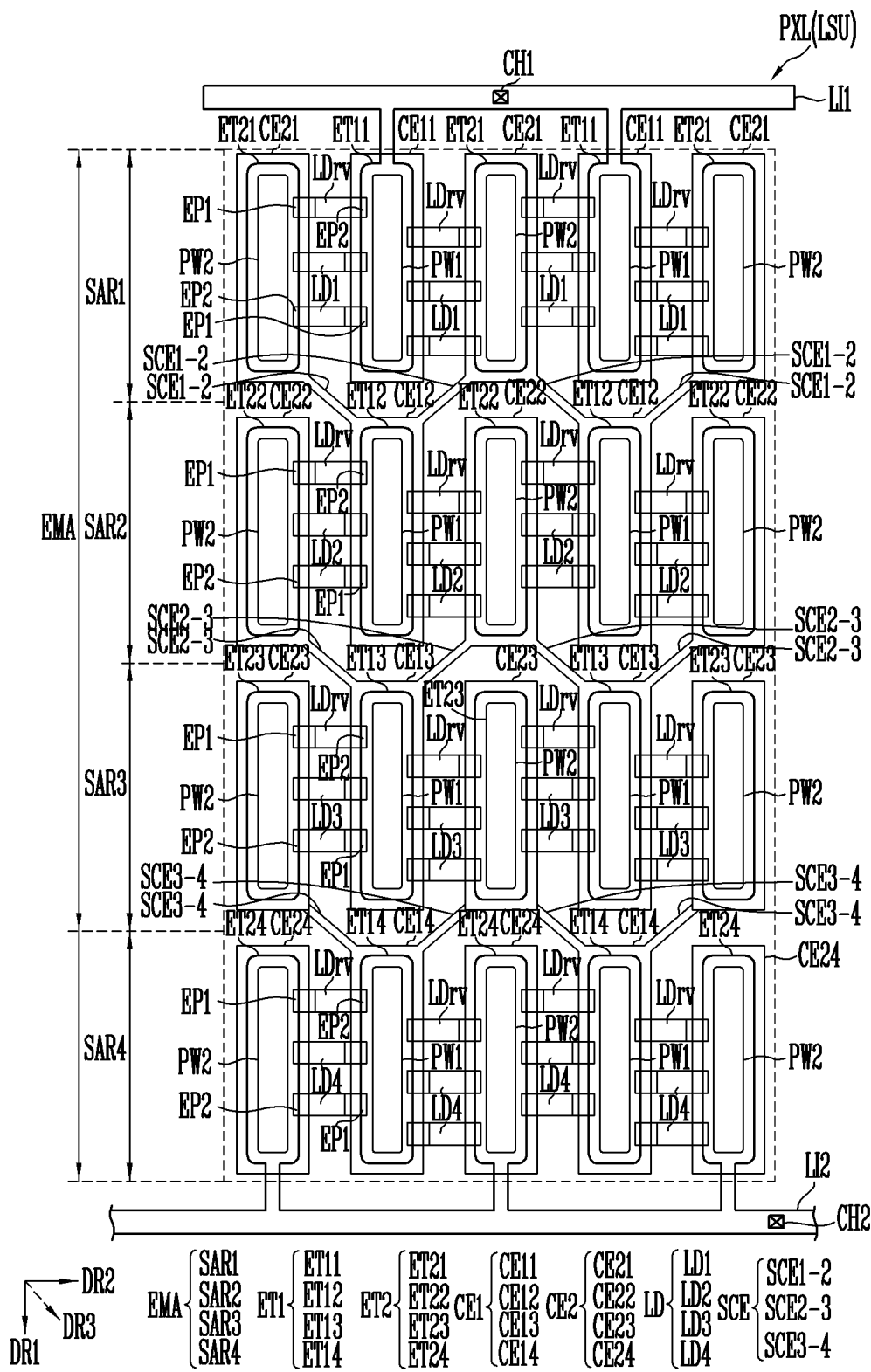

FIGS. 21 to 22 are plan views each illustrating a pixel PXL in accordance with an embodiment, and for example illustrate different modified embodiments pertaining to the embodiment of FIG. 7.

Referring to FIGS. 21 and 22, the number of serial stages that constitute each light source unit LSU may be changed in various ways. In an embodiment, the light source unit LSU may be formed of two serial stages, as illustrated in FIG. 21. Each emission area EMA may be sectioned into first and second sub-areas SAR1 and SAR2 in the first direction DR1, and the first and second electrodes ET1 and ET2 and the light emitting elements LD may be disposed in each sub-area. In the foregoing embodiment, the first electrodes ET11 of the first stage disposed in the first sub-area SAR1 may be electrically connected or directly electrically connected to the first line LI1, and the second electrodes ET22 of the second stage disposed in the second sub-area SAR2 may be electrically connected or directly electrically connected to the second line LI2. Furthermore, the second electrodes ET21 of the first stage and the first electrodes ET12 of the second stage may be electrically connected to each other through the second contact electrodes CE21 of the first stage, the 1-2-th stage connection electrodes SCE1-2 and the first contact electrodes CE12 of the second stage.

In an embodiment, the light source unit LSU may be formed of four or more serial stages. For example, the light source unit LSU may be formed of four serial stages, as illustrated in FIG. 22. Each emission area EMA may be sectioned into first to fourth sub-areas SAR1 to SAR4 in the first direction DR1, and the first and second electrodes ET1 and ET2 and the light emitting elements LD may be disposed in each sub-area. For example, at least one fourth light emitting element LD4, at least one fourth-stage first electrode ET14, at least one fourth-stage second electrode ET24, at least one fourth-stage first contact electrode CE14, and at least one fourth-stage second contact electrode CE24 may be disposed in the fourth sub-area SAR4. In the foregoing embodiment, the first electrodes ET11 of the first stage disposed in the first sub-area SAR1 may be electrically connected or directly electrically connected to the first line LI1, and the second electrodes ET24 of the fourth stage disposed in the fourth sub-area SAR4 may be electrically connected or directly electrically connected to the second line LI2. Furthermore, the second electrodes ET21 of the first stage, the first and second electrodes ET12, ET13, ET22, and ET23 of the second and third stages, and the first electrodes ET14 of the fourth stage may be cross-connected to each other between the respective serial stages through the respective first and second contact electrodes CE1 and CE2, the 1-2-th stage connection electrodes SCE1-2, the 2-3-th stage connection electrodes SCE2-3, and the 3-4-th stage connection electrodes SCE3-4.

As described in the foregoing embodiments, the structure of the light source unit LSU may be changed in various ways. For example, the serial or parallel combination structure of the light emitting elements LD that constitute the light source unit LSU may have various types.

While the technical idea of the disclosure are described by detailed embodiments, it should be noted that the above-described embodiments are merely descriptive and should not be considered limiting. It should be understood by those skilled in the art that various changes, substitutions, and alterations, variations and modifications may be made herein without departing from the scope of the disclosure as defined by the following claims.

The scope of the disclosure is not limited by detailed descriptions of the specification, and should be defined by the accompanying claims. Furthermore, all changes or modifications of the disclosure derived from the meanings and scope of the claims, and equivalents thereof should be construed as being included in the scope of the disclosure.

The invention claimed is:

1. A display device comprising:
    a pixel disposed in a display area, the pixel comprising:
        a first sub-area and a second sub-area disposed in a first direction;
        at least one first electrode and at least one second electrode of a first stage that are spaced apart from each other in a second direction intersecting with the first direction in the first sub-area;
        first light emitting elements disposed in parallel between the at least one first electrode and the at least one second electrode of the first stage;
        at least one first contact electrode and at least one second contact electrode of the first stage respectively disposed on the at least one first electrode and the at least one second electrode of the first stage, the at least one first contact electrode and the at least one second contact electrode of the first stage electrically connecting the first light emitting elements between the at least one first electrode and the at least one second electrode of the first stage;
        at least one first electrode and at least one second electrode of a second stage spaced apart from each other in the second sub-area;
        second light emitting elements disposed in parallel between the at least one first electrode and the at least one second electrode of the second stage;
        at least one first contact electrode and at least one second contact electrode of the second stage respectively disposed on the at least one first electrode and the at least one second electrode of the second stage, the at least one first contact electrode and the at least one second contact electrode of the second stage electrically connecting the second light emitting elements between the at least one first electrode and the at least one second electrode of the second stage; and
        a connection electrode that electrically connects the at least one second contact electrode of the first stage to the at least one first contact electrode of the second stage, the connection electrode extending in a boundary area between the first sub-area and the second sub-area in a third direction intersecting with the first direction and the second direction.

2. The display device according to claim 1, wherein
    the at least one first contact electrode and the at least one second contact electrode of the first stage are successively or alternately disposed in the first sub-area,
    the at least one first contact electrode and the at least one second contact electrode of the second stage are successively or alternately disposed in the second sub-area in the second direction.

3. The display device according to claim 1, further comprising:
    a K-th sub-area disposed subsequent to the first sub-area and the second sub-area in the first direction;
    at least one first electrode and at least one second electrode of a K-th stage that are spaced apart from each other in the K-th sub-area;
    K-th light emitting elements disposed in parallel between the at least one first electrode and the at least one second electrode of the K-th stage;
    at least one first contact electrode and at least one second contact electrode of the K-th stage respectively disposed on the at least one first electrode and the at least one second electrode of the K-th stage, the at least one first contact electrode and the at least one second contact electrode electrically connecting the K-th light emitting elements between the at least one first electrode and the at least one second electrode of the K-th stage; and
    another connection electrode that electrically connects the at least one first contact electrode of the K-th stage to at least one second contact electrode of a preceding stage.

4. The display device according to claim 3, further comprising:
a first line electrically connected to the at least one first electrode of the first stage, and supplied with a first power voltage or a first driving signal; and
a second line electrically connected to the at least one second electrode of the K-th stage or a last stage, and supplied with a second power voltage or a second driving signal.

5. The display device according to claim 4, wherein the at least one
second electrode of the first stage, at least one first electrode and at least one second electrode of an intermediate stage including the second stage, and the at least one first electrode of the K-th stage or the last stage each have an individual shape.

6. The display device according to claim 1, further comprising:
a first line electrically connected to the at least one first electrode of the first stage, and supplied with a first power voltage or a first driving signal; and
a second line electrically connected to the at least one second electrode of the second stage, and supplied with a second power voltage or a second driving signal.

7. The display device according to claim 6, wherein the at least one second electrode of the first stage and the at least one first electrode of the second stage each have an individual shape.

8. The display device according to claim 1, wherein the at least one second contact electrode of the first stage, the connection electrode, and the at least one first contact electrode of the second stage are integrally formed.

9. The display device according to claim 1, wherein the pixel further comprises at least one reverse light emitting element electrically connected between the at least one first electrode and the at least one second electrode of the first stage or the second stage in a direction opposite to the first light emitting elements and the second light emitting elements.

10. The display device according to claim 9, wherein a number of the first light emitting elements and the second light emitting elements is greater than a number of the at least one reverse light emitting element.

11. The display device according to claim 1, wherein
the at least one first electrode and the at least one second electrode of the first stage include a plurality of first electrodes and a plurality of second electrodes of the first stage disposed in the first sub-area;
the at least one first contact electrode and the at least one second contact electrode of the first stage include a plurality of first contact electrodes and a plurality of second contact electrodes of the first stage disposed in the first sub-area and respectively overlapping the plurality of first electrodes and the plurality of second electrodes of the first stage;
the at least one first electrode and the at least one second electrode of the second stage include a plurality of first electrodes and a plurality of second electrodes of the second stage disposed in the second sub-area; and
the at least one first contact electrode and the at least one second contact electrode of the second stage include a plurality of first contact electrodes and a plurality of second contact electrodes of the second stage disposed in the second sub-area and respectively overlapping the plurality of first electrodes and the plurality of second electrodes of the second stage.

12. The display device according to claim 11, wherein
the pixel further comprises at least one defective light emitting element having short-circuited ends between a pair of a first electrode and a second electrode of the plurality of first electrodes and the plurality of second electrodes of the first stage and the second stage, and
a first contact electrode or a second contact electrode directly connected to the at least one defective light emitting element is separated from first contact electrodes and second contact electrodes other than the first contact electrode or the second contact electrode directly connected to the at least one defective light emitting element.

13. The display device according to claim 11, further comprising:
a first line electrically connected to at least one of the plurality of first electrodes of the first stage, and supplied with a first power voltage or a first driving signal;
a second line electrically connected to at least one of the plurality of second electrodes of the second stage or a last stage, and supplied with a second power voltage or a second driving signal; and
at least one defective light emitting element electrically connected to a first electrode or a second electrode of the plurality of first electrodes of the first stage and the plurality of second electrodes of the second stage or the last stage, the at least one defective light emitting element having short-circuited opposite ends,
wherein the first electrode or the second electrode is separated from the first line or the second line.

14. The display device according to claim 1, wherein the pixel comprises:
first partition walls respectively disposed below the at least one first electrode of the first stage and the at least one first electrode of the second stage, and each having an individual pattern; and
second partition walls respectively disposed below the at least one second electrode of the first stage and the at least one second electrode of the second stage, and each having an individual pattern.

15. The display device according to claim 1, wherein each first light emitting element and each second light emitting element extend in the second direction.

16. A method of fabricating a display device, comprising:
forming a first alignment electrode and a second alignment electrode spaced apart from each other and extending in a first direction in an emission area of each pixel;
forming a first line and a second line respectively electrically connected to the first alignment electrode and the second alignment electrode in the emission area;
disposing light emitting elements between the first alignment electrode and the second alignment electrode in the emission area;
forming first contact electrodes disposed on different areas of the first alignment electrode in the first direction to electrically connect first ends of the light emitting elements to the first alignment electrode;
forming second contact electrodes disposed on different areas of the second alignment electrode in the first direction to electrically connect second ends of the light emitting elements to the second alignment electrode;
dividing the first alignment electrode into first electrodes spaced apart from each other and disposed in the first direction; and
dividing the second alignment electrode into second electrodes spaced apart from each other and disposed in the first direction, wherein the forming of the first contact electrodes and the second contact electrodes comprises electrically connecting a second contact electrode disposed in a first stage of the emission area to a first contact electrode disposed in a second stage of the emission area.

17. The method according to claim 16, wherein the forming of the first contact electrodes and the second contact electrodes comprises forming a connection electrode integrally formed with the second contact electrode disposed in the first stage of the emission area and the first contact electrode disposed in the second stage of the emission area.

18. The method according to claim 16, wherein the forming of the first contact electrodes and the second contact electrodes comprises:
  forming the second contact electrodes disposed in the first stage of the emission area, and the first contact electrodes disposed in the second stage of the emission area; and
  forming the first contact electrodes disposed in the first stage of the emission area, and the second contact electrodes disposed in the second stage of the emission area.

19. The method according to claim 16, wherein
  the forming of the first alignment electrode and the second alignment electrode comprises forming a plurality of first alignment electrodes and a plurality of second alignment electrodes alternately disposed in a second direction in the emission area, and
  the forming of the first contact electrodes and the second contact electrodes comprises forming a plurality of connection electrodes to electrically connect the second contact electrodes disposed in a stage of the emission area to the first contact electrodes disposed in a subsequent stage of the emission area.

20. The method according to claim 19, further comprising:
  checking whether a short-circuit defect occurs in the light emitting elements; and
  opening, in case that it is determined that at least one of the light emitting elements is a defective light emitting element, a connection electrode electrically connected to a first contact electrode or a second contact electrode electrically connected to the defective light emitting element.

21. The method according to claim 19, further comprising:
  checking whether a short-circuit defect occurs in the light emitting elements; and
  separating, in case that it is determined that at least one of the light emitting elements is a defective light emitting element, a first electrode or a second electrode electrically connected to the defective light emitting element from the first line or the second line.

22. The method according to claim 16, wherein
  the second contact electrodes are spaced apart from the first contact electrodes in a second direction intersecting with the first direction, and
  the second contact electrode disposed in the first stage of the emission area is electrically connected to the first contact electrode disposed in the second stage of the emission area via a connection electrode extending in a third direction intersecting with the first direction and the second direction.

* * * * *